United States Patent
Carroll et al.

(10) Patent No.: US 9,905,810 B2
(45) Date of Patent: Feb. 27, 2018

(54) FREQUENCY DEPENDENT LIGHT EMITTING DEVICES

(71) Applicant: Wake Forest University, Winston-Salem, NC (US)

(72) Inventors: David Carroll, Winston-Salem, NC (US); Robert Summers, Clemmons, NC (US); Yonghua Chen, Cleveland Heights, OH (US)

(73) Assignee: Wake Forest University, Winston-Salem, NC (US)

( * ) Notice: Subject to any disclaimer, the term of this patent is extended or adjusted under 35 U.S.C. 154(b) by 0 days.

(21) Appl. No.: 15/024,624

(22) PCT Filed: Sep. 26, 2014

(86) PCT No.: PCT/US2014/057774
§ 371 (c)(1),
(2) Date: Mar. 24, 2016

(87) PCT Pub. No.: WO2015/048486
PCT Pub. Date: Apr. 2, 2015

(65) Prior Publication Data
US 2016/0240821 A1    Aug. 18, 2016

Related U.S. Application Data

(60) Provisional application No. 61/883,710, filed on Sep. 27, 2013.

(51) Int. Cl.
*H01L 35/24* (2006.01)
*H01L 51/00* (2006.01)
(Continued)

(52) U.S. Cl.
CPC ...... *H01L 51/5296* (2013.01); *H01L 33/0041* (2013.01); *H01L 33/30* (2013.01);
(Continued)

(58) Field of Classification Search
CPC .. H01L 33/30; H01L 51/5296; H01L 51/5206
(Continued)

(56) References Cited

U.S. PATENT DOCUMENTS 7,986,090 B2 * 7/2011 Pfeiffer ............... H01L 51/5016
313/504
8,653,537 B2 * 2/2014 He ...................... H01L 51/0062
257/40
(Continued)

FOREIGN PATENT DOCUMENTS

WO    2013/112298 A1    8/2013

OTHER PUBLICATIONS

Do Ngoe Chung et al., "Investigation of Polymeric Composite Films Using Modified TiO2 Nanoparticles for Organic Light Emitting Diodes", Current Nanoscience, vol. 9, No. 1, Jan. 1, 2013, pp. 14-20, XP055124381, NL ISSN: 1573-4137 the whole document.
(Continued)

*Primary Examiner* — David S Blum
(74) *Attorney, Agent, or Firm* — J. Clinton Wimbish; Smith Moore Leatherwood LLP

(57) ABSTRACT

An electroluminescent device described herein, in one aspect, comprises a first electrode and second electrode and a light emitting layer positioned between the first and second electrodes. A current injection gate is positioned between the first electrode and the light emitting layer or the second electrode and the light emitting layer. In some embodiments, the current injection gate comprises a semiconductor layer of electronic structure restricting injected current flow from the first or second electrode through the semiconductor layer as a function of alternating current voltage frequency applied to the first and second electrodes.

23 Claims, 4 Drawing Sheets

(51) Int. Cl.
*H01L 51/52* (2006.01)
*H01L 51/50* (2006.01)
*H01L 33/00* (2010.01)
*H01L 33/30* (2010.01)
*H01L 33/42* (2010.01)
*H05B 33/08* (2006.01)

(52) U.S. Cl.
CPC .............. *H01L 33/42* (2013.01); *H01L 51/50* (2013.01); *H01L 51/5206* (2013.01); *H01L 51/5234* (2013.01); *H05B 33/08* (2013.01); *H01L 51/0035* (2013.01); *H01L 51/0037* (2013.01); *H01L 51/0039* (2013.01); *H01L 51/0043* (2013.01); *H01L 51/0077* (2013.01); *H01L 51/502* (2013.01); *H01L 51/5016* (2013.01); *H01L 2251/303* (2013.01); *H01L 2251/5376* (2013.01); *H01L 2251/564* (2013.01)

(58) Field of Classification Search
USPC .......................................................... 257/40
See application file for complete search history.

(56) References Cited

U.S. PATENT DOCUMENTS

| 9,318,721 B2* | 4/2016 | Carroll ................ H01L 51/5028 |
| 2012/0235167 A1* | 9/2012 | Odnoblyudov ..... H01L 33/0079 257/88 |
| 2013/0240847 A1 | 9/2013 | Zakhidov et al. |

OTHER PUBLICATIONS

Phuong Hoai et al., "Improved Performances in Light-Emitting Diodes Based on a Semiconductor Ti0 2 Nano Cluster Buffer Layer Improved Performances in Light-Emitting Diodes Based on a Semiconductor Ti0 2 Nano Cluster Buffer Layer", Adv. Nat. Sci.: Nanosci. Nanotechnol, vol. 4, Apr. 30, 2013, pp. 25013-1, XP055157937, DOI: 10.1088/2043-6262/4/2/025013 the whole document.

International Search Report and Written Opinion issued in corresponding International Application No. PCT/US2014/057774 dated Dec. 19, 2014, 8 pages.

* cited by examiner

FREQUENCY DEPENDENT LIGHT EMITTING DEVICES

RELATED APPLICATION DATA

This application is a U.S. National Phase of PCT/US2014/057774, filed Sep. 26, 2014, which claims priority pursuant to 35 U.S.C. § 119(e) to U.S. Provisional Patent Application 61/883,710 filed Sep. 27, 2013, each of which are incorporated herein by reference in their entireties.

FIELD

The present invention relates to light emitting devices and, in particular, to light emitting devices demonstrating properties related to alternating current voltage frequencies.

BACKGROUND

Organic thin film electroluminescent (EL) devices, including organic light emitting devices (OLEDs), typically operate using constant voltage or direct current (DC) power sources. The charge carriers, holes and electrons, are directly injected from high work function and low work function metal electrodes, respectively. Several disadvantages exist with direct current injection architectures. Direct current injection, for example, can precipitate charge accumulation in the recombination zone and large leakage current, resulting in significant exciton quenching. Exicton quenching produces low brightness and series efficiency roll-off. Further, DC driven architectures require power converters and increase device sensitivities to dimensional variations that lead to run away current imperfections. More importantly, in order to achieve effective charge injection, high work function metals are required for anodes, and low work function metals are required for cathodes. Such requirements severely restrict suitable electrode materials for DC devices. Additionally, low work function metals are unstable in air and water, thereby increasing fabrication complexities for DC devices.

SUMMARY

Electroluminescent devices are described herein which, in some embodiments, offer advantages over prior devices. For example, electroluminescent devices described herein can be driven by alternating current (AC), alleviating charge accumulation by the frequent reversal of applied bias. Further, electroluminescent devices described herein can provide radiant recombination in the absence of direct current injection, thereby breaking electrode dependency on high and low work function metals.

Briefly, an electroluminescent device described herein, in one aspect, comprises a first electrode and second electrode and a light emitting layer positioned between the first and second electrodes. A current injection gate is positioned between the first electrode and the light emitting layer or between the second electrode and the light emitting layer. In some embodiments, the current injection gate comprises a semiconductor layer of electronic structure restricting injected current flow from the first or second electrode through the semiconductor layer as a function of alternating current voltage frequency applied to the first and second electrodes.

In another aspect, an electroluminescent device described herein comprises a first electrode and second electrode and an organic light emitting layer positioned between the first and second electrodes. An electron dopant layer is positioned on a first side of the organic light emitting layer and a hole dopant layer is positioned on the opposing side of the organic light emitting layer, wherein a nanoparticle phase bridges an interface formed by the electron dopant layer and organic light emitting layer. Alternatively, the nanoparticle phase can bridge an interface formed by the hole dopant layer and organic light emitting layer. Further, a nanoparticle phase can bridge an interface formed by the electron dopant layer and organic light emitting layer and an interface formed by the hole dopant layer and organic light emitting layer.

Methods of generating light are also described herein. A method of generating light comprises providing an electroluminescent device comprising first and second electrodes, a light emitting layer positioned between the first and second electrodes and a current injection gate positioned between the first electrode and the light emitting layer or between the second electrode and the light emitting layer. An alternating current voltage is applied to the first and second electrodes and current injected from the first or the second electrode is restricted from flowing into the light emitting layer by the gate as a function of alternating current voltage frequency, wherein holes and electrons are radiatively combined in the light emitting layer.

These and other embodiments are further described in the detailed description which follows.

DETAILED DESCRIPTION

Figure 1:
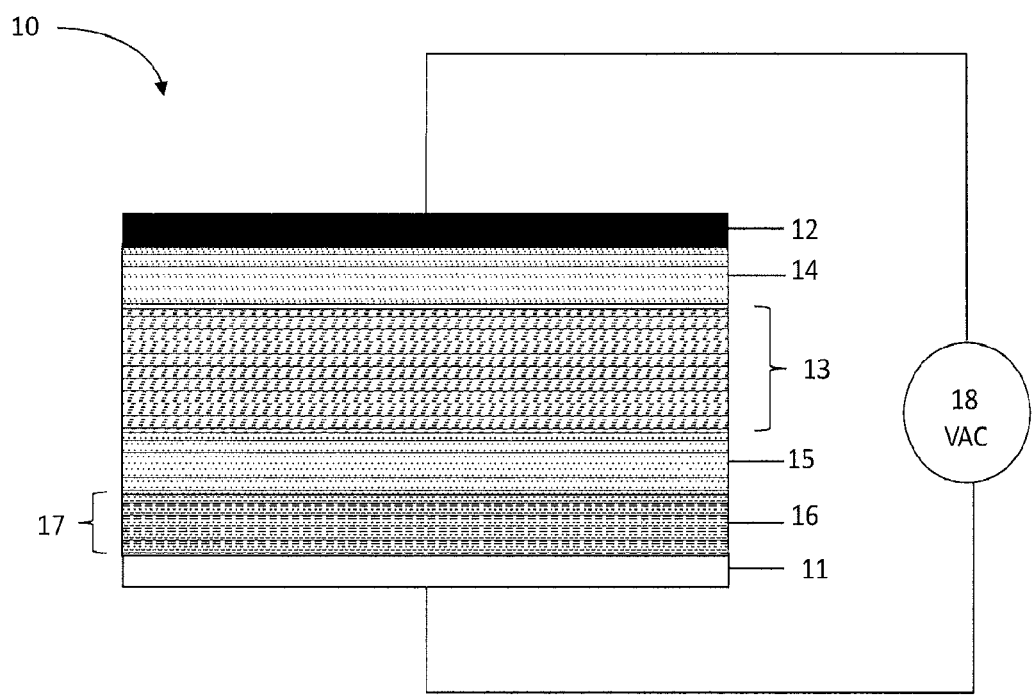
FIG. 1 illustrates a cross-sectional view of an electroluminescent device according to one embodiment described herein.

Embodiments described herein can be understood more readily by reference to the following detailed description, examples and drawings. Elements, apparatus, and methods described herein, however, are not limited to the specific embodiments presented in the detailed description, examples and drawings. It should be recognized that these embodiments are merely illustrative of the principles of the present invention. Numerous modifications and adaptations will be readily apparent to those of skill in the art without departing from the spirit and scope of the invention.

The term "alkyl" as used herein, alone or in combination, refers to a straight or branched chain saturated hydrocarbon radical having from 1-20 carbon atoms. In some embodiments, for example, alkyl is $C_{8-12}$ alkyl.

The term "alkenyl" as used herein, alone or in combination, refers to a straight or branched chain hydrocarbon radical containing from 2-20 carbon atoms and at least one carbon-carbon double bond. In some embodiments, for example, alkenyl comprises $C_{8-12}$ alkenyl.

The term "aryl" as used herein, alone or in combination, refers to an aromatic ring system radical. Aryl is also intended to include partially hydrogenated derivatives of carbocyclic systems.

The term "heteroaryl" as used herein, alone or in combination, refers to an aromatic ring radical with for instance 5 to 7 member atoms, or to an aromatic ring system radical with for instance from 7 to 18 member atoms, containing one or more heteroatoms selected from nitrogen, oxygen, or sulfur heteroatoms, wherein N-oxides and sulfur monoxides and sulfur dioxides are permissible heteroaromatic substitutions; such as, e.g., furanyl, thienyl, thiophenyl, pyrrolyl, imidazolyl, pyrazolyl, triazolyl, tetrazolyl, thiazolyl, oxazolyl, isoxazolyl, oxadiazolyl, thiadiazolyl, isothiazolyl, pyridinyl, pyridazinyl, pyrazinyl, pyrimidinyl, quinolinyl, isoquinolinyl, benzofuranyl, benzothiophenyl, indolyl, and indazolyl, and the like. Heteroaryl is also intended to include the partially hydrogenated derivatives of the heterocyclic systems.

I. Electroluminescent Devices

An electroluminescent device described herein, in one aspect, comprises a first electrode and second electrode and a light emitting layer positioned between the first and second electrodes. A current injection gate is positioned between the first electrode and the light emitting layer or between the second electrode and the light emitting layer. In some embodiments, the current injection gate comprises a semiconductor layer of electronic structure restricting injected current flow from the first or second electrode through the semiconductor layer as a function of alternating current voltage frequency applied to the first and second electrodes.

In some embodiments, a plurality of light emitting layers are positioned between the first and second electrodes. For example, in some embodiments, a plurality of light emitting layers, each having a construction selected from Section(s) IB(1)(i)-(iv) and IB(2) herein, are positioned between the first and second electrodes. The light emitting layers can have various emission profiles that, when combined, provide the desired emission profile characteristics from the electroluminescent device. Further, an electron dopant layer can be positioned on a first side of the light emitting layer and a hole dopant layer can positioned on an opposing side of the light emitting layer.

FIG. 1 illustrates a cross-sectional view of an electroluminescent device according to one embodiment described herein. The electroluminescent device (10) illustrated in FIG. 1 comprises a first electrode (11) and second electrode (12) and a light emitting layer (13) positioned between the first (11) and second (12) electrodes. An electron dopant layer (14) is positioned on a first side of the light emitting layer (13) and a hole dopant layer (15) is positioned on the opposing side of the light emitting layer (13). As discussed further herein, electron and/or hole dopant layers, in some embodiments, can be blended directly into the light emitting layer, thereby obviating any requirement for discrete layers of electron donor and/or hole donor materials. A current injection gate (16) is positioned between the first electrode (11) and the light emitting layer (13). The current injection gate (16) can comprise a layer (17) of semiconductor material of electronic structure restricting injected current flow from the first electrode (11) through the semiconductor layer (17) as a function alternating current voltage frequency (18) applied to the first (11) and second (12) electrodes. In alternative embodiment, the current injection gate (16) can be positioned between the second electrode (12) and light emitting layer (13).

Specific components of electroluminescent devices are now described.

A. First and Second Electrodes

First and second electrodes can be fabricated from any material not inconsistent with the objectives of the present invention. As described above, materials for the first and second electrodes are not limited to high and low work function metals required for prior DC operating devices. First and second electrodes, for example, can be formed of metal, such as aluminum, nickel, copper, gold, silver, platinum, palladium or other transition metals or alloys thereof. When constructed of a metal or alloy, the first and/or second electrode can be reflective or otherwise non-radiation transmissive. However, in some embodiments, a metal electrode can be of thickness permitting the transmission of radiation.

Alternatively, the first and/or second electrode can be constructed of one or more materials that are radiation transmissive. Radiation transmissive materials can pass electromagnetic radiation provided by light emitting layers described herein without substantial interference or attenuation. Suitable radiation transmissive materials can comprise one or more radiation transmissive conducting oxides. Radiation transmissive conducting oxides can include one or more of indium tin oxide (ITO), gallium indium tin oxide (GITO), aluminum tin oxide (ATO) and zinc indium tin oxide (ZITO). In some embodiments, a radiation transmissive first and/or second electrode is formed of a radiation transmissive polymeric material such as polyanaline (PANI) and its chemical relatives or 3,4-polyethylenedioxythiophene (PEDOT). Further, a radiation transmissive first and/or second electrode can be formed of a carbon nanotube layer having a thickness operable to at least partially pass visible electromagnetic radiation. An additional radiation transmissive material can comprise a nanoparticle phase dispersed in a polymeric phase.

The first electrode and second electrode can demonstrate the same or different constructions. For example, the first electrode can be non-radiation transmissive and the second electrode radiation transmissive. Moreover, in some embodiments, the first and second electrodes can both be radiation transmissive or non-radiation transmissive. In such embodiments, the first and second electrodes can be fabricated from the same material or different materials. Also, first and second electrodes can have any thickness not inconsistent with the objectives of the present invention. In some embodiments, first and second electrodes have a thickness ranging from 10 nm to 100 µm. Additionally, a layer of lithium fluoride (LiF) or lithium oxide ($Li_2O$) can be positioned between the light emitting layer and first and/or second electrode. For example, a layer of LiF or $Li_2O$ can be positioned between an electron dopant layer and electrode.

B. Light Emitting Layer

A light emitting layer of an electroluminescent device described herein can demonstrate a variety of constructions. For example, a light emitting layer can be an organic light emitting layer or inorganic light emitting layer.

(1) Organic Light Emitting Layers

A light emitting layer of an electroluminescent device can be formed of various light emitting organic materials as set forth below.

(i) An organic light emitting layer, in some embodiments, comprises a conjugated polymeric or oligomeric phase. The light emitting polymeric or oligomeric phase of an organic layer comprises one or a plurality of conjugated polymers or oligomers. The light emitting polymeric or oligomeric phase, for example, can comprise a blend of conjugated polymers or oligomers. In some embodiments, a blend of conjugated polymers or oligomers comprises a copolymer of the polymers or oligomers.

A conjugated polymer or oligomer suitable for use in the light emitting polymeric or oligomeric phase can comprise at least two repeating units selected from the group consisting of repeating units A, B and C:

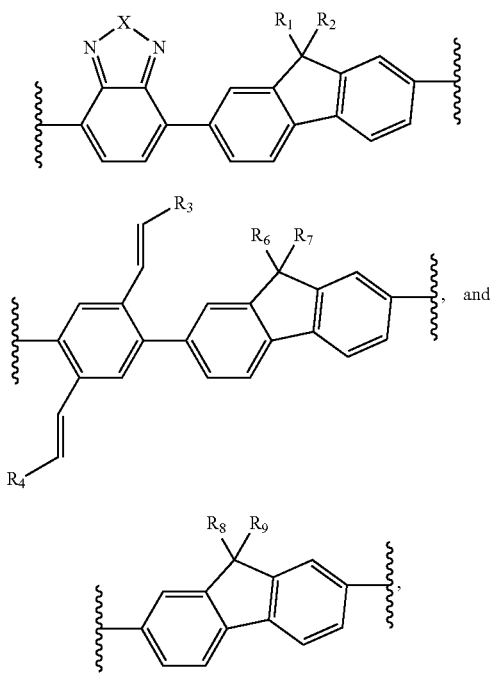

wherein ⸺ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, repeating unit A of a conjugated polymer or oligomer described herein is selected from the group consisting of:

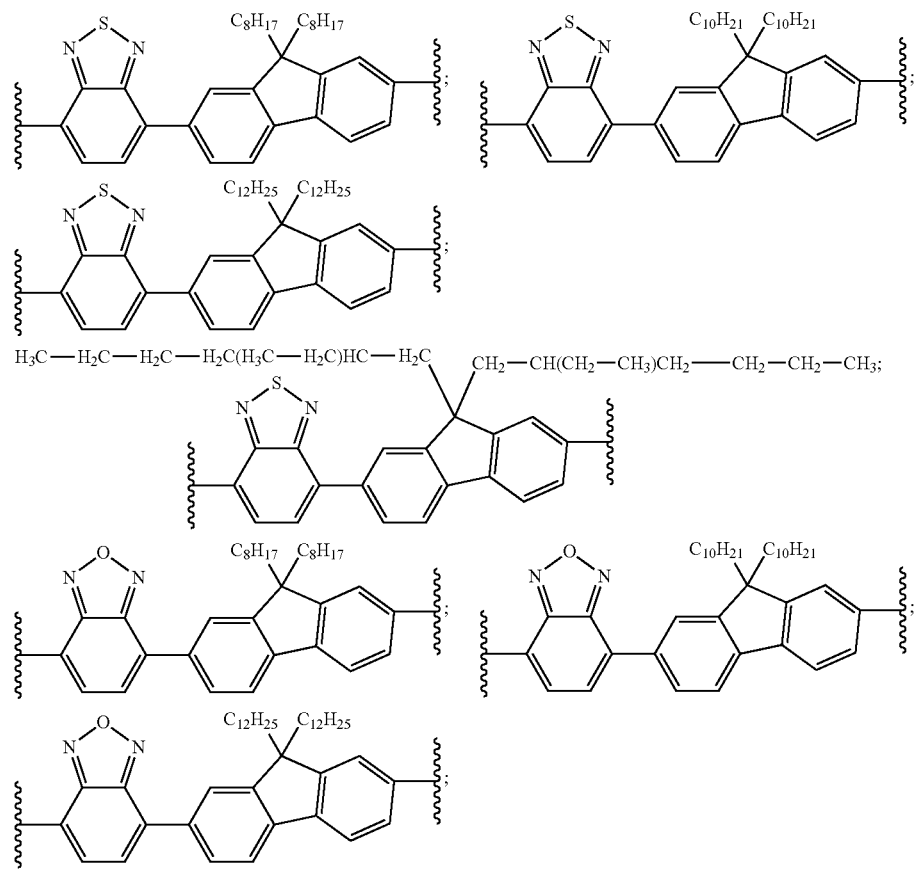

-continued
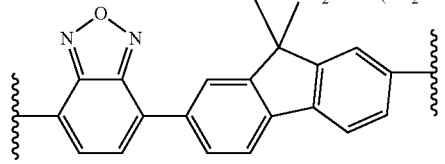
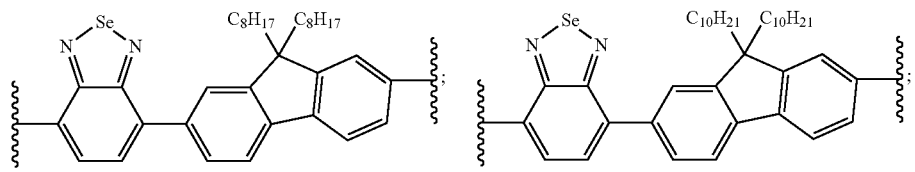
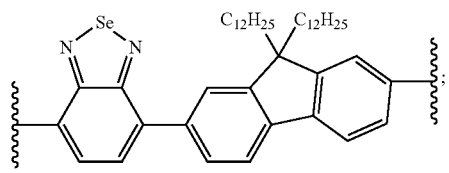
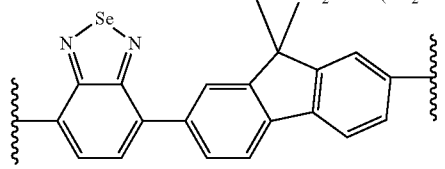
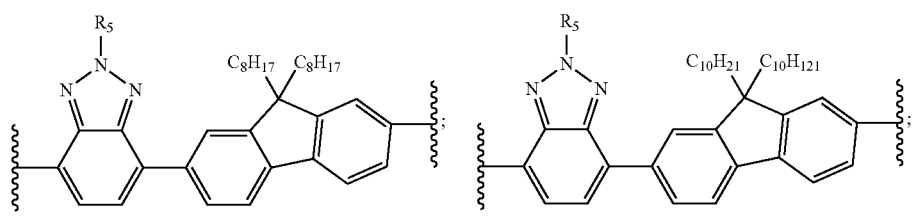
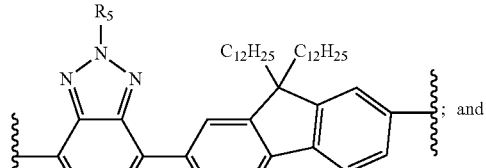
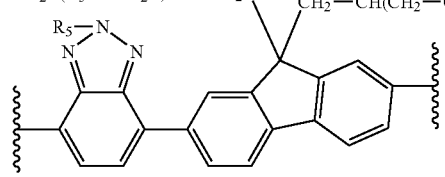
wherein $R_5$ is defined hereinabove.

In some embodiments, repeating unit B of a conjugated polymer or oligomer described herein is selected from the group consisting of:
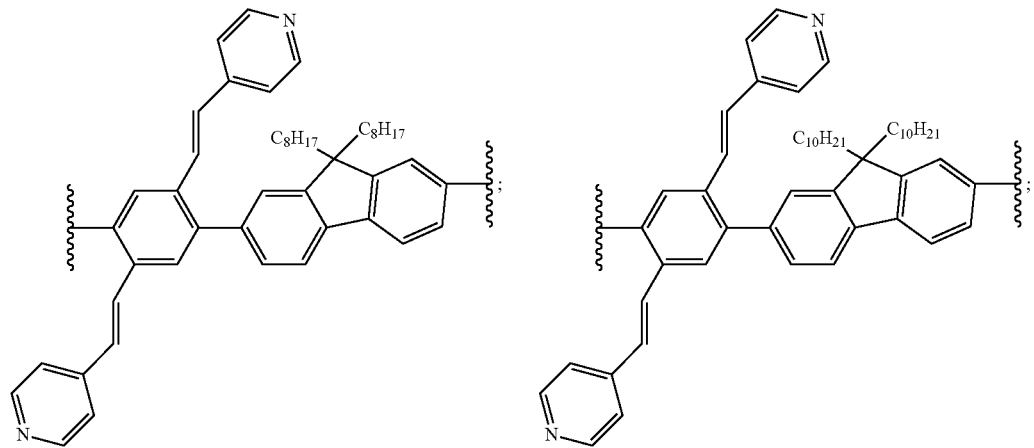
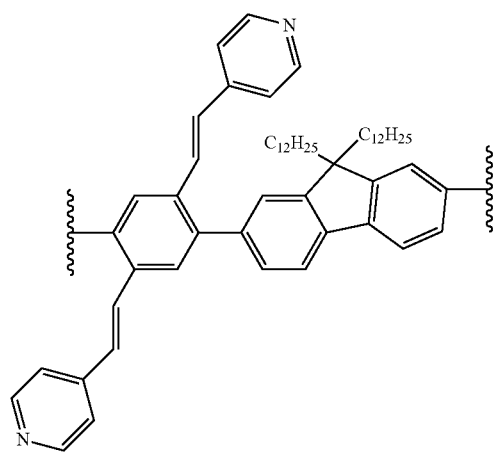
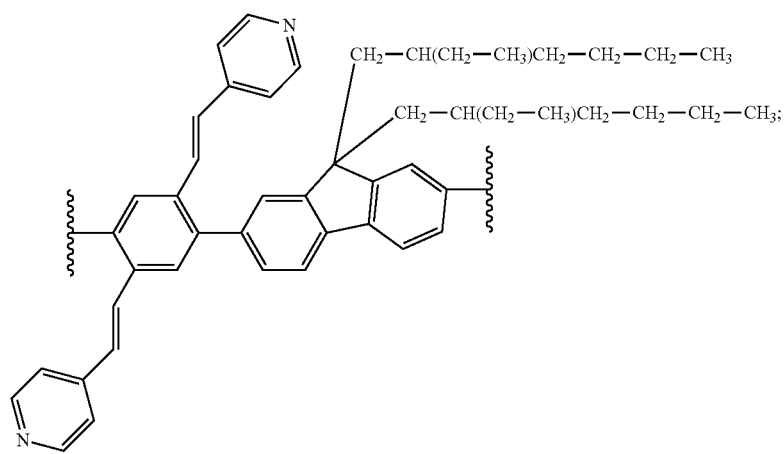

11
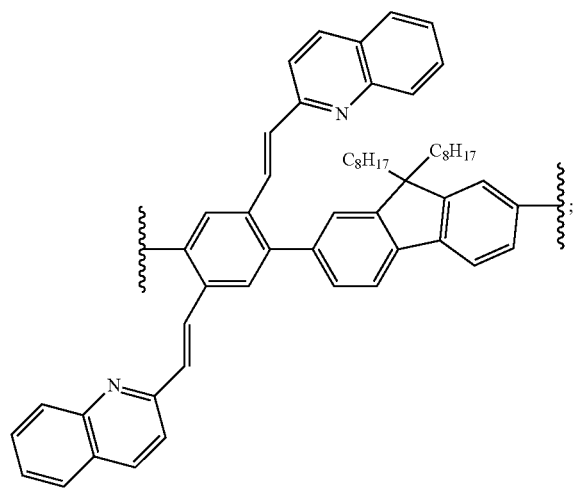
12
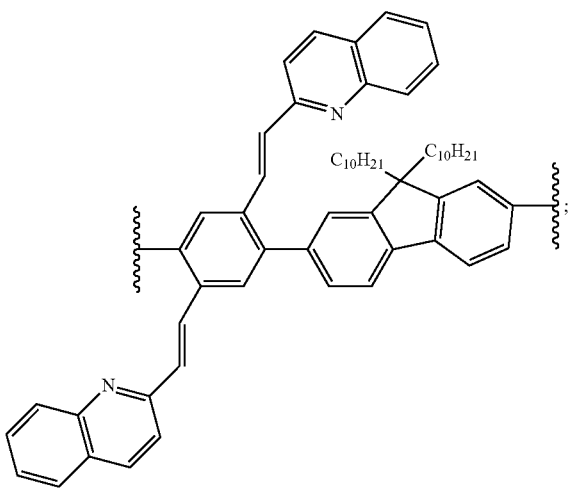
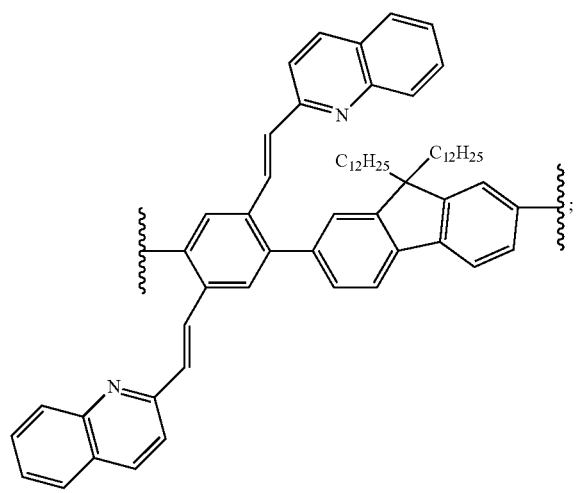
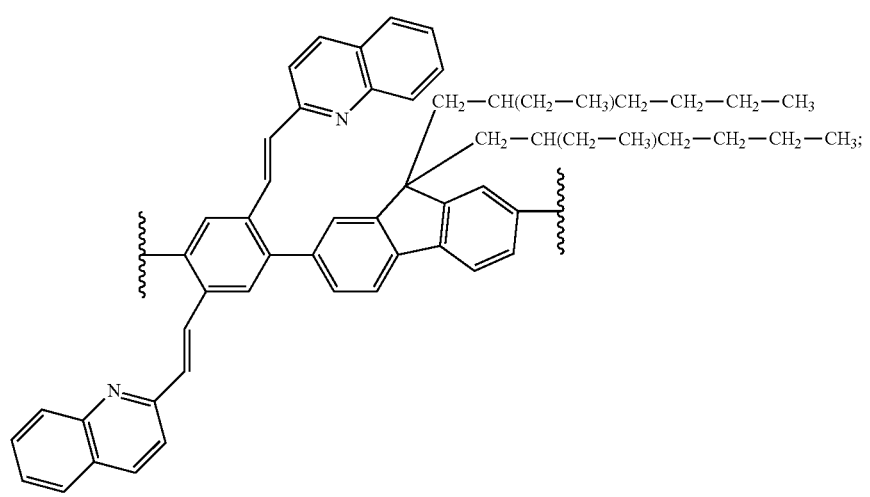

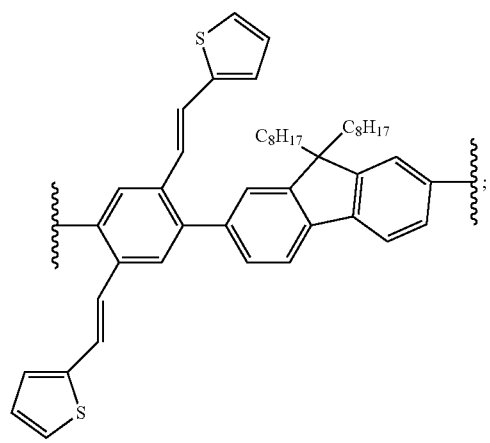
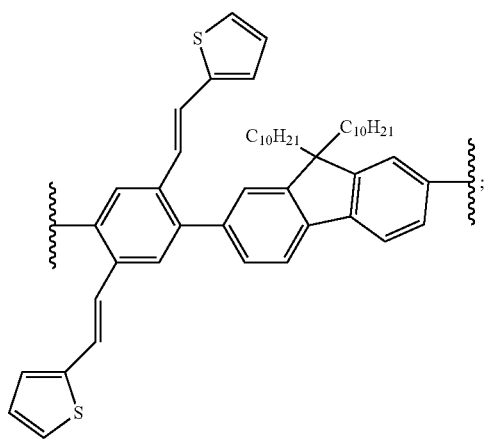
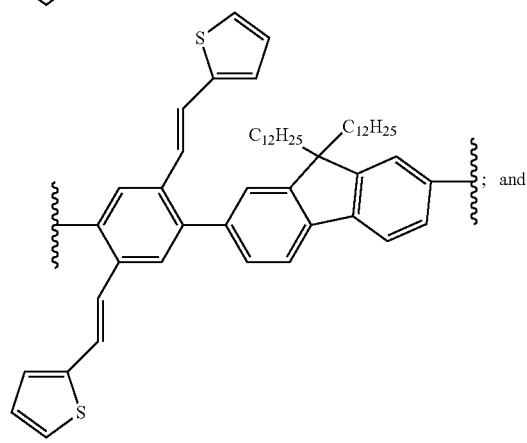
; and
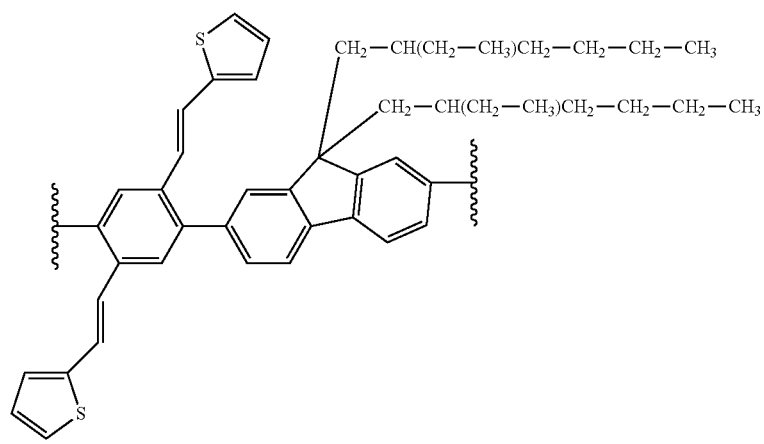
Repeating unit C of a conjugated polymer or oligomer described herein, in some embodiments, is selected from the group consisting of:
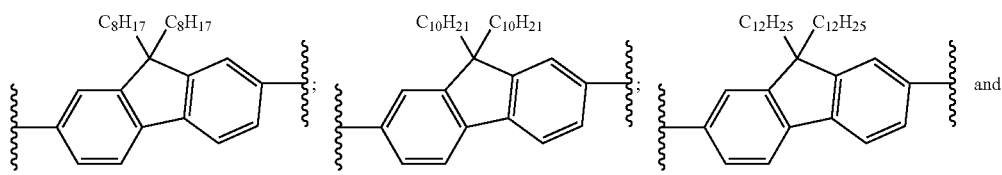
and

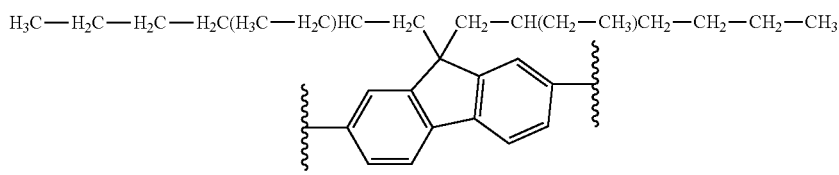

Moreover, the selection and molar ratios of repeating units A, B, and C can be used to select the emission profile of the conjugated polymer or oligomer, as taught in Aimsen et al., "Synthesis and Electroluminescence Properties of Polyfluorene Deriatives for Light-Emitting Diodes," *Proceedings of the 2010 5th IEEE International Conference on Nano/Micro Engineered and Molecular Systems,* 21-25, the entirety of which is incorporated by reference herein. For example, in some embodiments, the repeating units are selected to provide white light emission. Alternatively, the repeating units can be selected to provide green or blue-green emission.

A conjugated polymer or oligomer of the light emitting polymeric or oligomeric phase comprising repeating units A and B can be a conjugated polymer or oligomer of Formula (I):

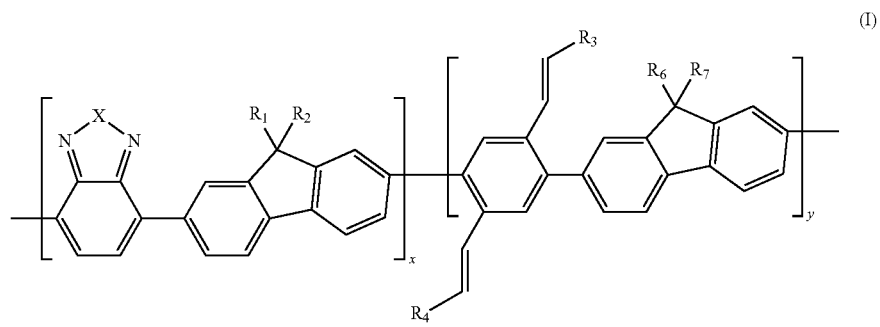

wherein X, $R_1$, $R_2$, $R_3$, $R_4$, $R_6$ and $R_7$ are defined above and x and y are integers independently ranging from 1 to 10,000. As described herein, repeating units A and B of a conjugated polymer or oligomer of Formula (I) can be arranged to provide an alternating copolymer, a block copolymer, statistical copolymer or a random copolymer. In some embodiments, a conjugated polymer or oligomer of Formula (I) has a weight average molecular weight ($M_w$) ranging from about 1,000 to about 1,000,000. A conjugated polymer or oligomer of Formula (I) can have a number average molecular weight ($M_n$) ranging from about 500 to about 500,000.

In some embodiments, a conjugated polymer or oligomer of Formula (I) described herein is selected from the group consisting of:

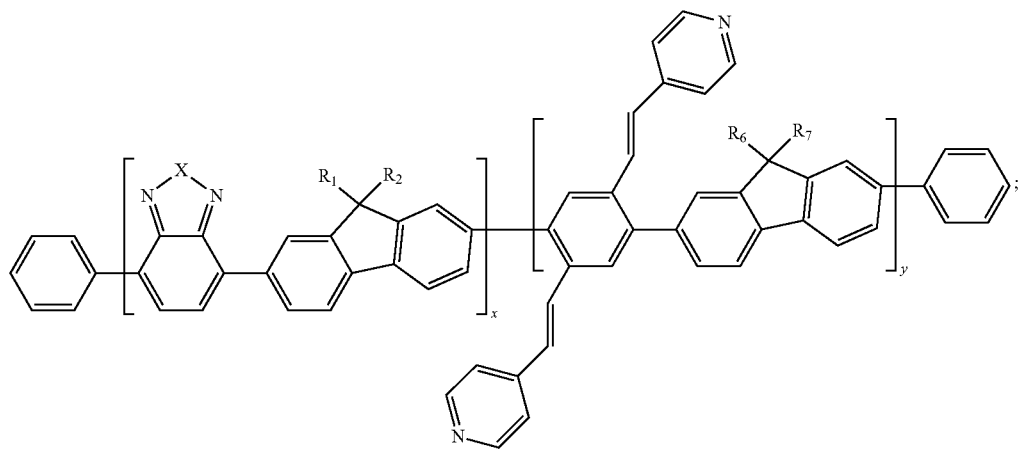

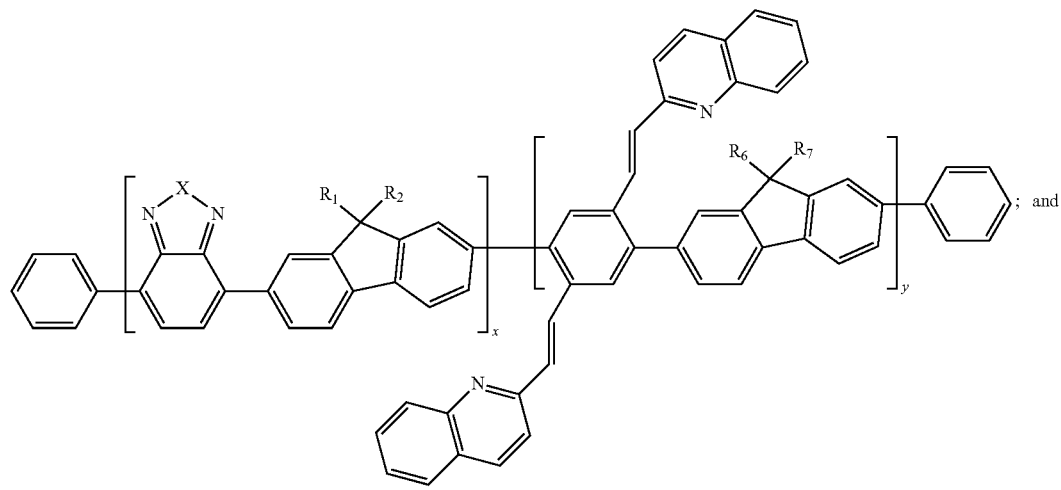
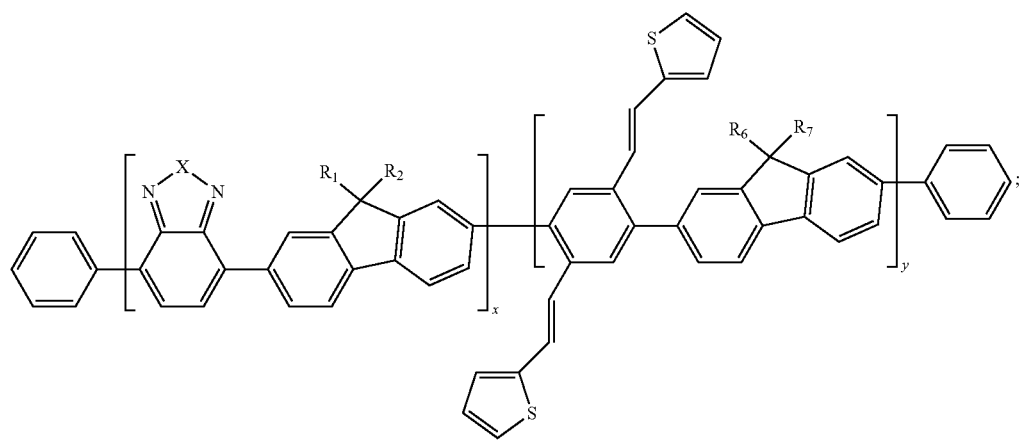
wherein X, $R_1$, $R_2$, $R_6$ and $R_7$ are defined above and x and y are integers independently ranging from 1 to 10,000.
In some embodiments, a conjugated polymer or oligomer of Formula (I) described herein is selected from the group consisting of:
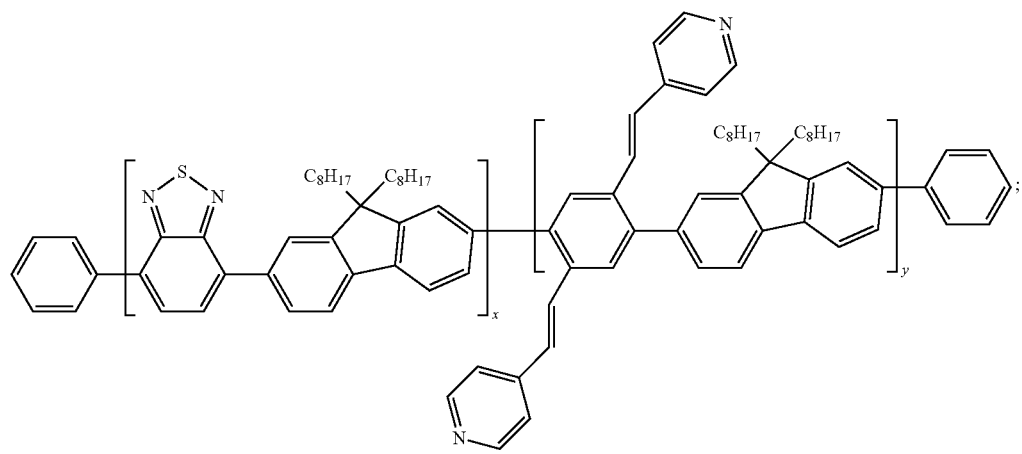

-continued
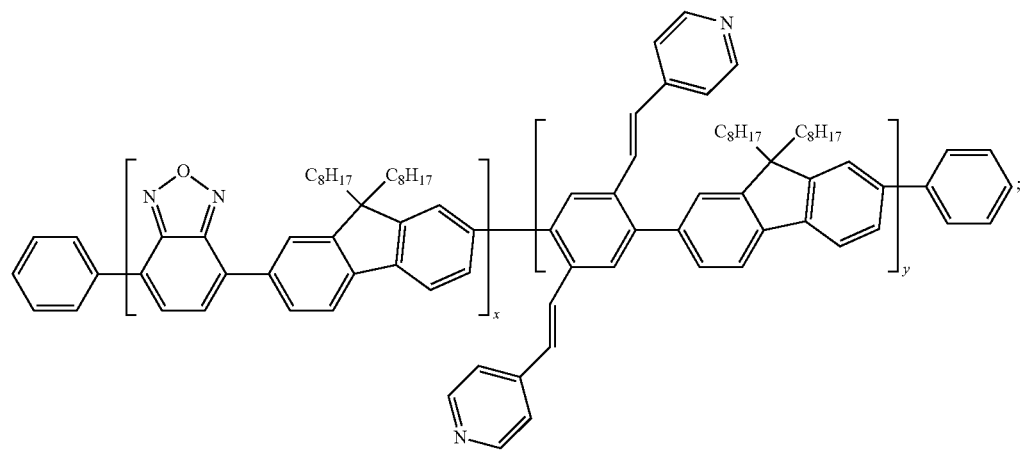
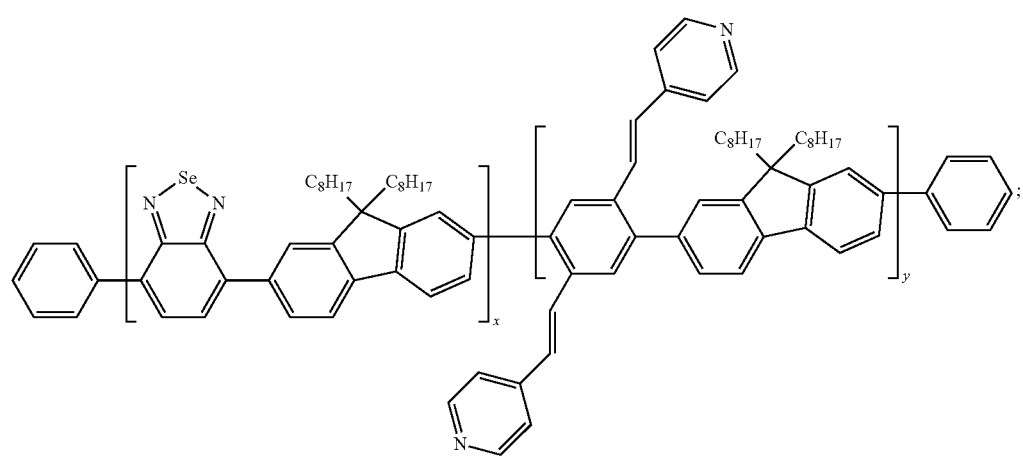
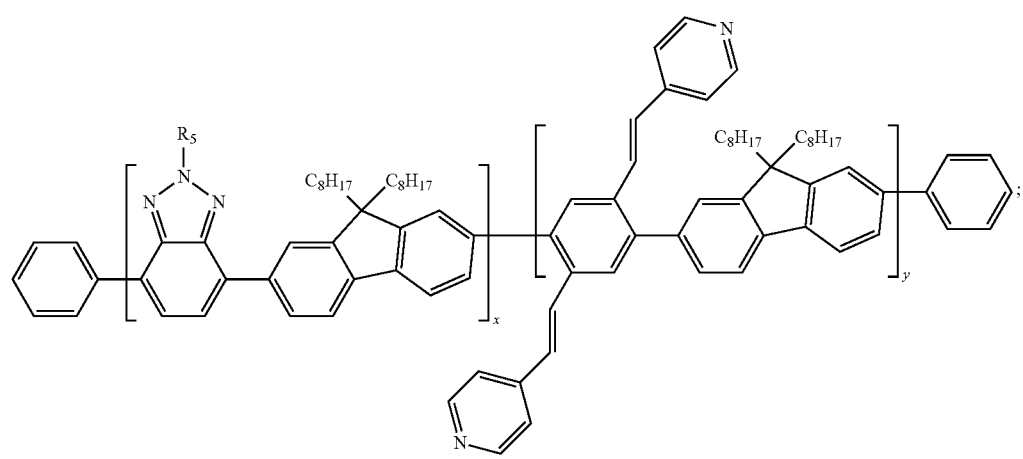

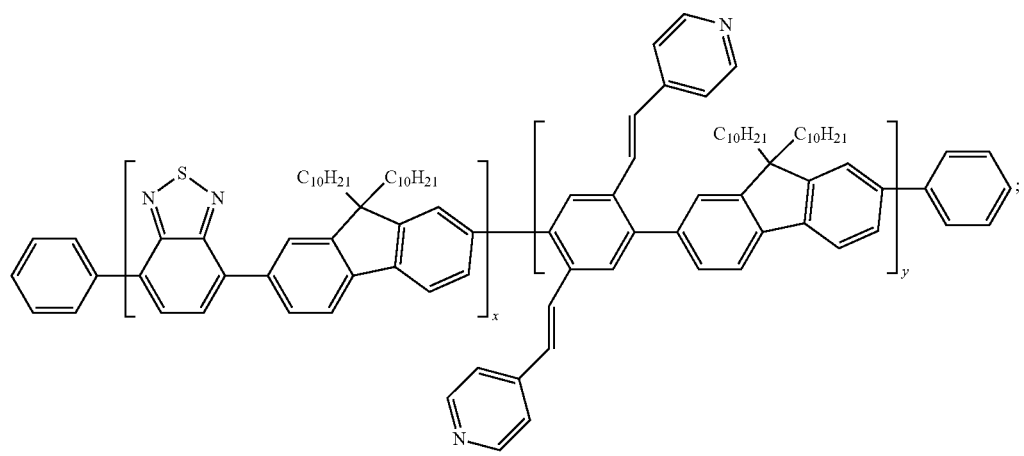
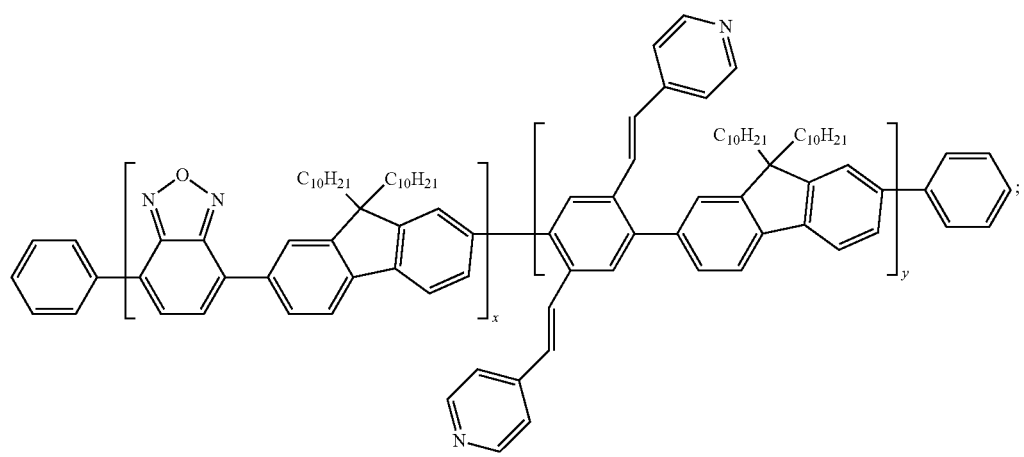
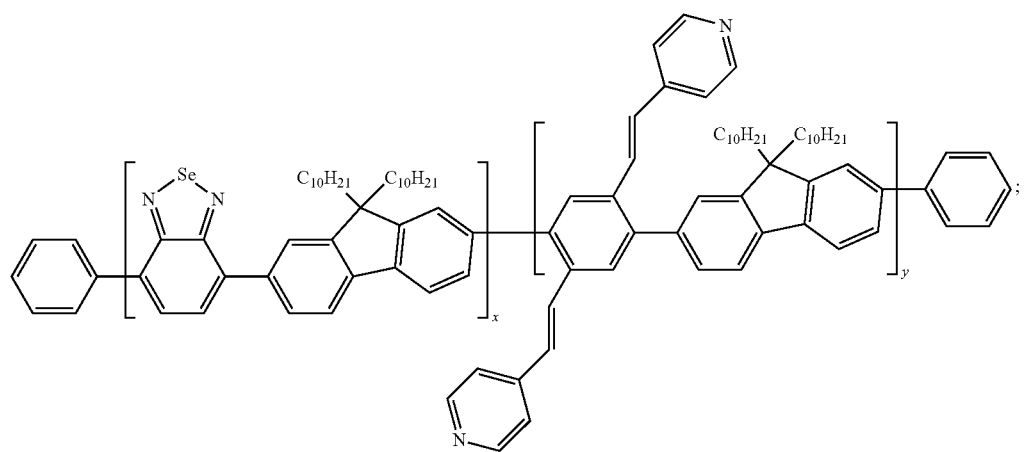

-continued
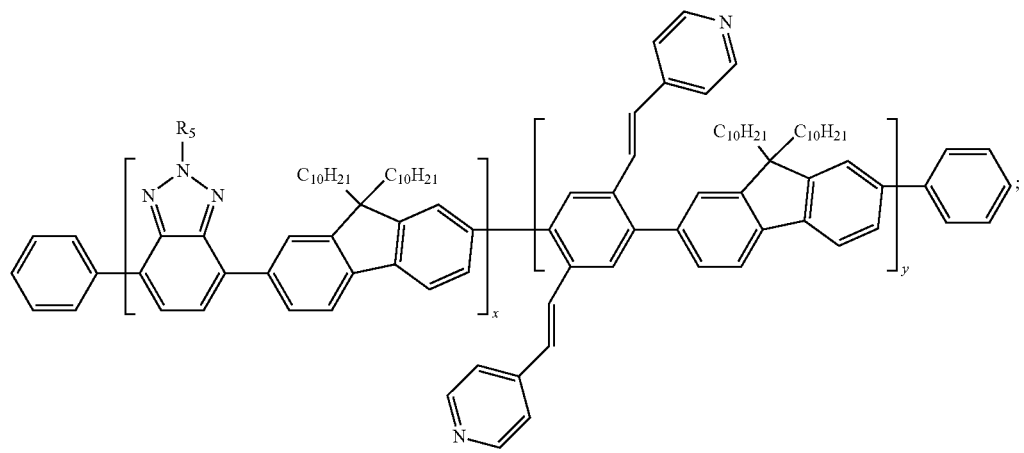
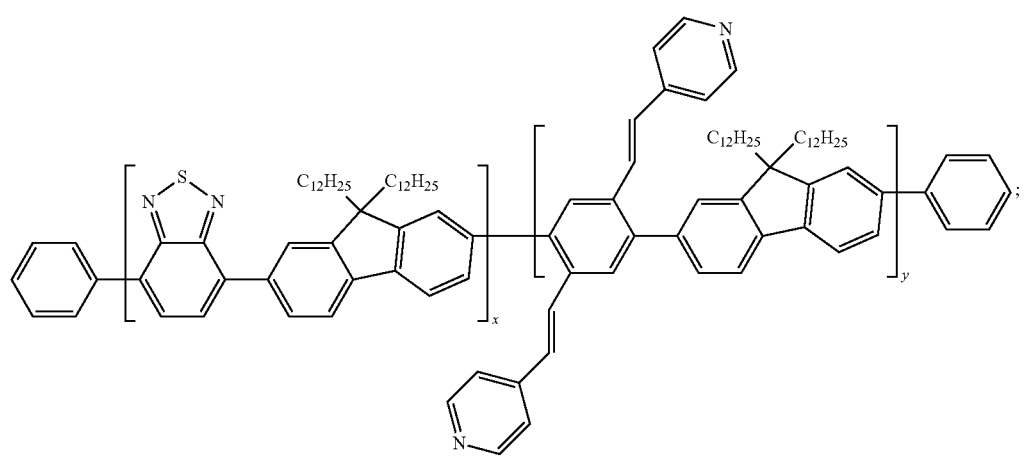
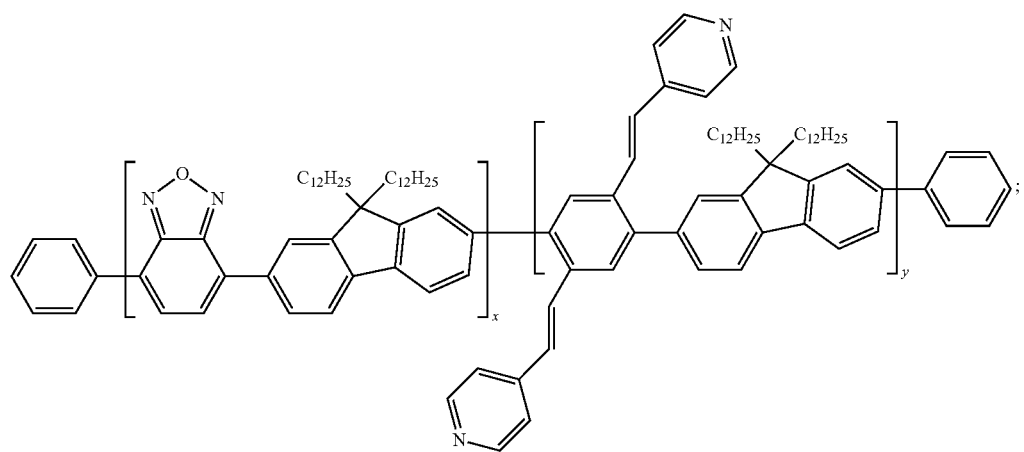

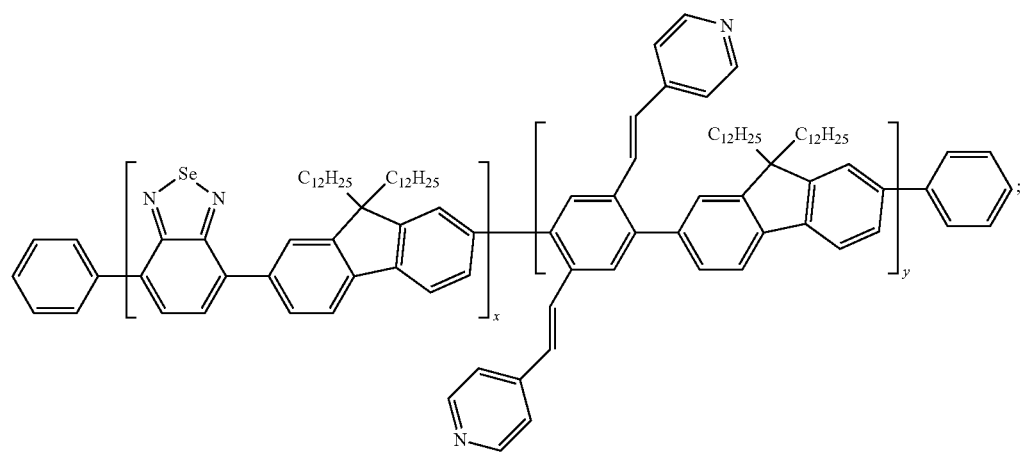
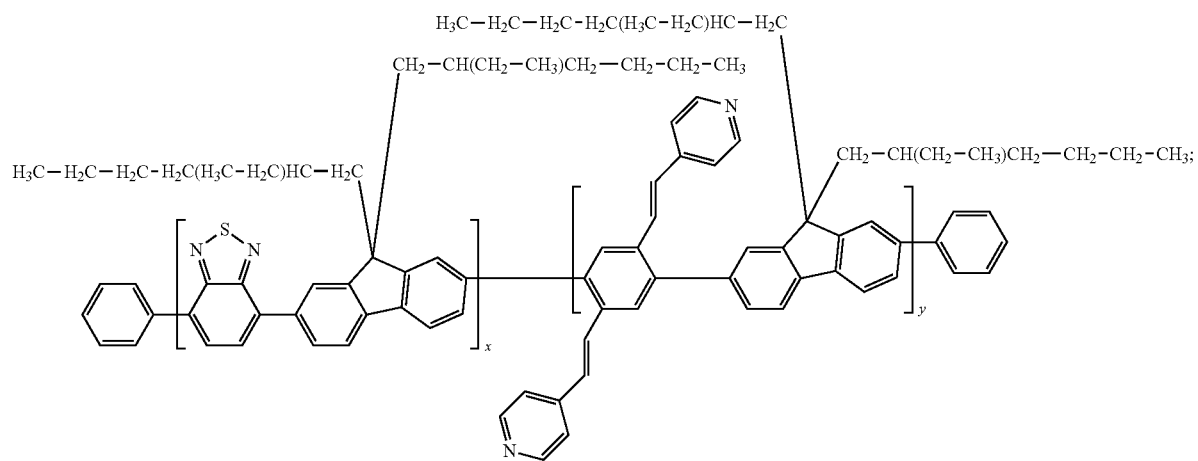
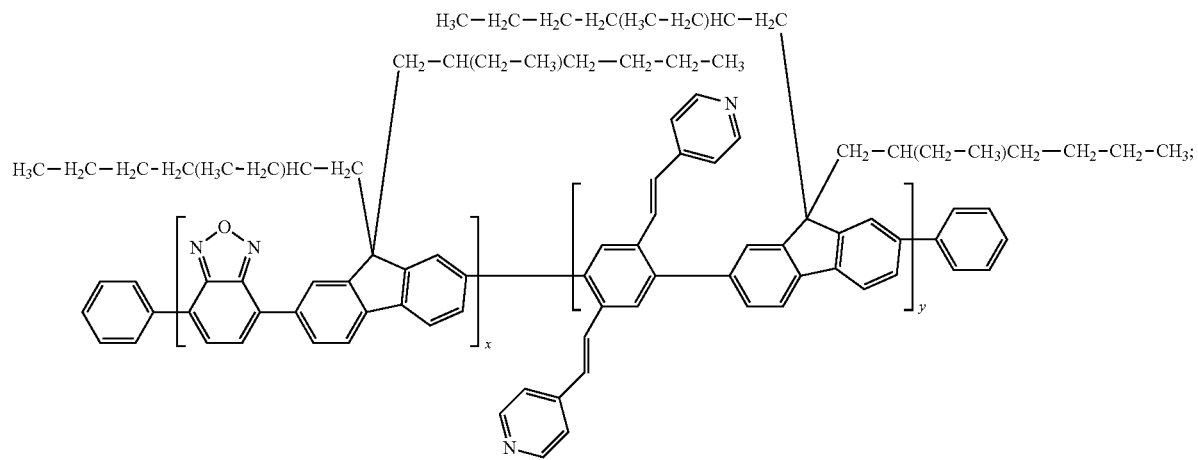

-continued
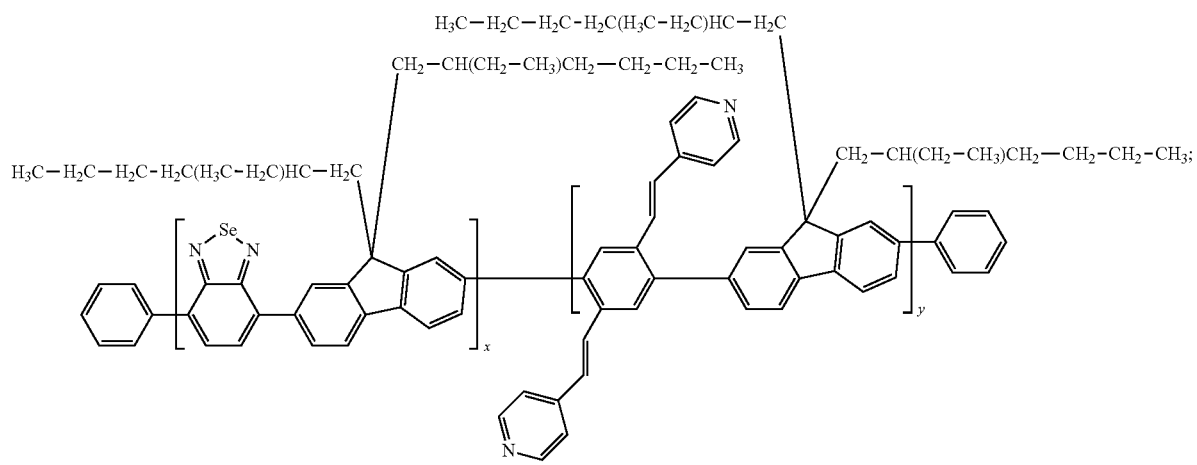
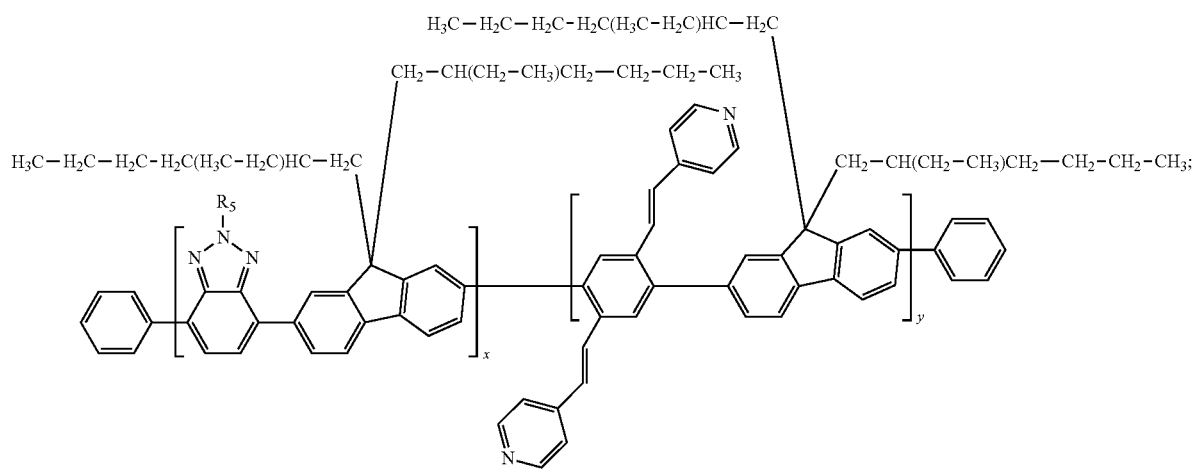
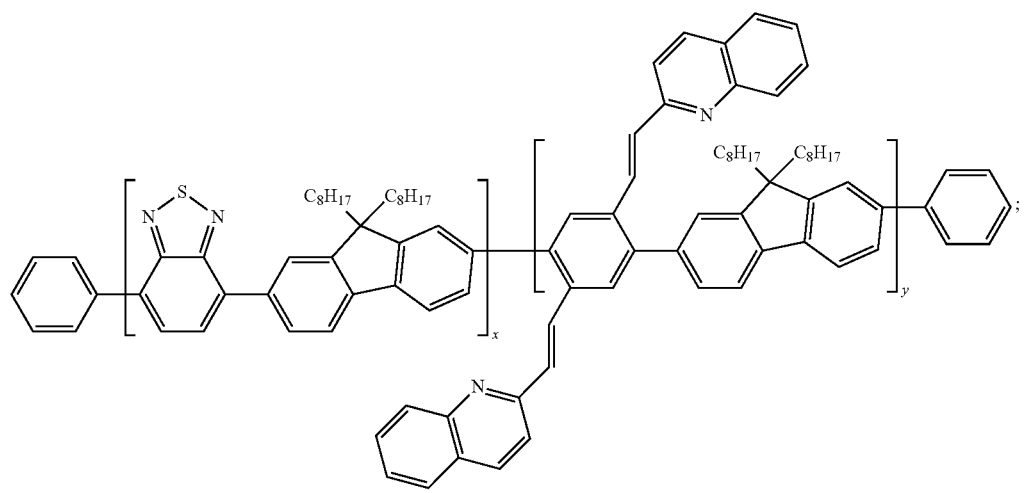

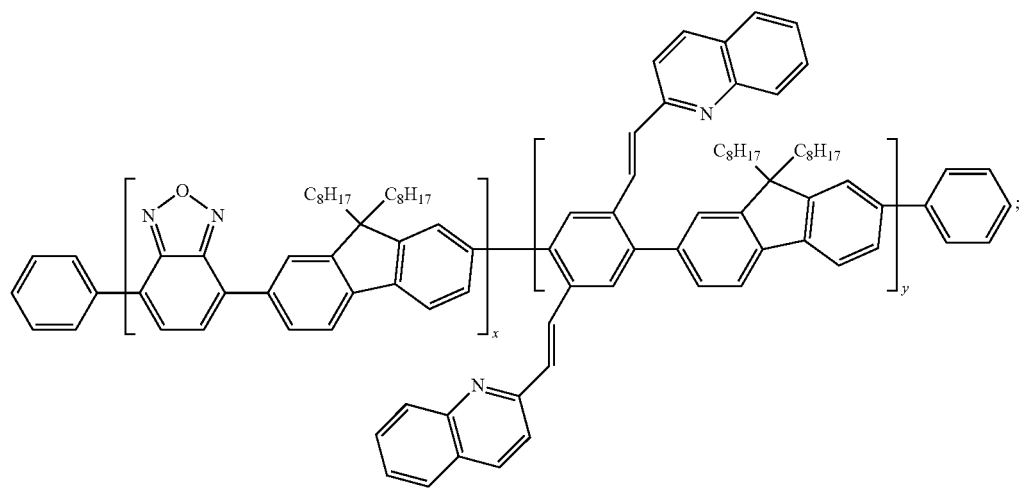
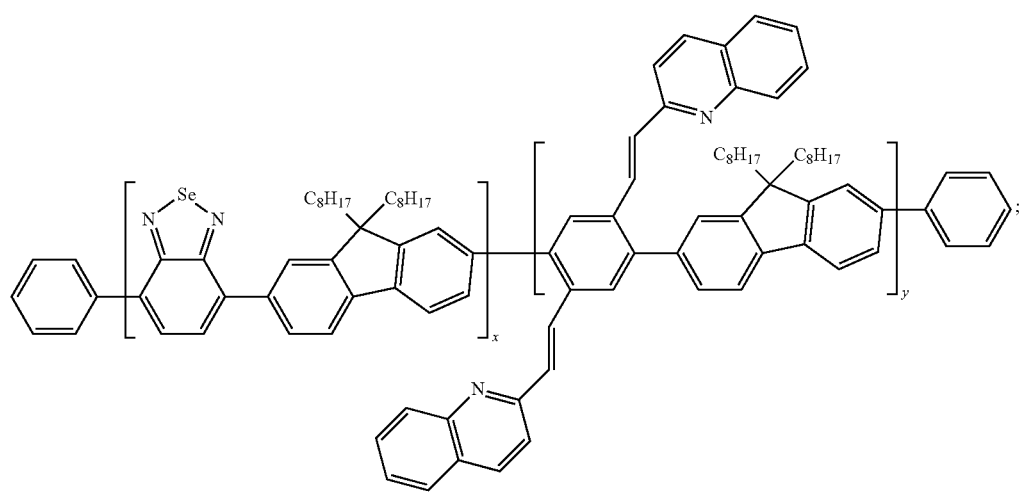
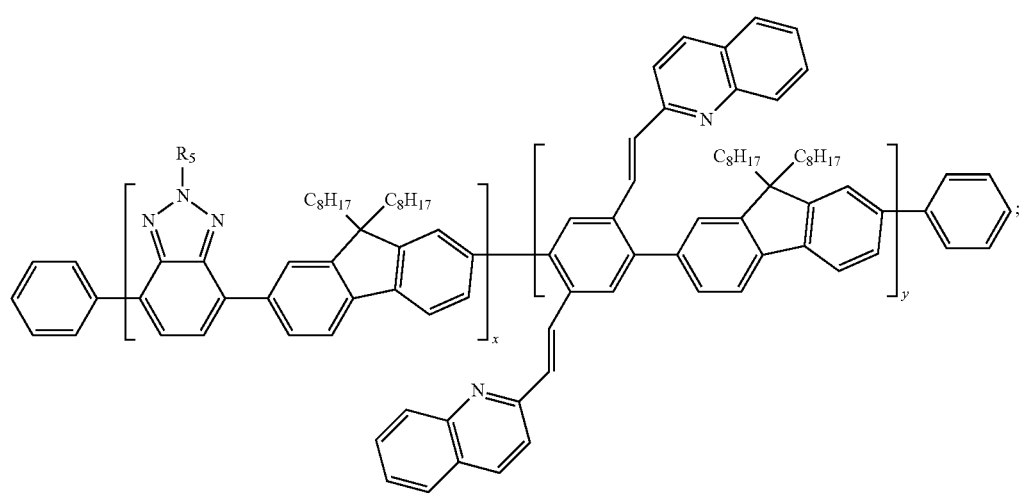

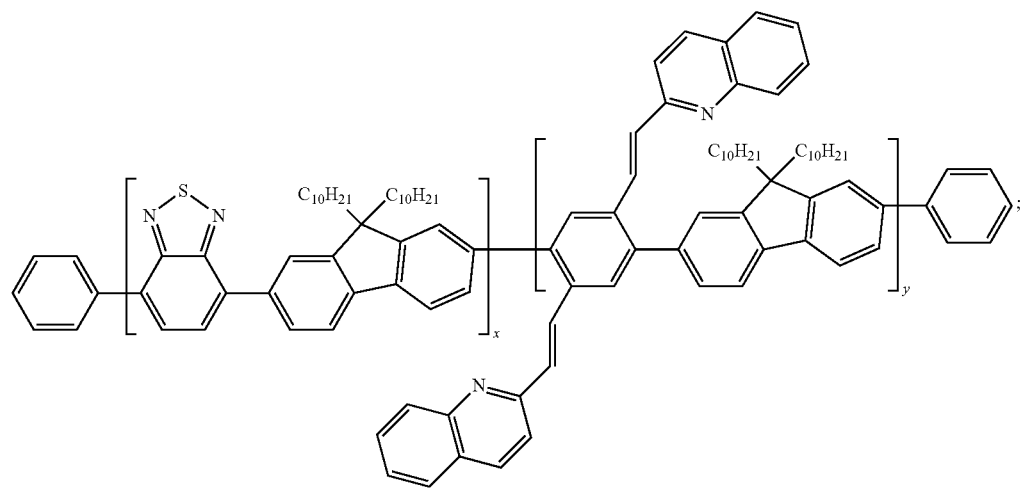
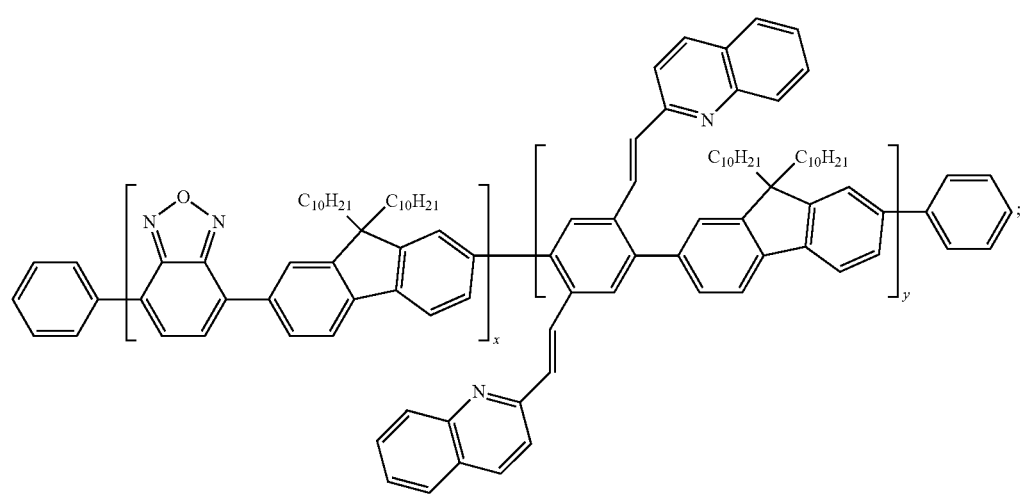
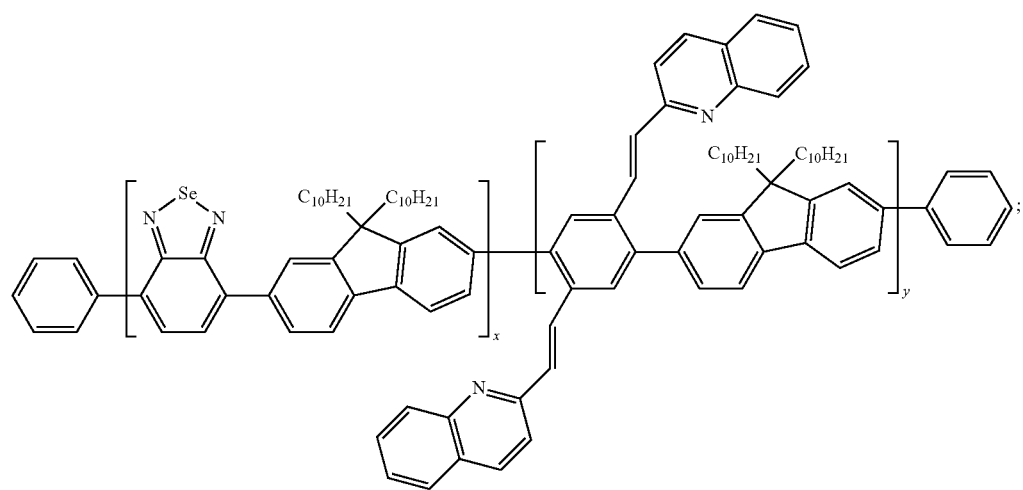

-continued
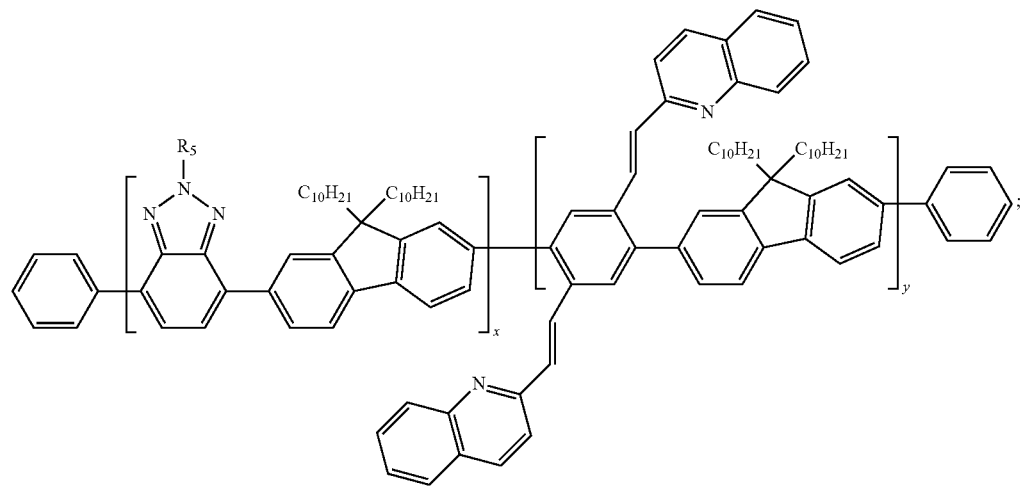
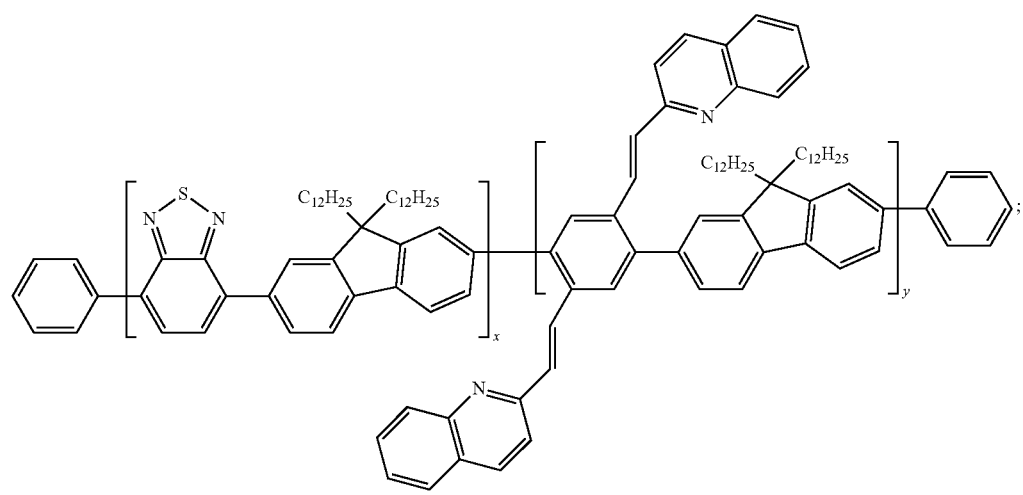
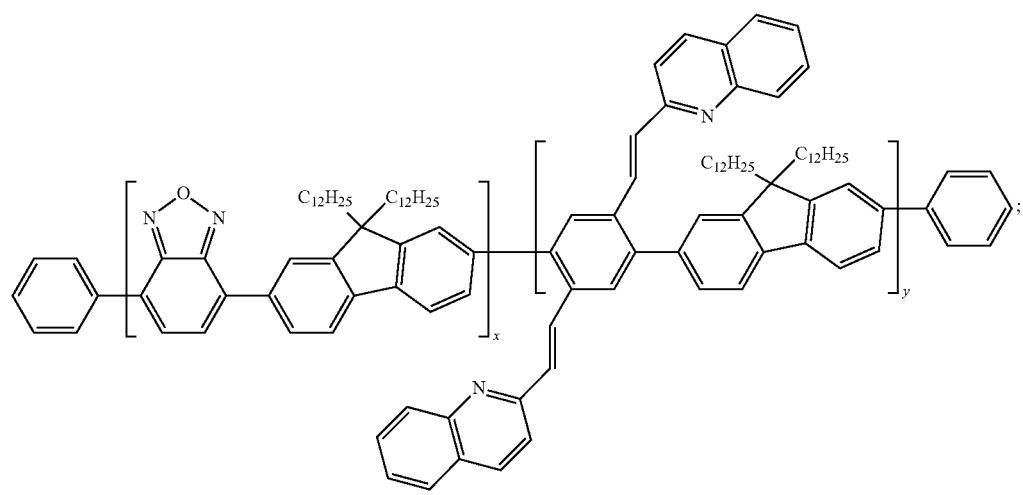

-continued
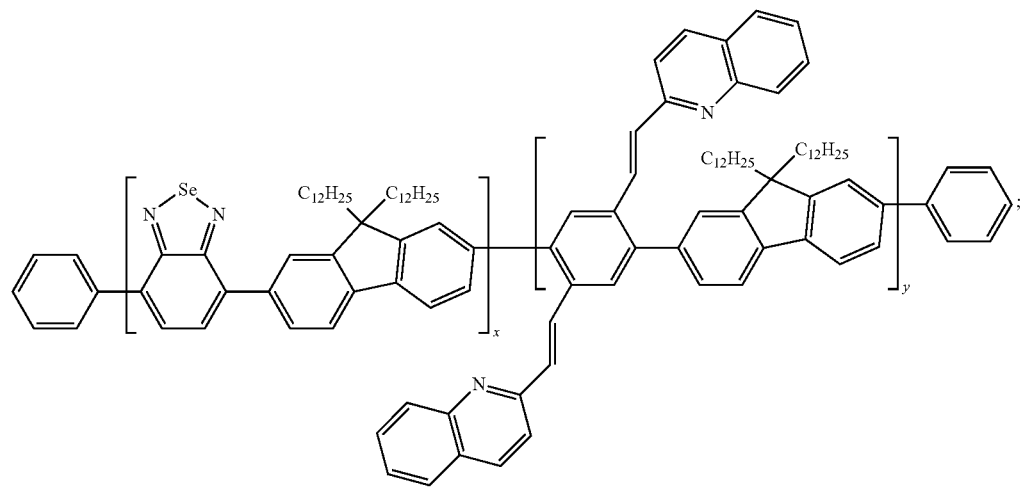
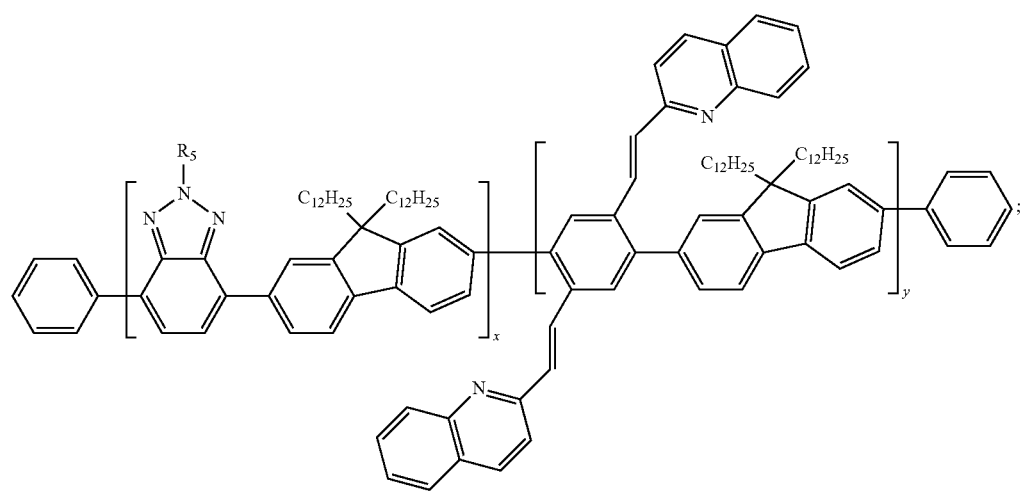
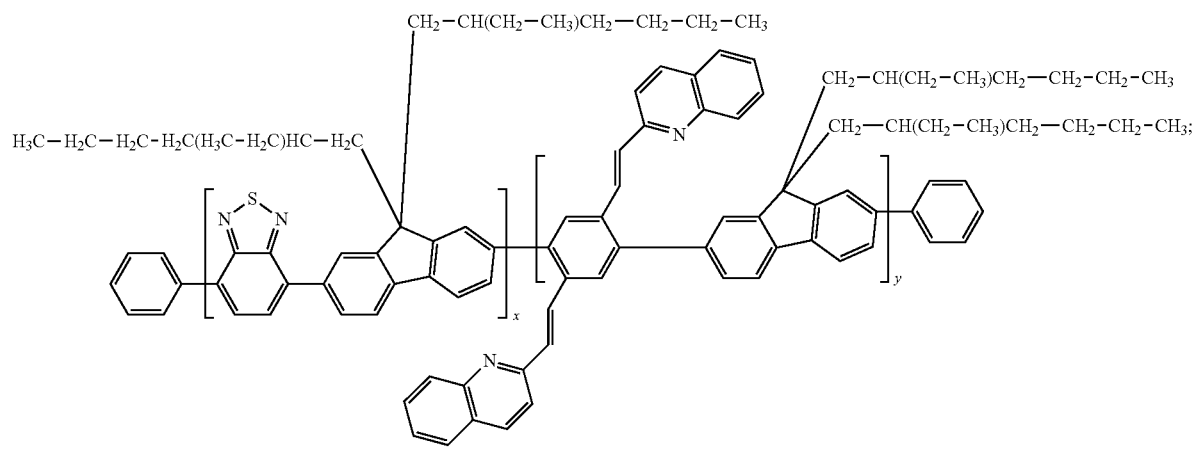

-continued
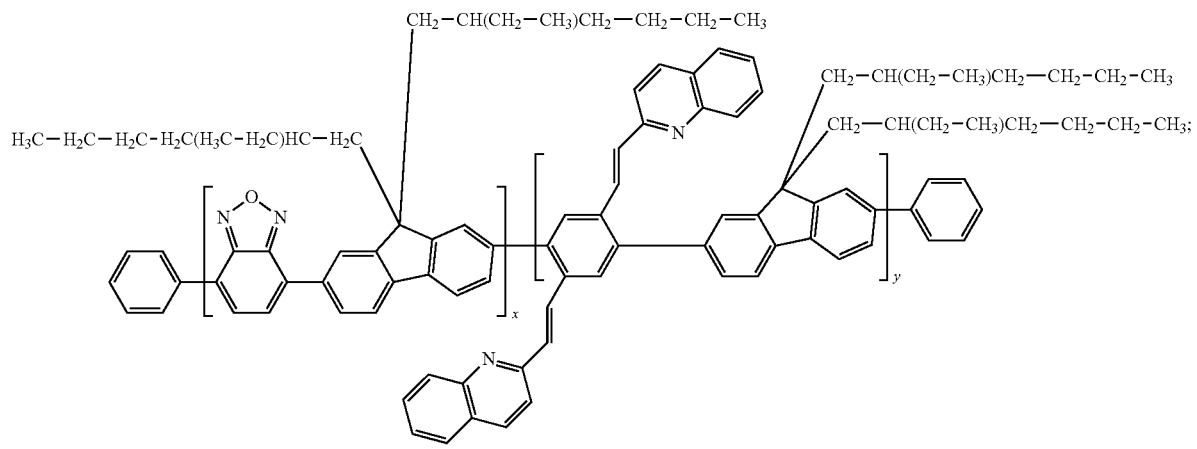
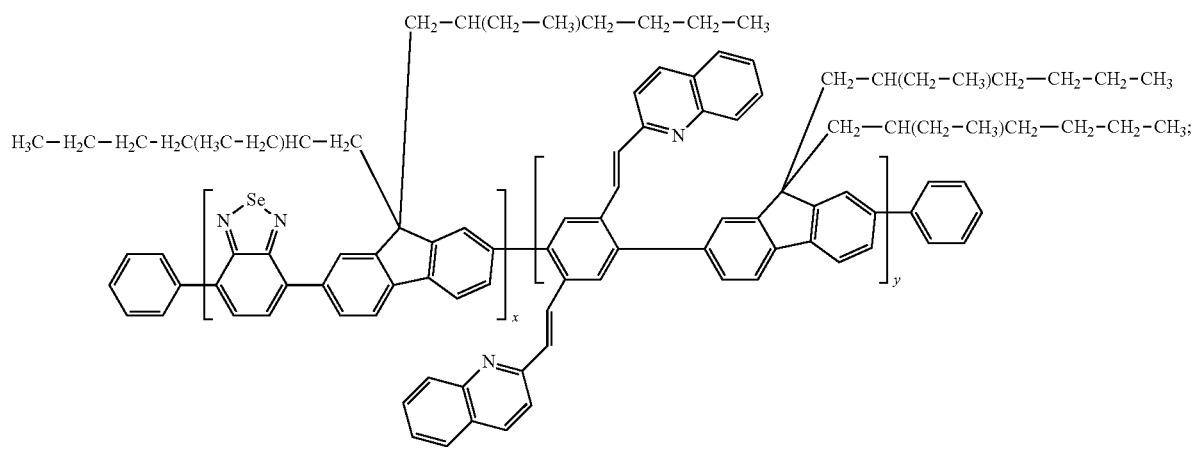
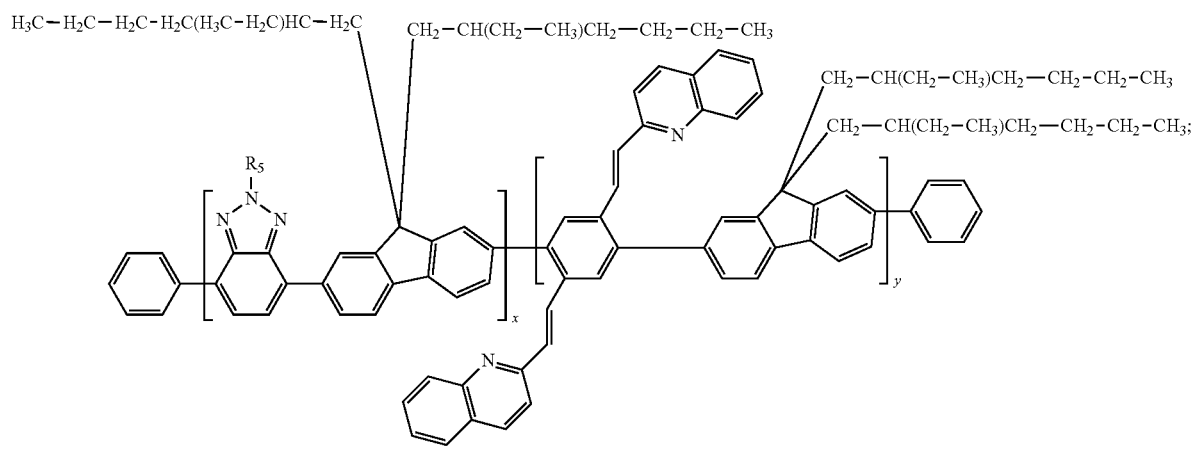

-continued
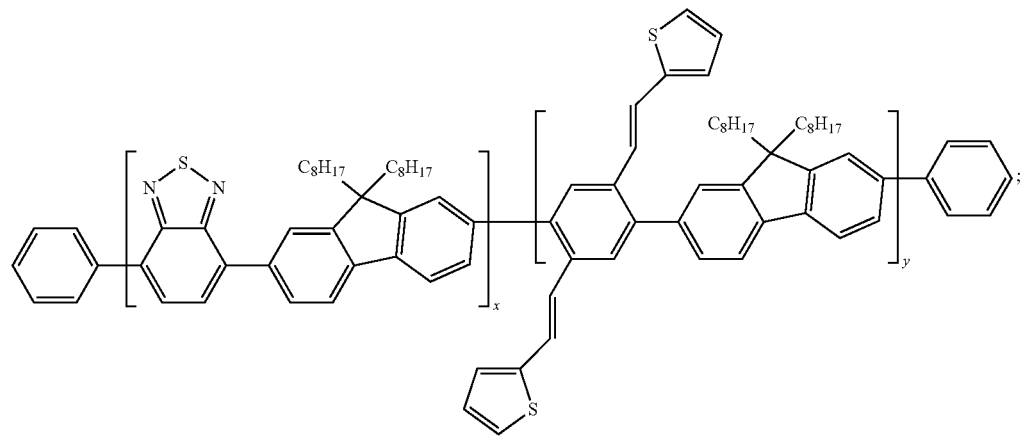
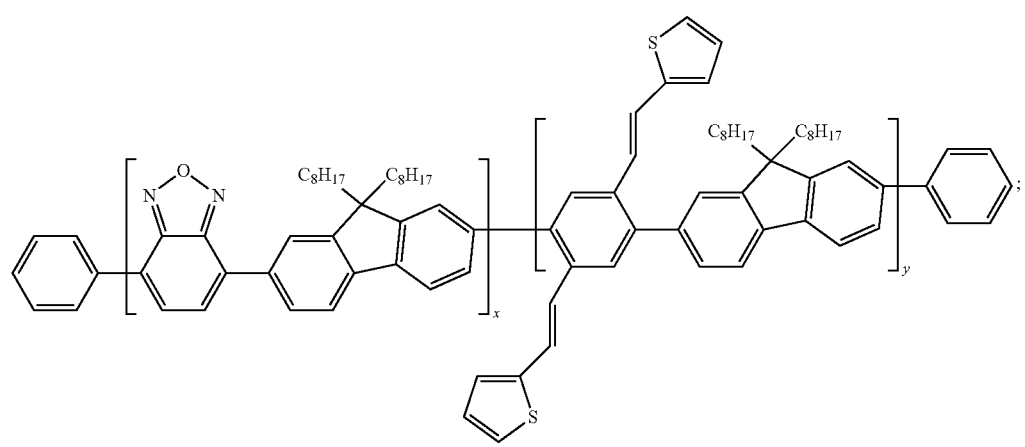
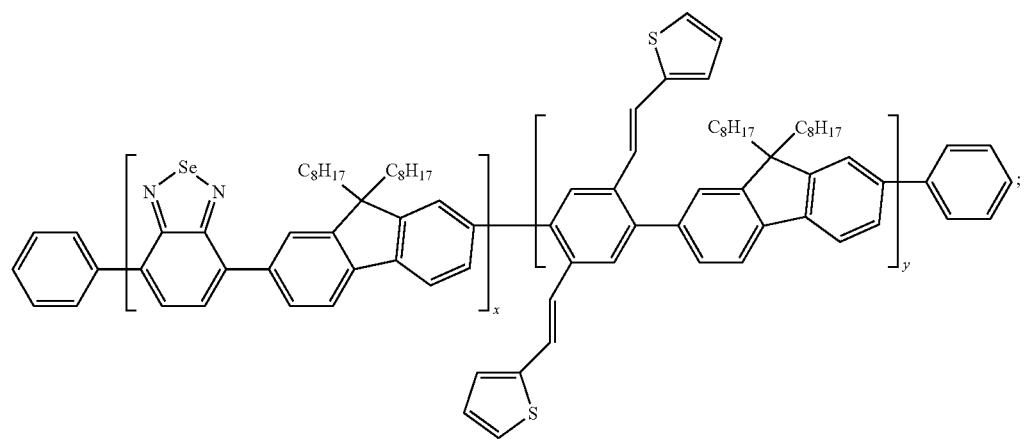

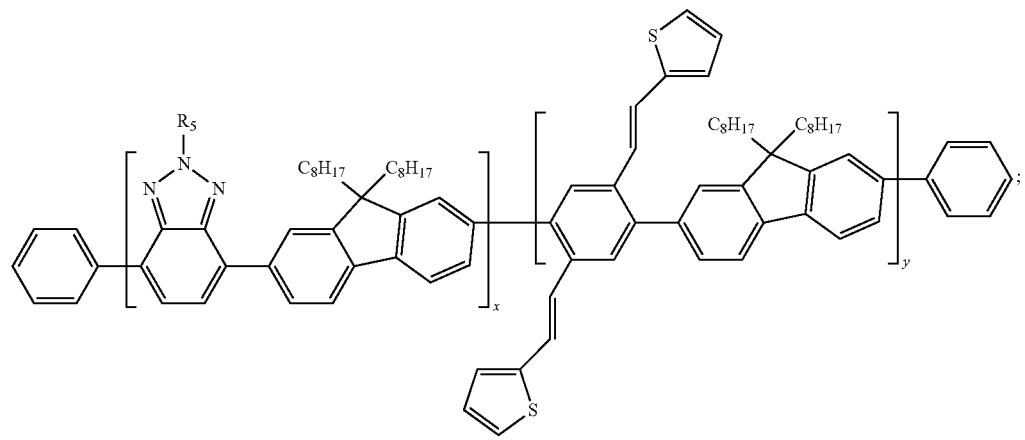
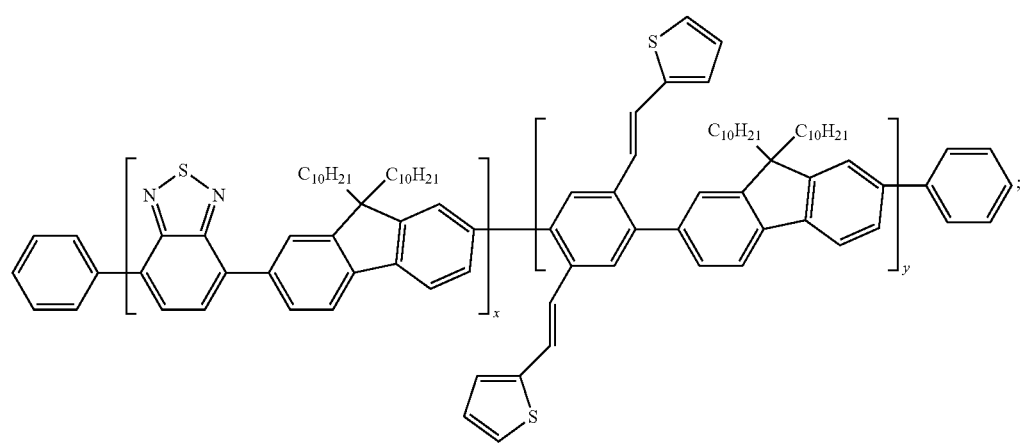
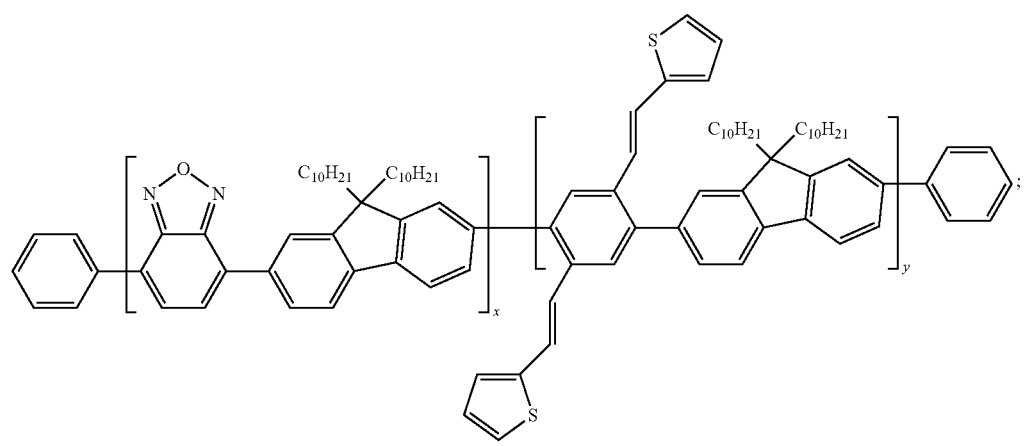

-continued
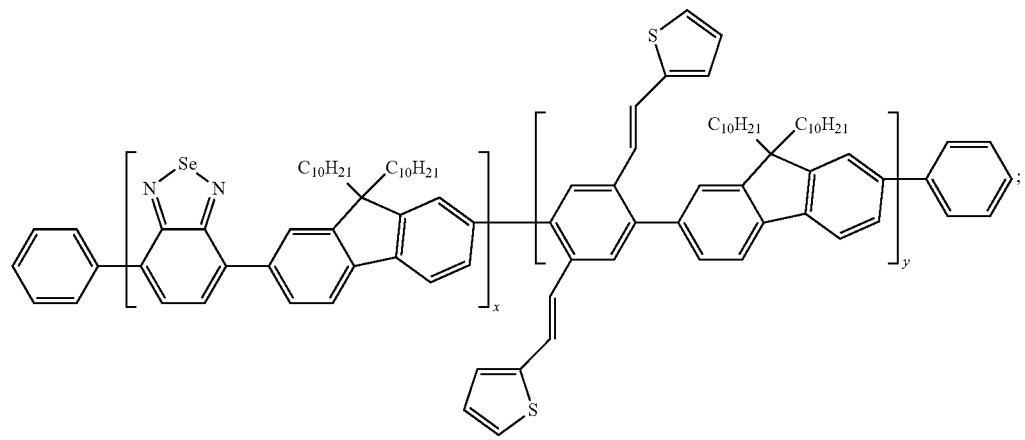
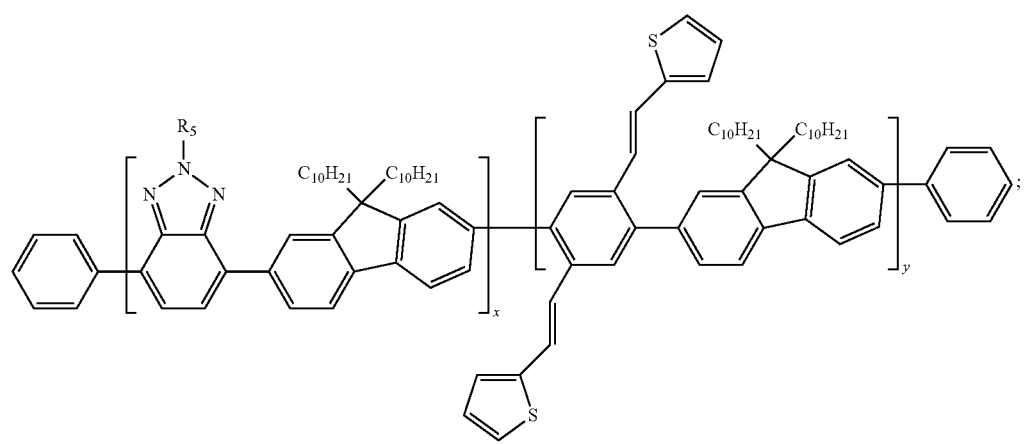
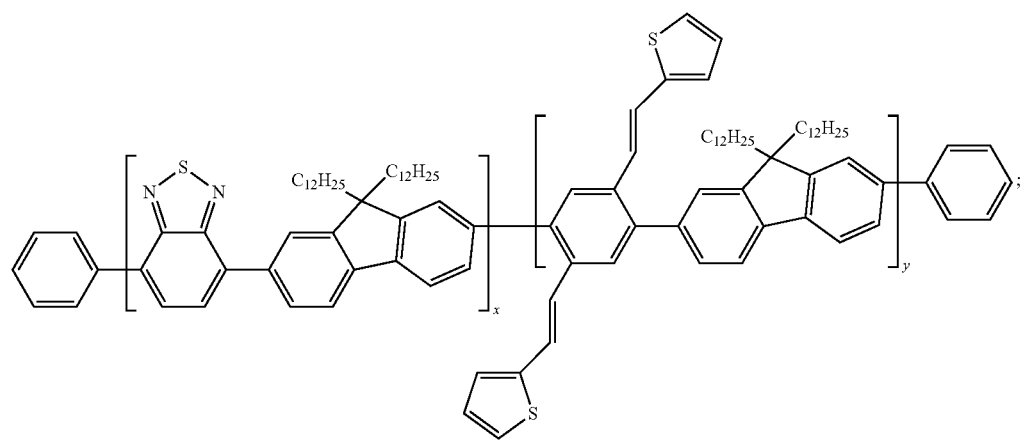

-continued
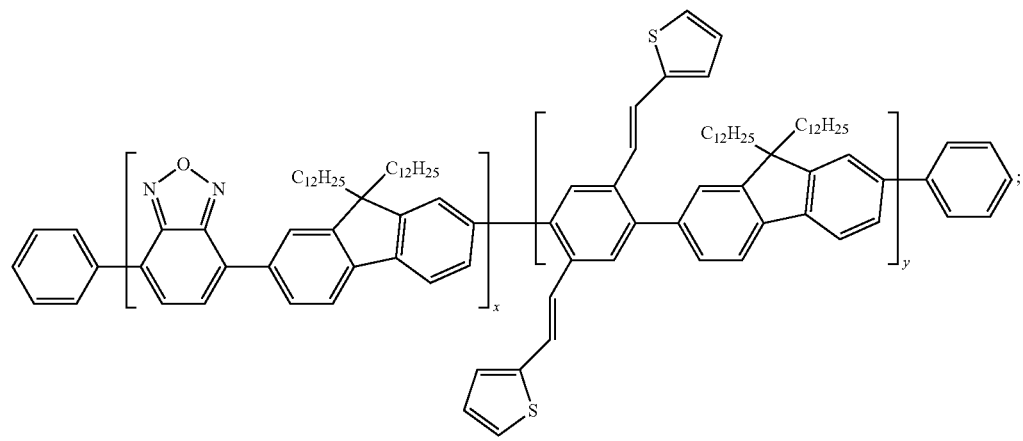
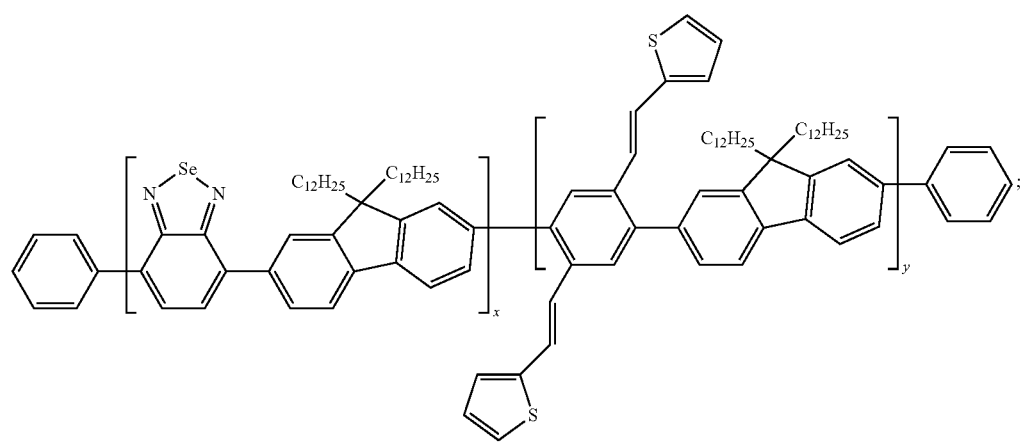
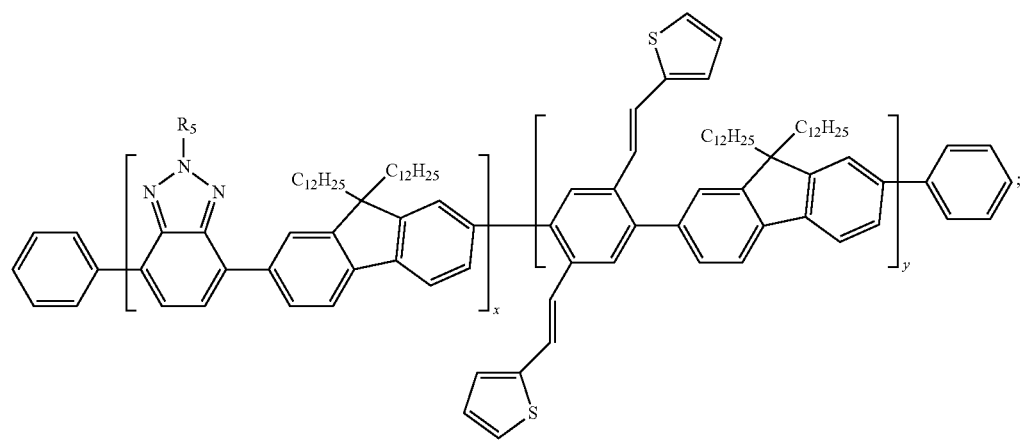

-continued
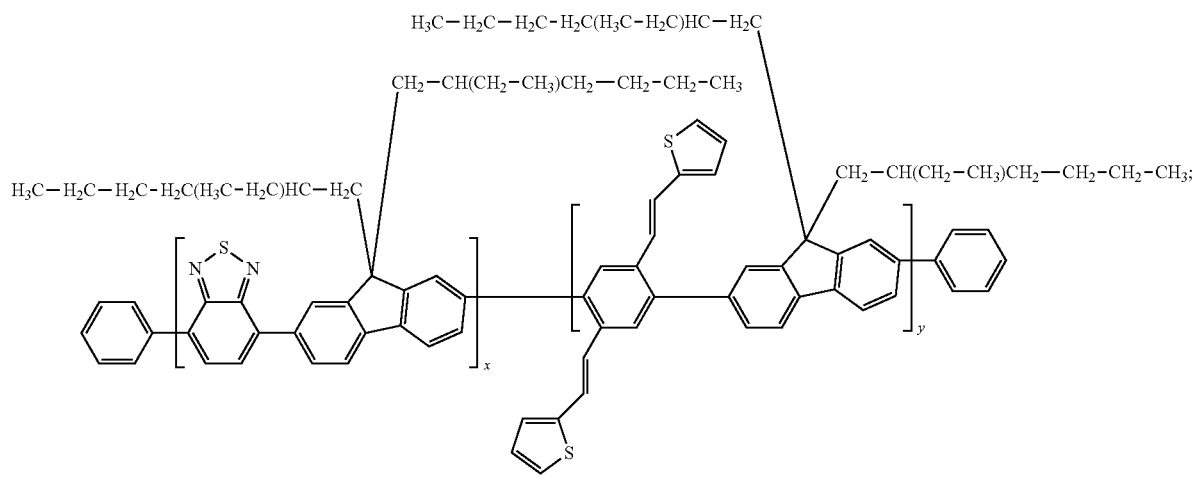
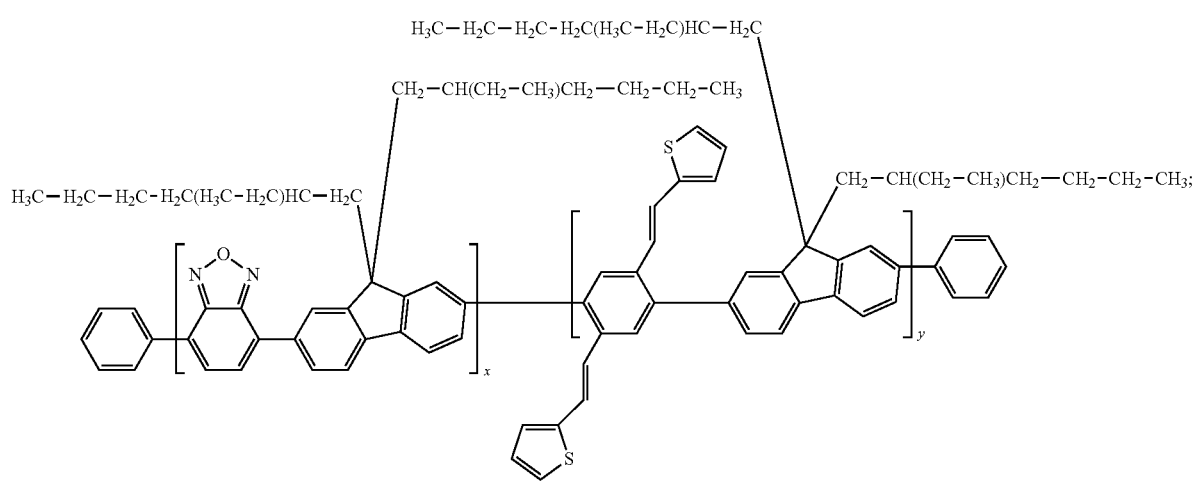
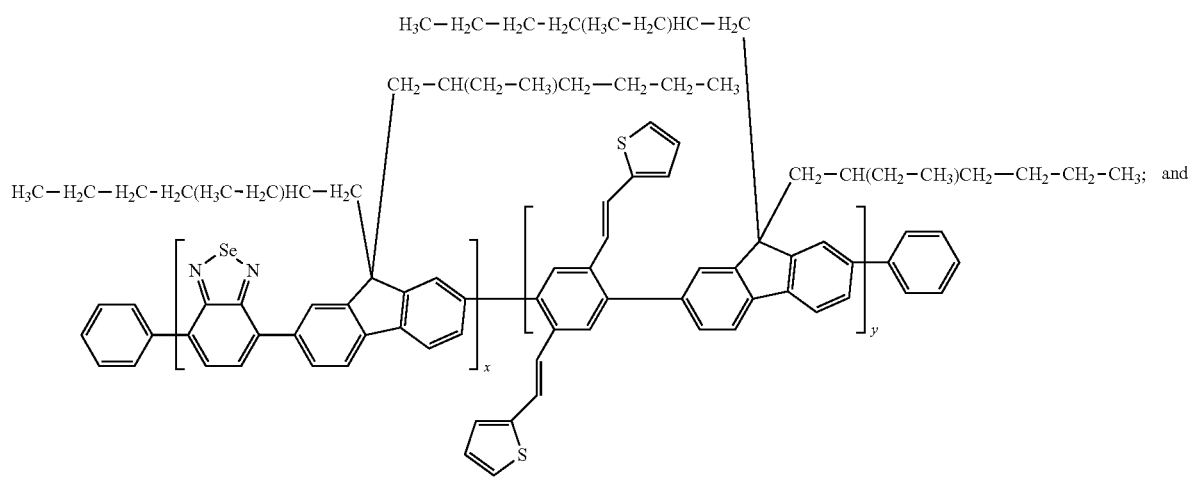

-continued

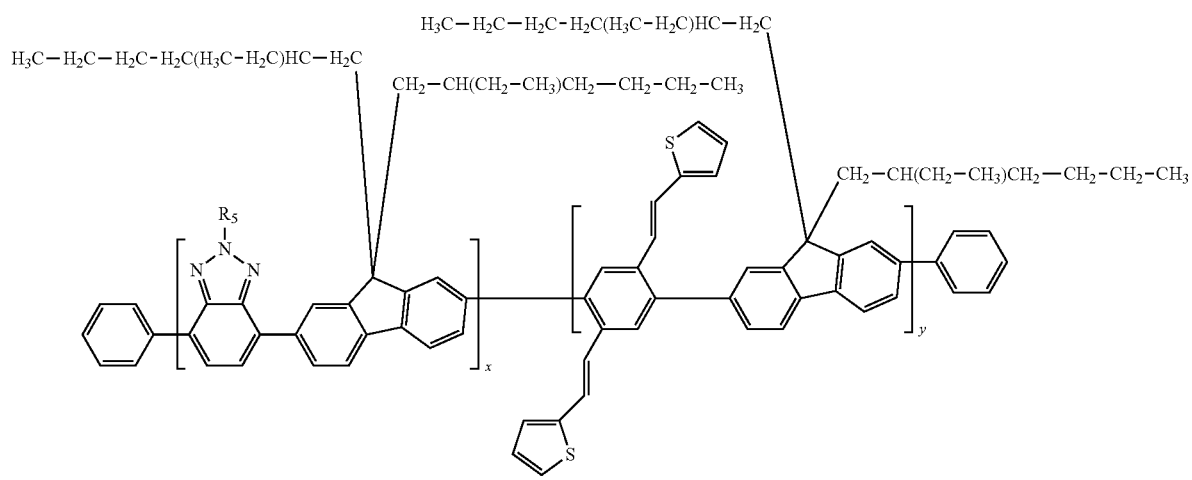

wherein $R_5$ is defined hereinabove and x and y are integers independently ranging from 1 to 10,000.

A conjugated polymer or oligomer of the light emitting polymeric or oligomeric phase comprising repeating units A and C can be a conjugated polymer or oligomer of Formula (II):

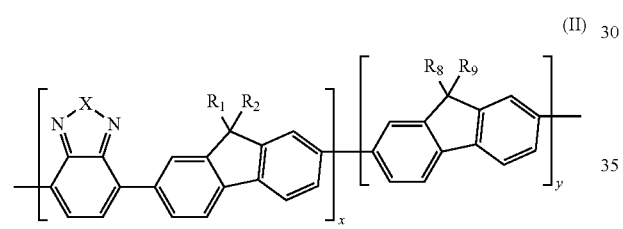

(II)

wherein X, $R_1$, $R_2$, $R_8$ and $R_9$ are defined above and x and y are integers independently ranging from 1 to 10,000. As described herein, repeating units A and C of a conjugated polymer or oligomer of Formula (II) can be arranged to provide an alternating copolymer, a block copolymer, statistical copolymer or a random copolymer.

In some embodiments, a conjugated polymer or oligomer of Formula (II) has a weight average molecular weight ($M_w$) ranging from about 1,000 to about 1,000,000. A conjugated polymer or oligomer of Formula (II) can have a number average molecular weight ($M_n$) ranging from about 500 to about 500,000.

In some embodiments, a conjugated polymer or oligomer of Formula (II) described herein is selected from the group consisting of:

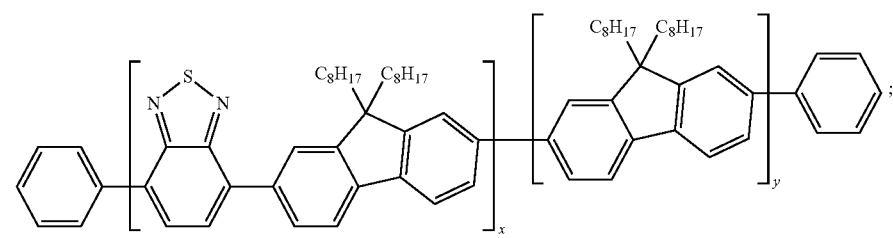

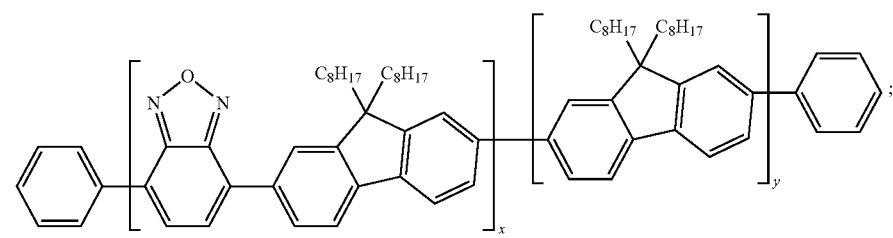

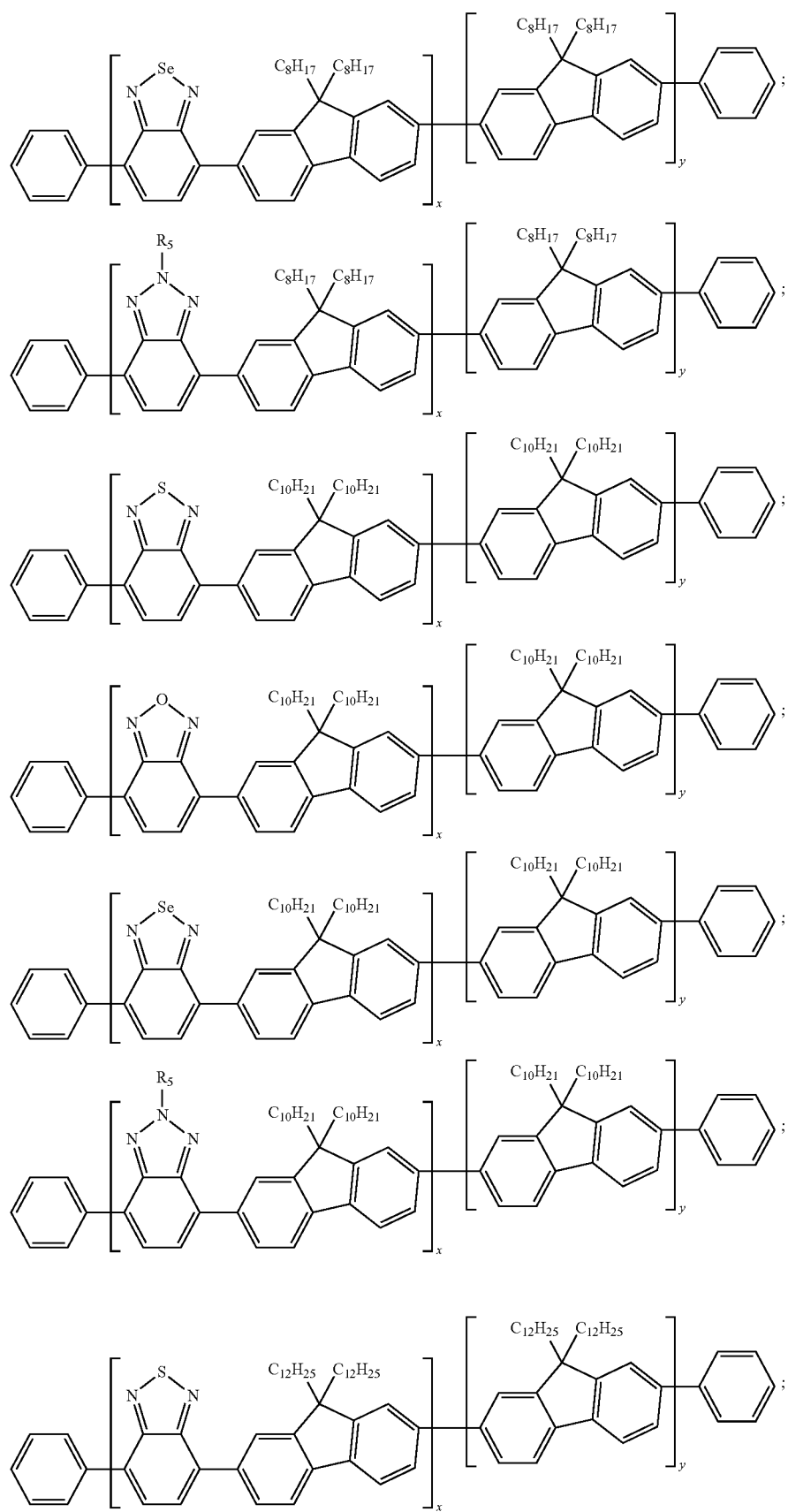

-continued
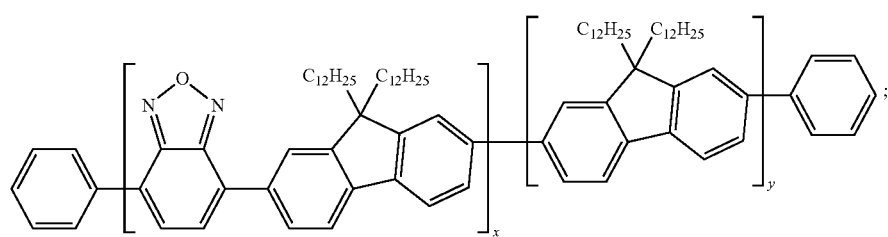
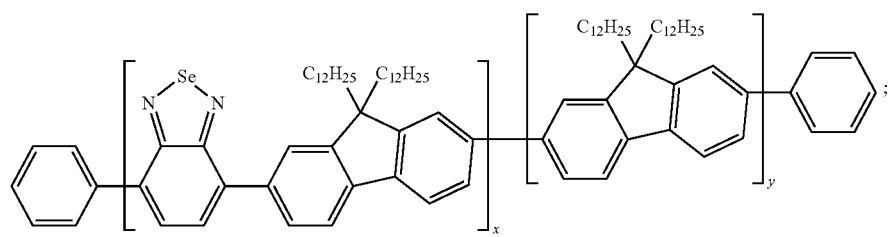
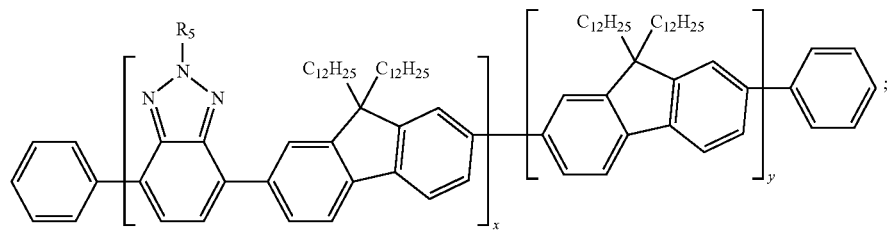
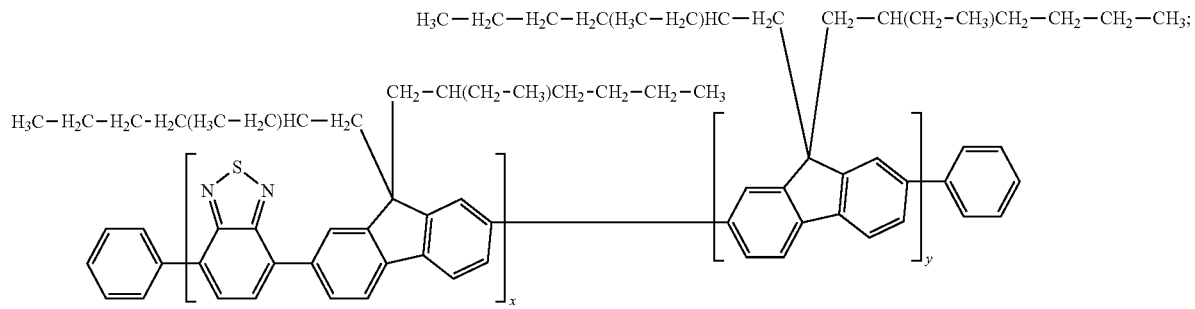
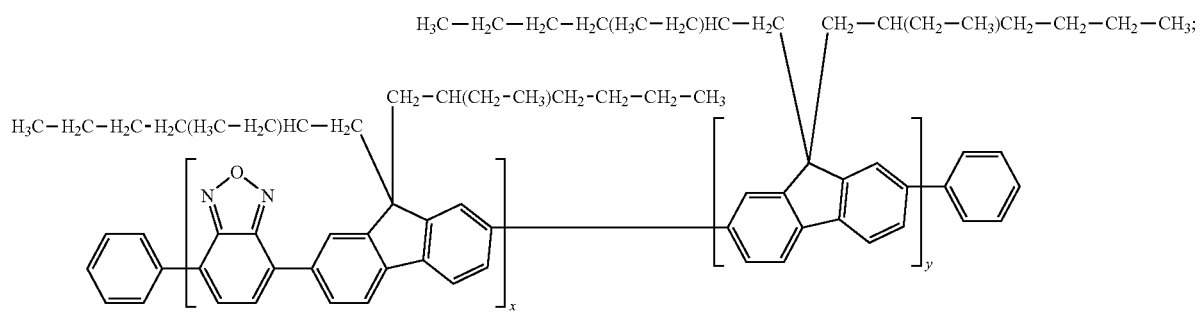

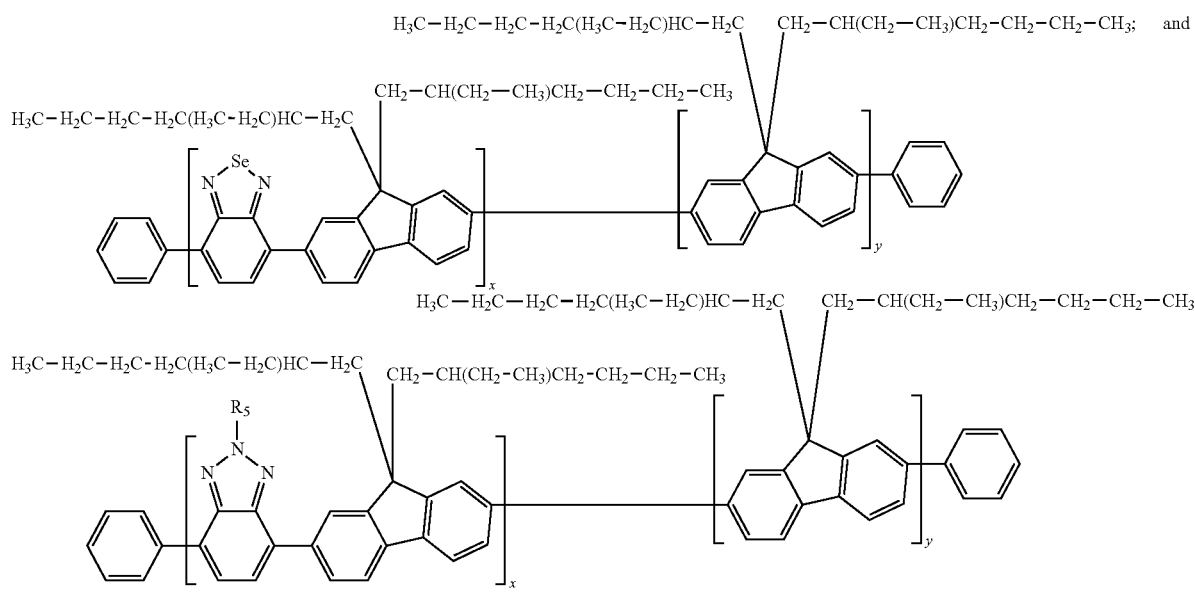

wherein $R_5$ is defined hereinabove and x and y are integers independently ranging from 1 to 10,000.

A conjugated polymer or oligomer of the light emitting polymeric or oligomeric phase comprising repeating units B and C can be a conjugated polymer or oligomer of Formula (III):

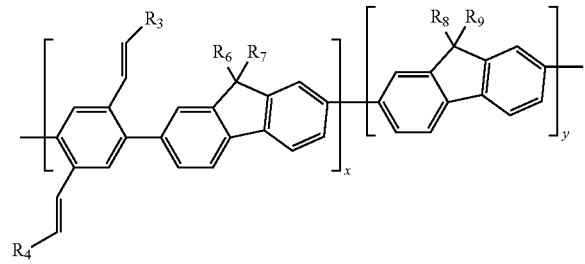

(III)

wherein $R_3$, $R_4$, $R_6$, $R_7$, $R_8$ and $R_9$ are defined above and x and y are integers independently ranging from 1 to 10,000.

As described herein, repeating units B and C of a conjugated polymer or oligomer of Formula (III) can be arranged to provide an alternating copolymer, a block copolymer, statistical copolymer or a random copolymer.

A conjugated polymer or oligomer of Formula (III) can have a weight average molecular weight ($M_w$) ranging from about 1,000 to about 1,000,000. In some embodiments, a conjugated polymer or oligomer of Formula (III) has a number average molecular weight ($M_n$) ranging from about 500 to about 500,000.

A conjugated polymer or oligomer of Formula (III) described herein can be selected from the group consisting of:

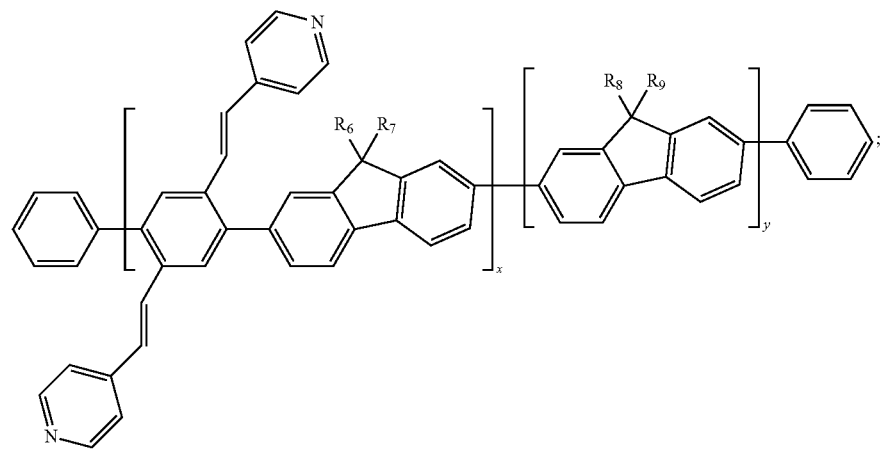

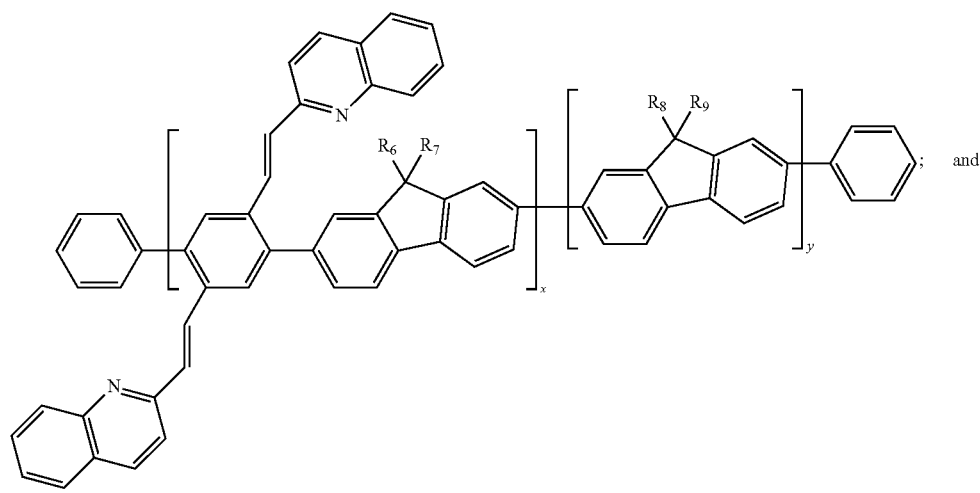
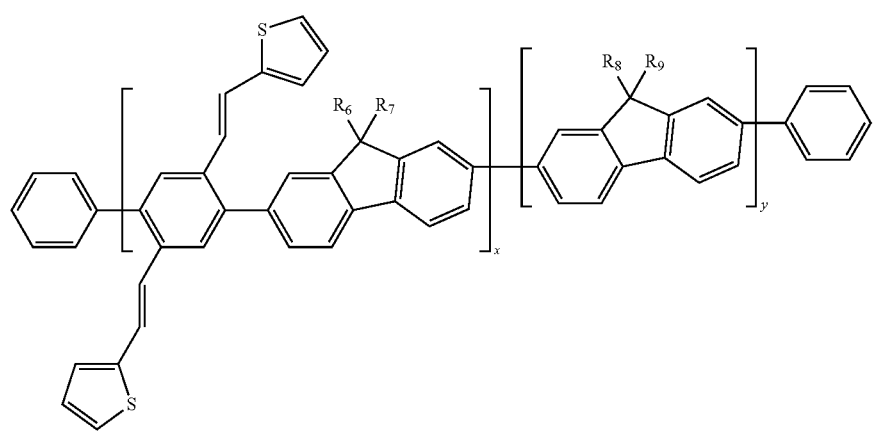
wherein $R_6$, $R_7$, $R_8$ and $R_9$ are defined above and x and y are integers independently ranging from 1 to 10,000.
In some embodiments, a conjugated polymer or oligomer of Formula (III) described herein is selected from the group consisting of:
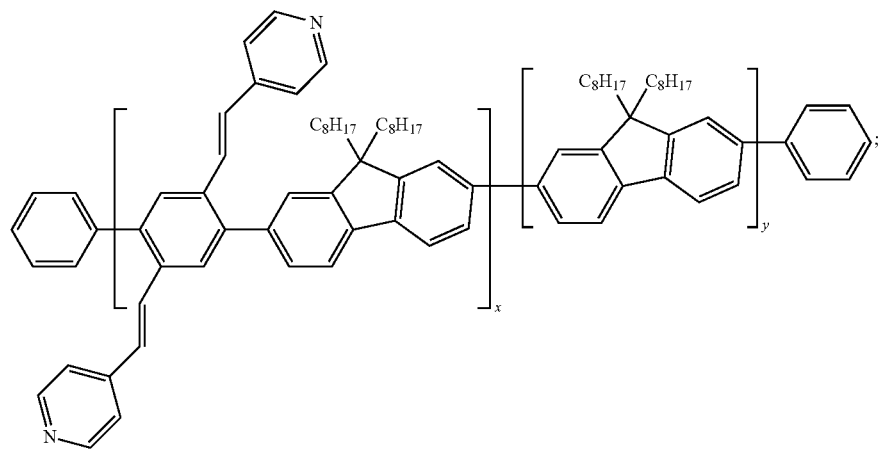

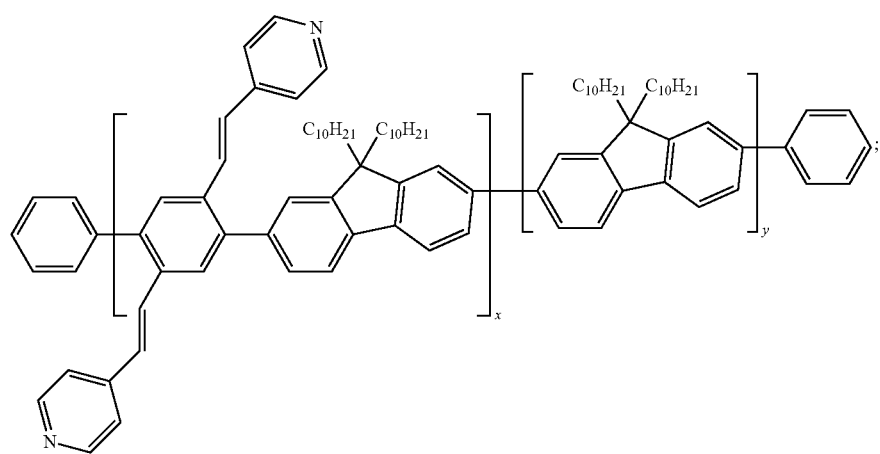
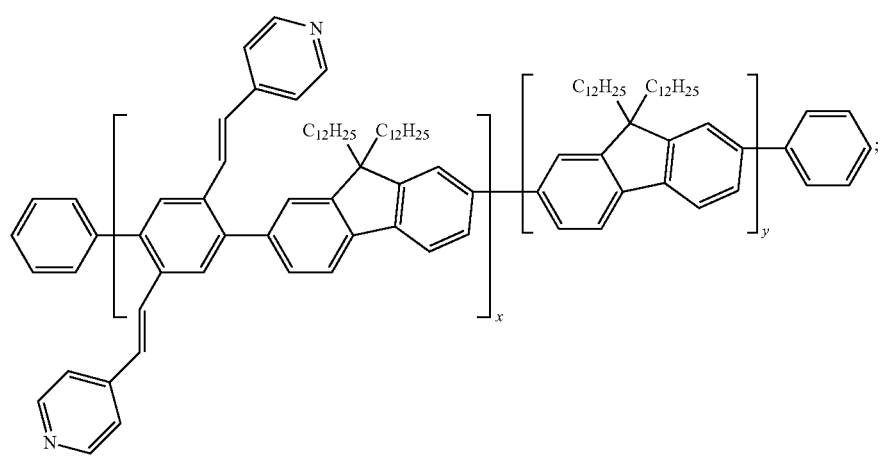
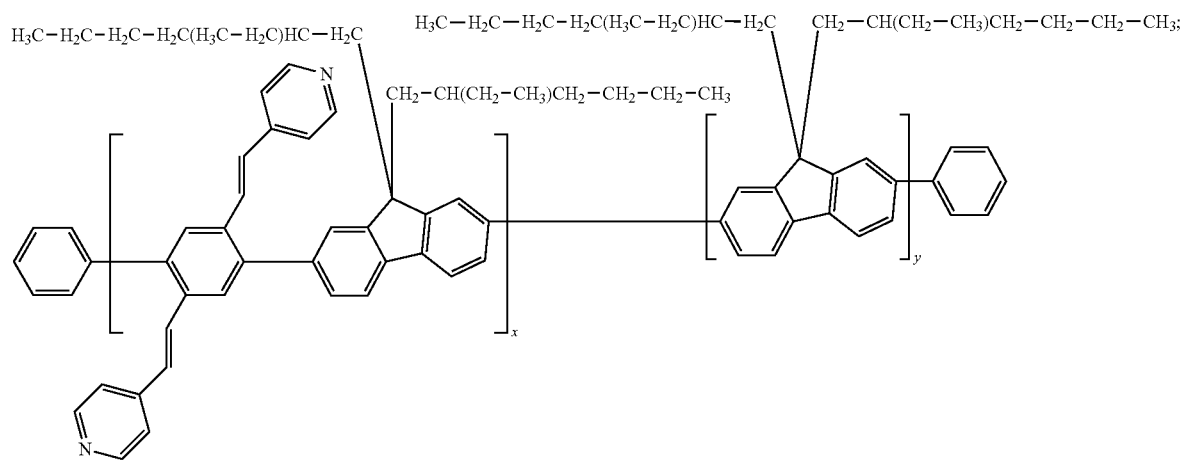

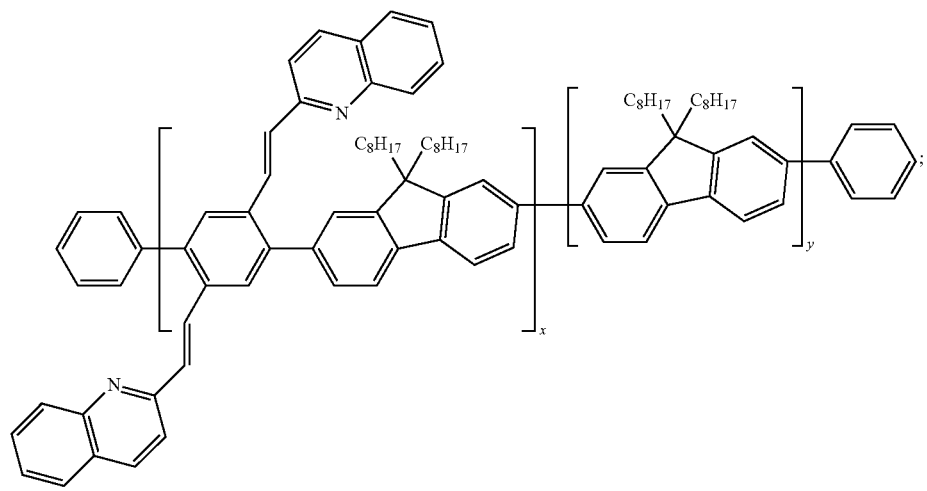
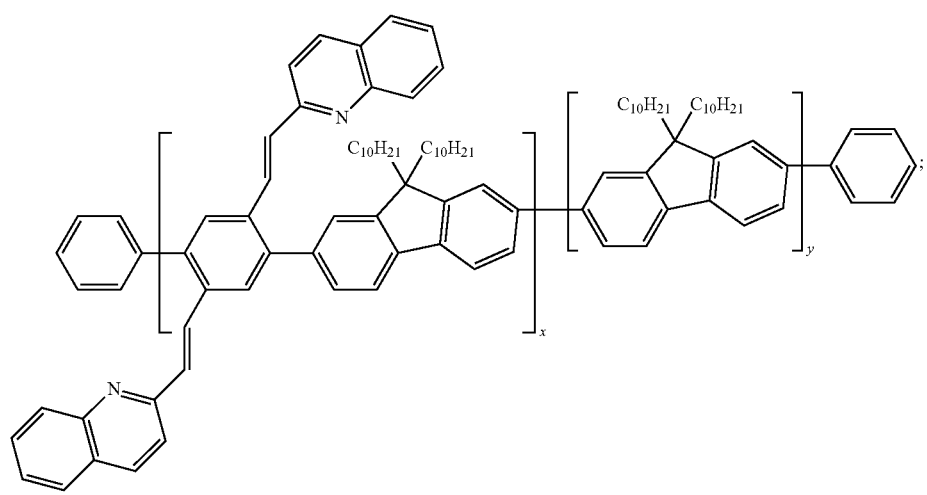
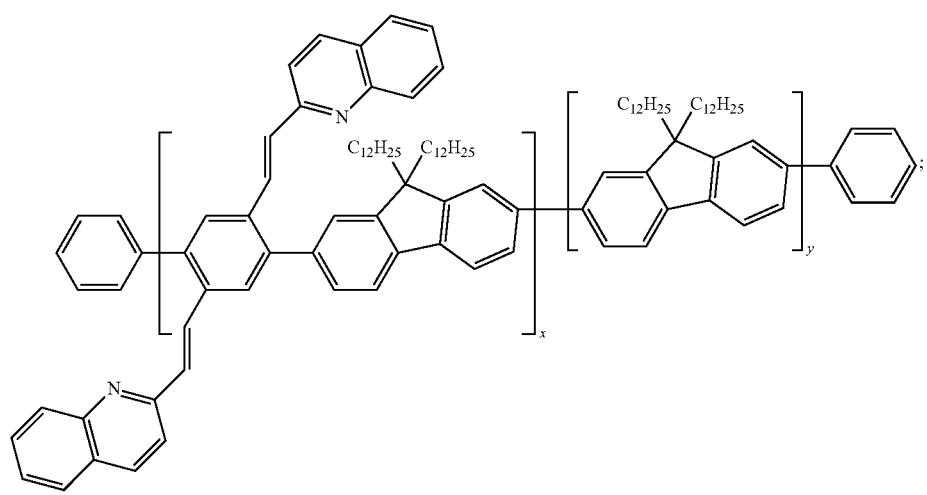

-continued
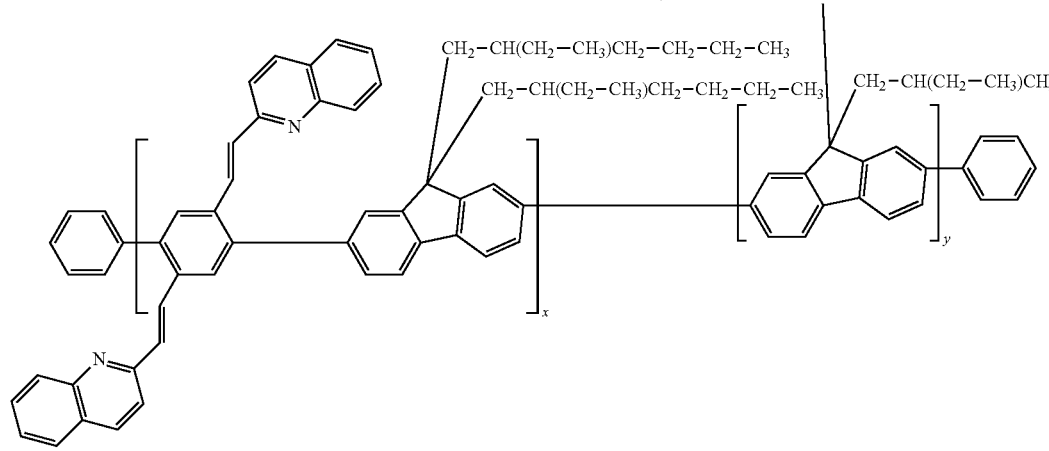
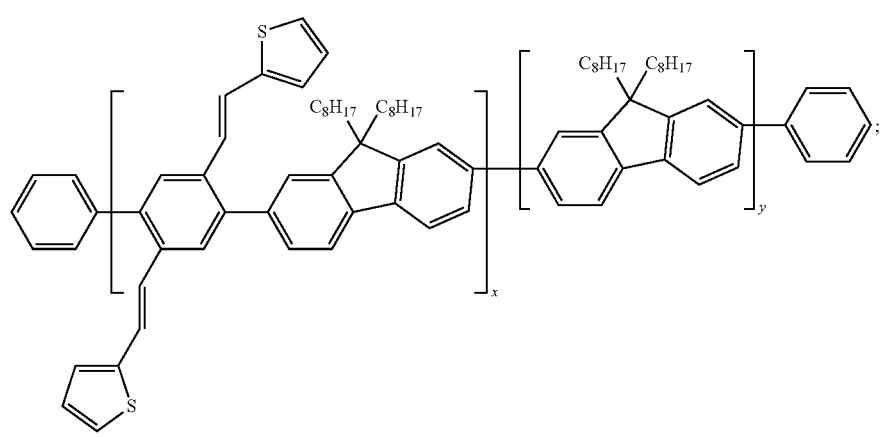
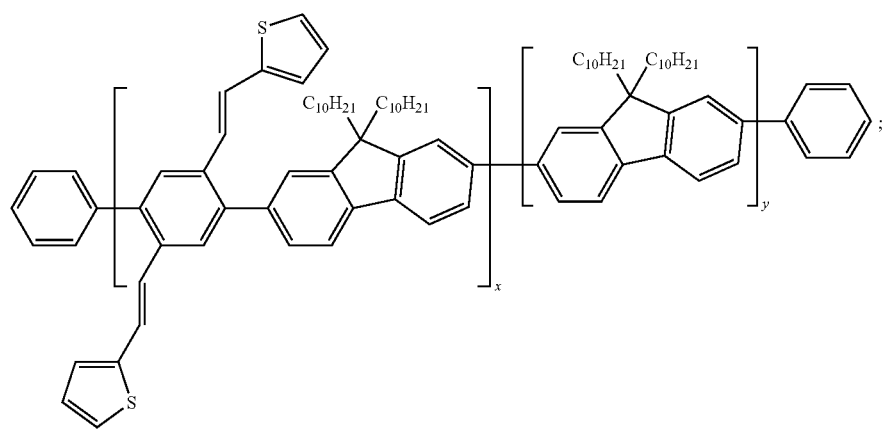

-continued

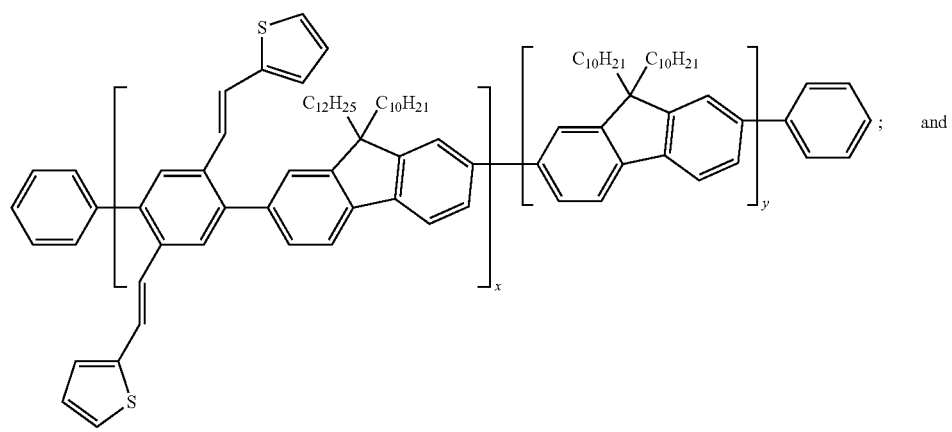

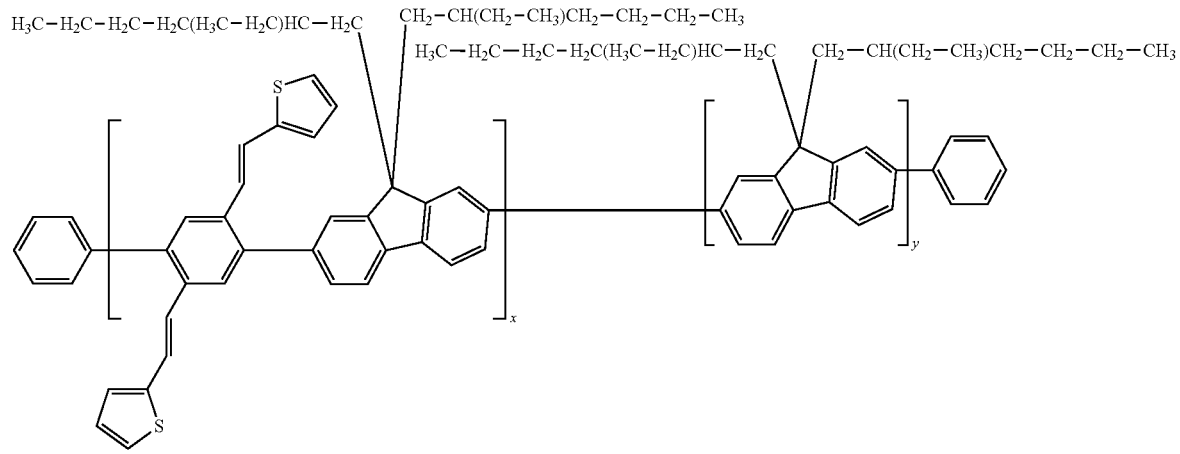

wherein x and y are integers independently ranging from 1 to 10,000.

A conjugated polymer or oligomer of a light emitting polymeric or oligomeric phase comprising repeating units A, B and C can be a conjugated polymer or oligomer of Formula (IV):

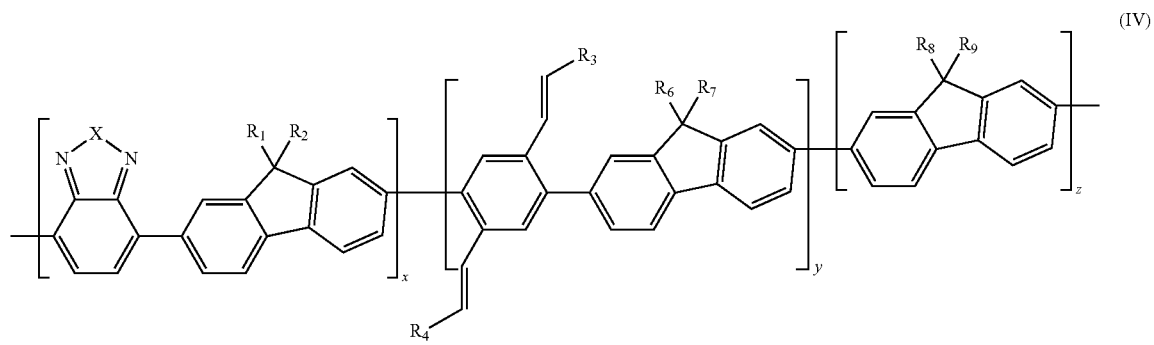

wherein X, $R_1$, $R_2$, $R_3$, $R_4$, $R_6$, $R_7$, $R_8$ and $R_9$ are defined above and x, y and z are integers independently ranging from 1 to 10,000. As described herein, repeating units A, B and C of a conjugated polymer or oligomer of Formula (IV) can be arranged to provide an alternating copolymer, a block copolymer, statistical copolymer or a random copolymer.

In some embodiments, a conjugated polymer or oligomer of Formula (IV) has a weight average molecular weight ($M_w$) ranging from about 1,000 to about 1,000,000. A conjugated polymer or oligomer of Formula (IV) can have a number average molecular weight ($M_n$) ranging from about 500 to about 500,000.

In some embodiments, a conjugated polymer or oligomer of Formula (IV) described herein is selected from the group consisting of:
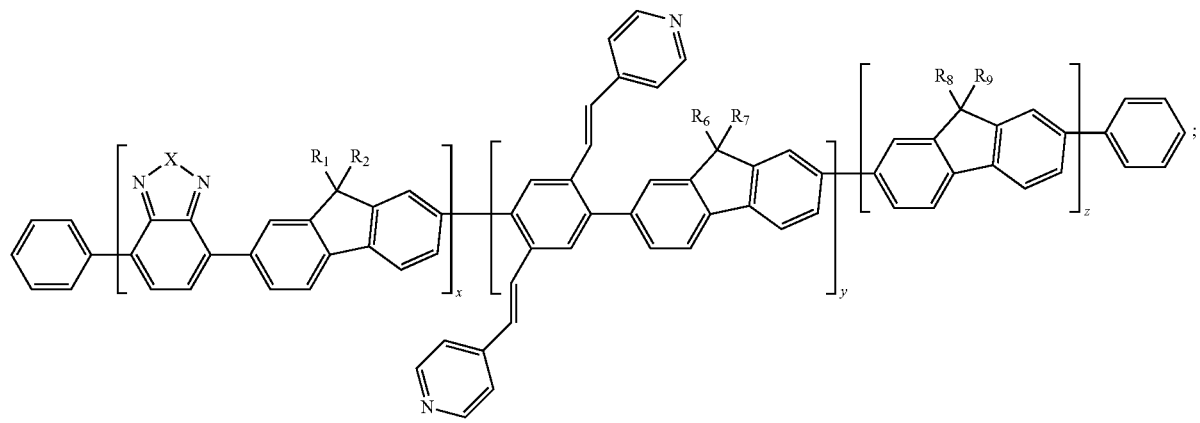
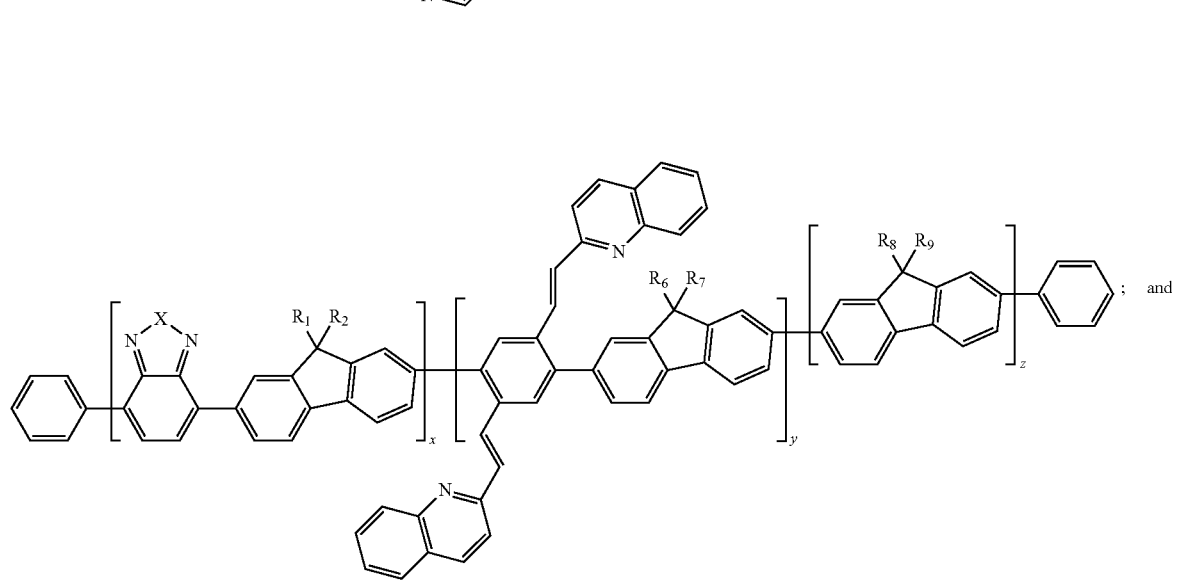
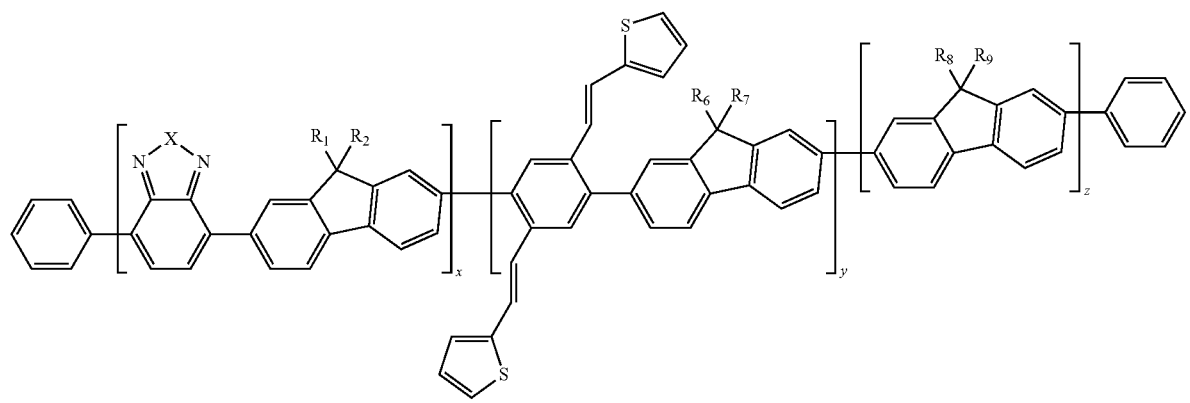
wherein X, $R_1$, $R_2$, $R_6$, $R_7$, $R_8$ and $R_9$ are defined above and x, y and z are integers independently ranging from 1 to 10,000.

For example, a conjugated polymer or oligomer of Formula (IV) described herein can be selected from the group consisting of:
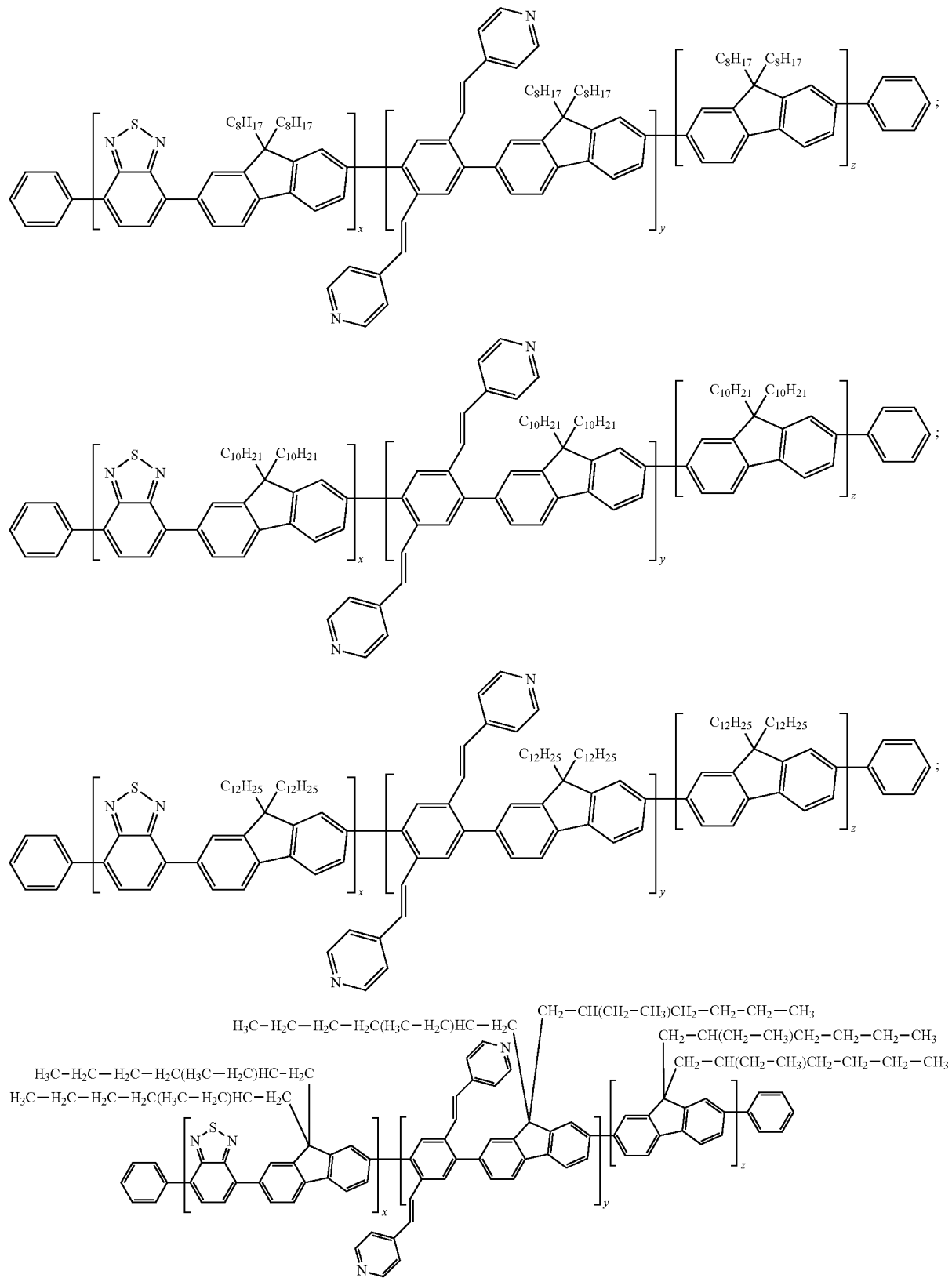

-continued
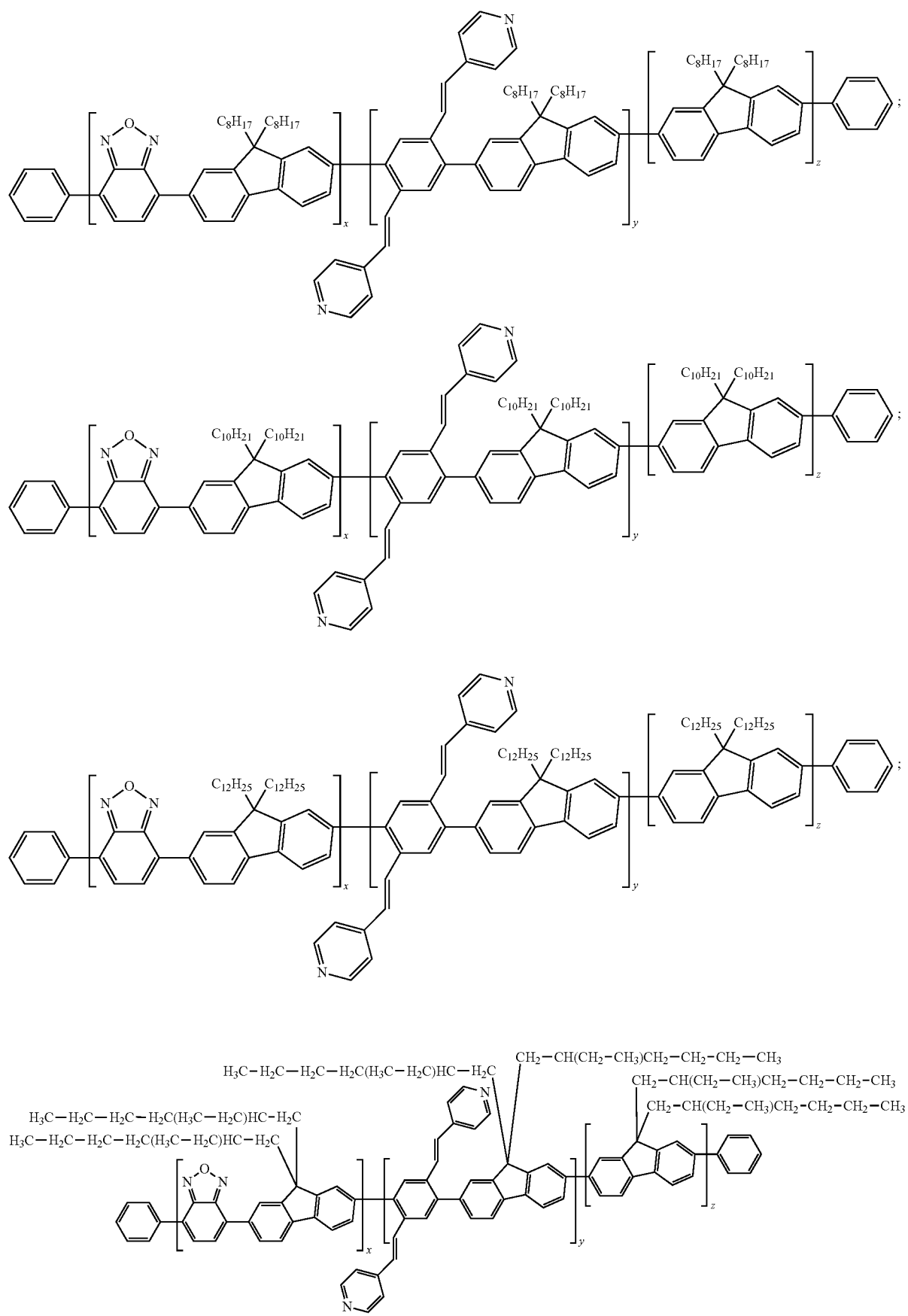

-continued
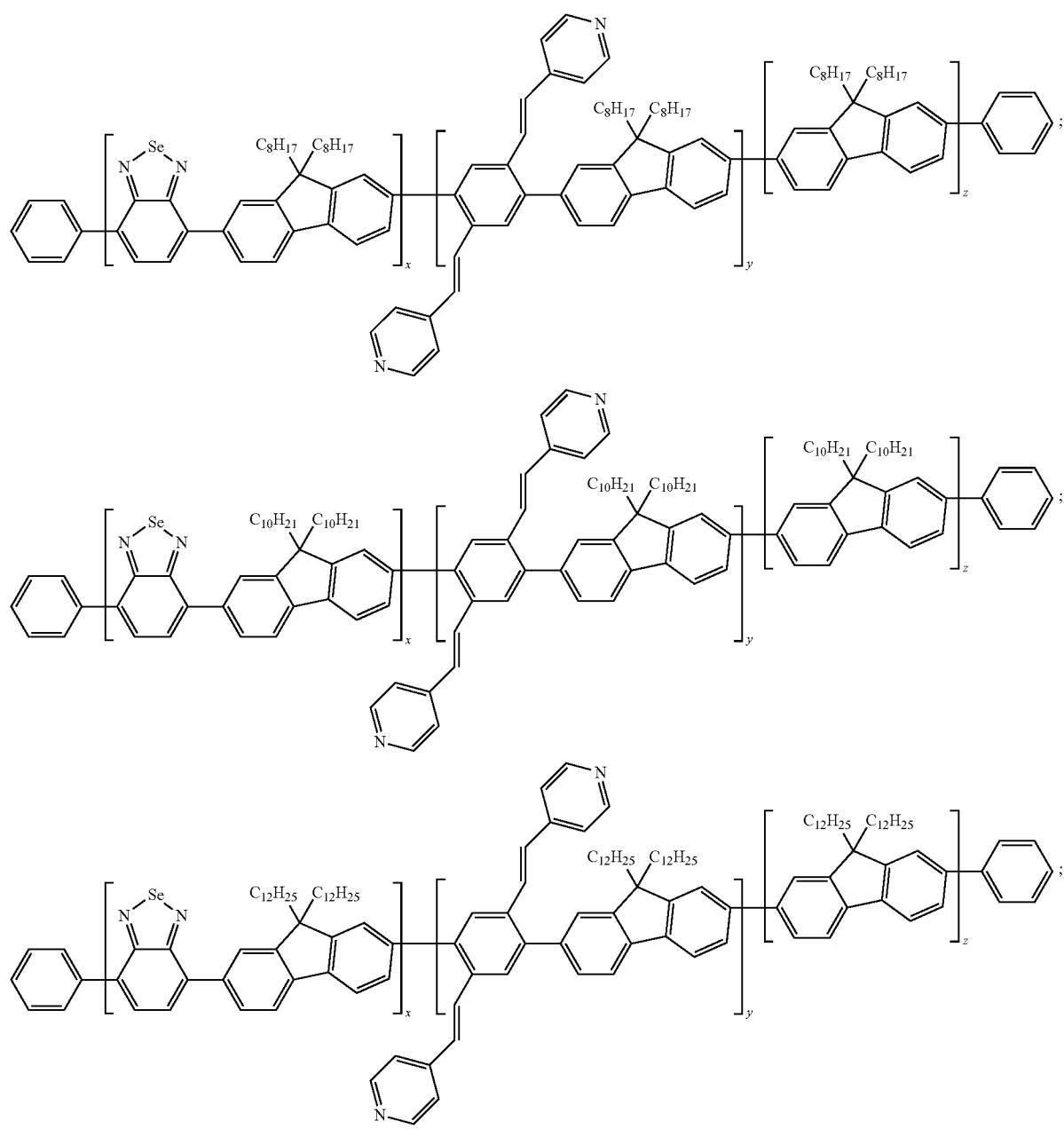
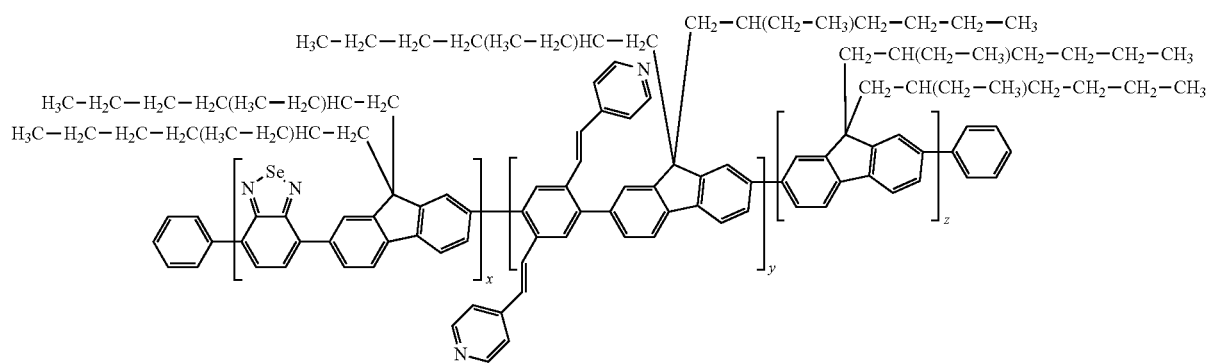

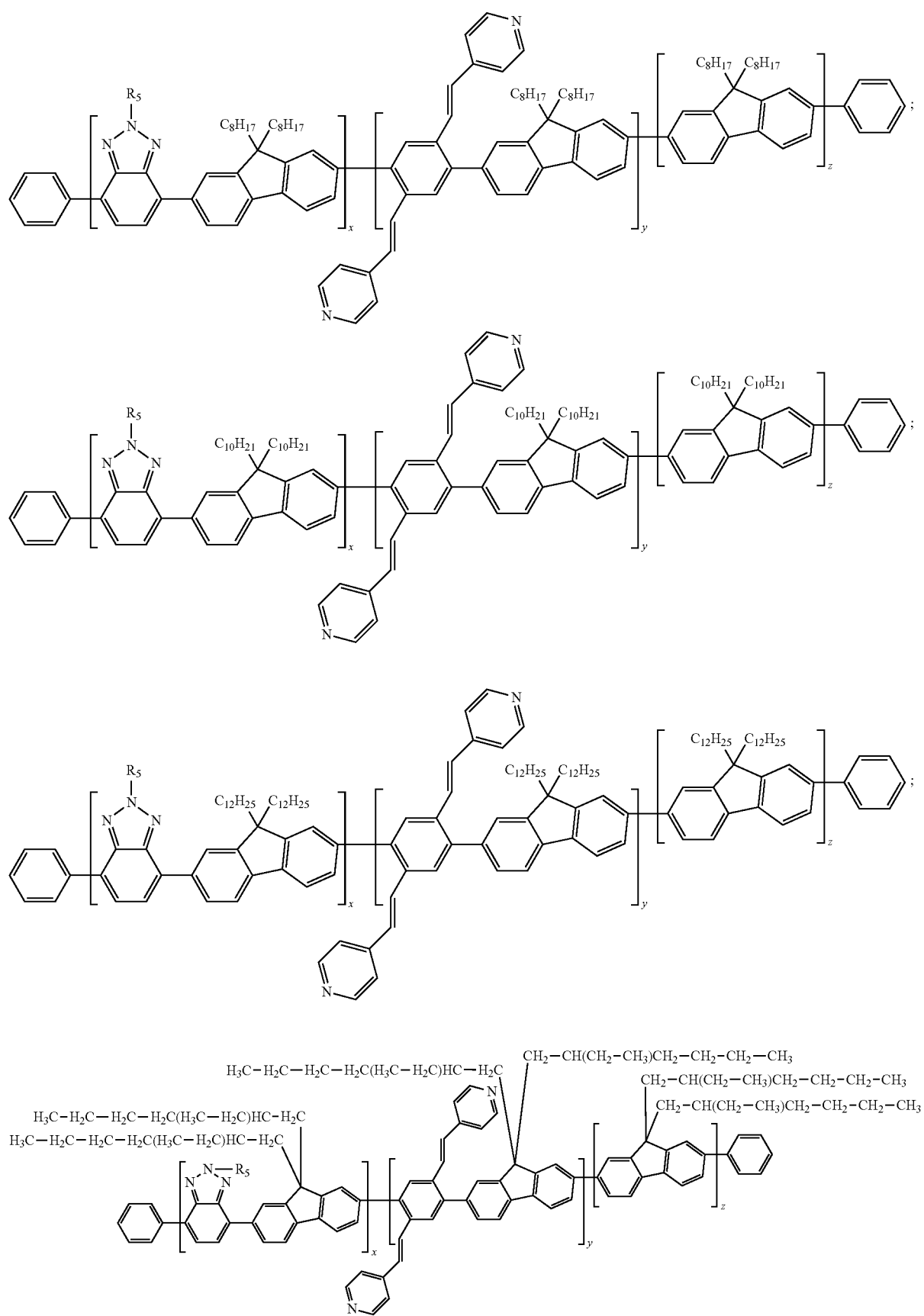

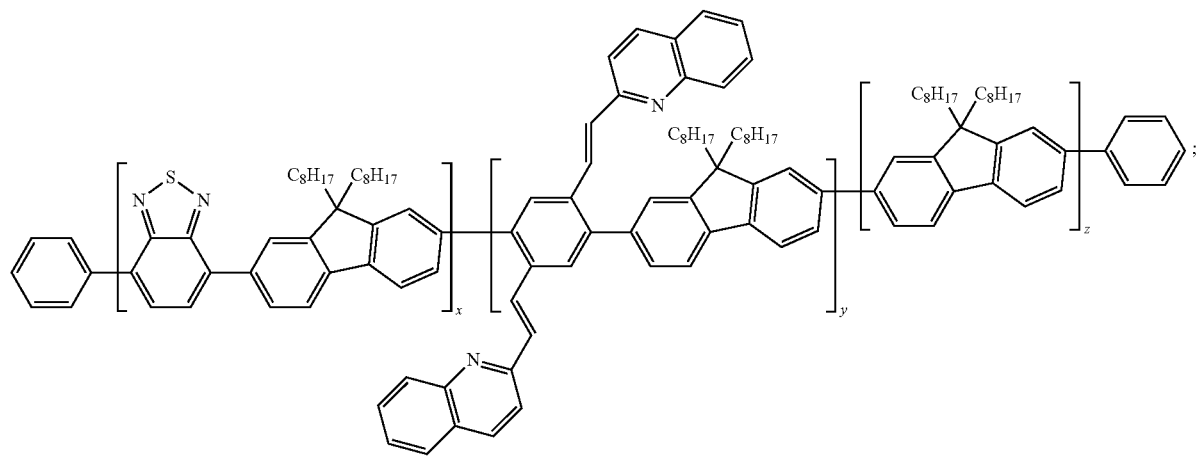
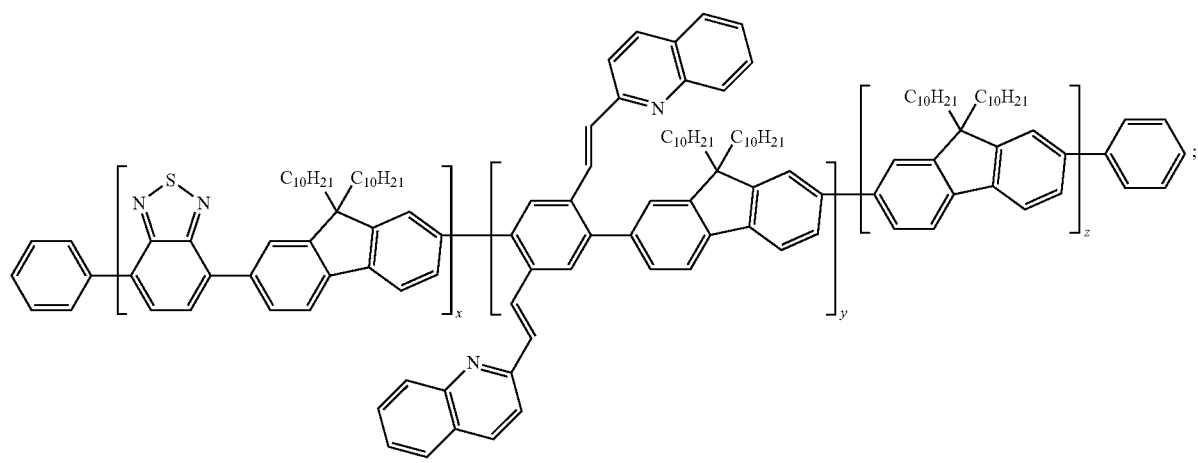
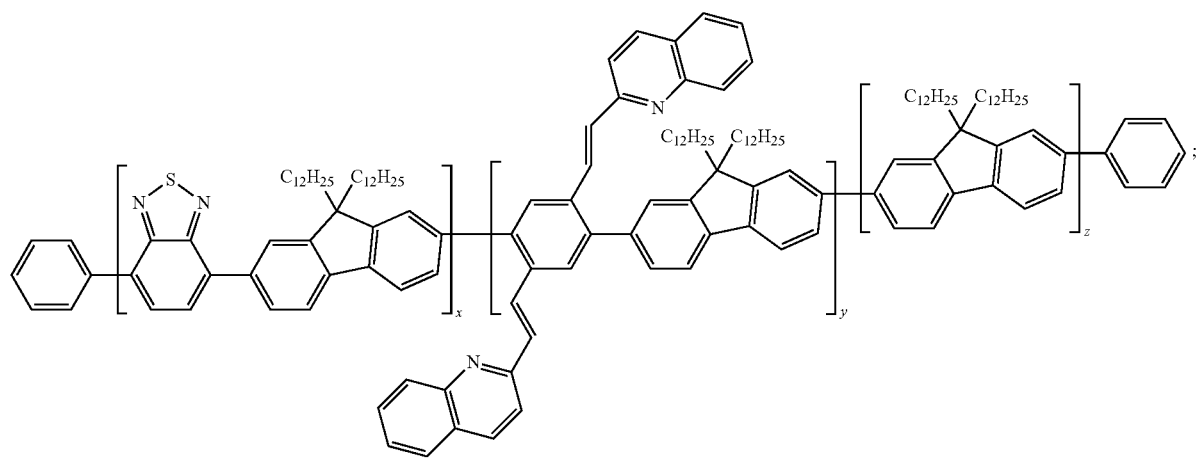

-continued
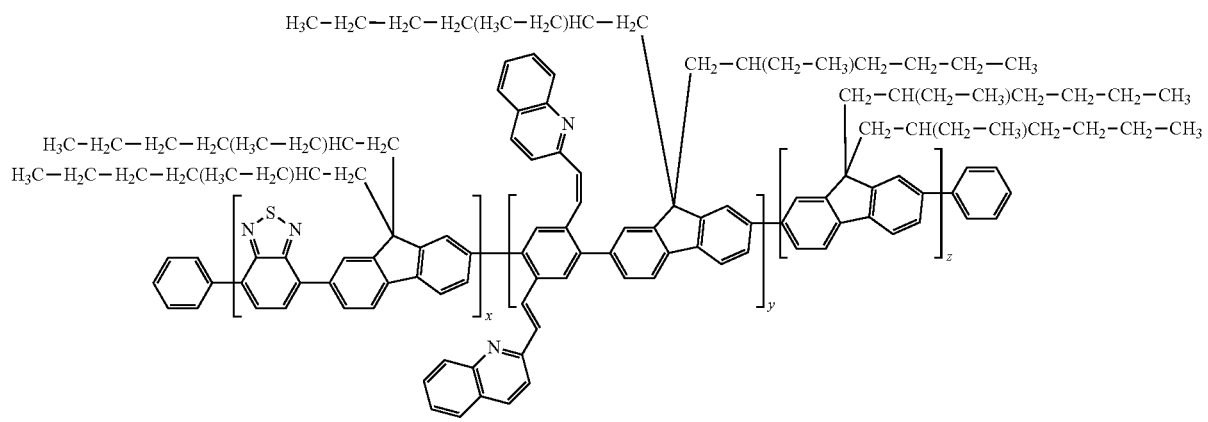
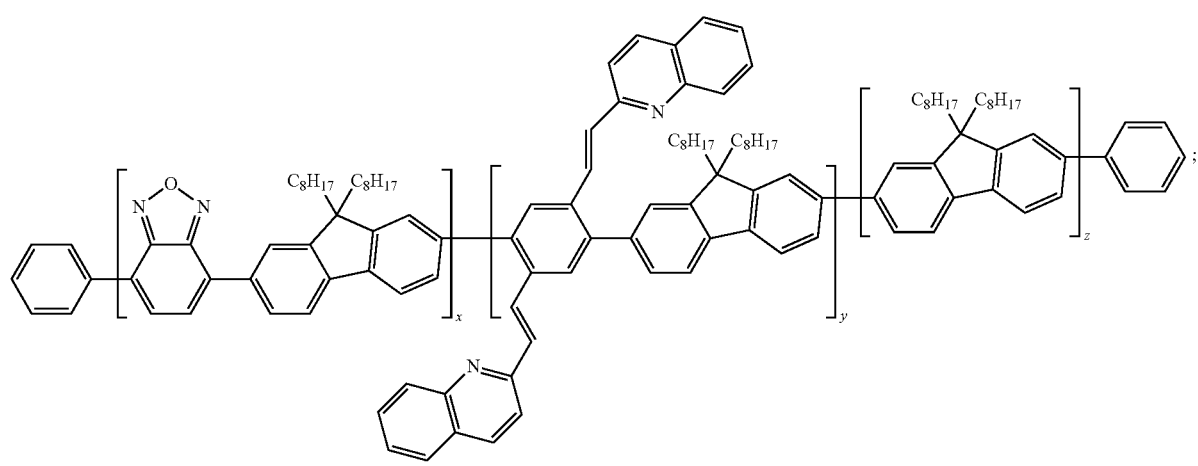
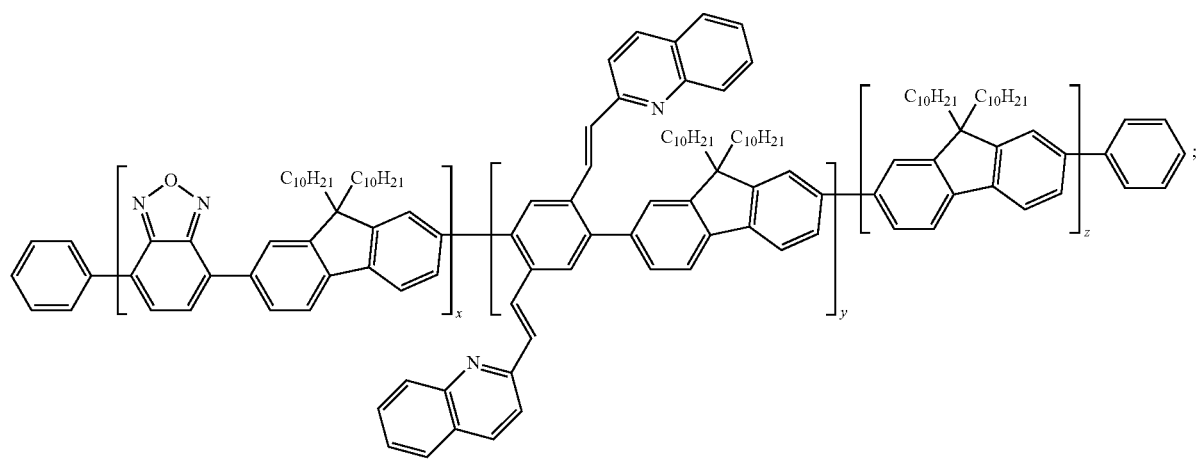

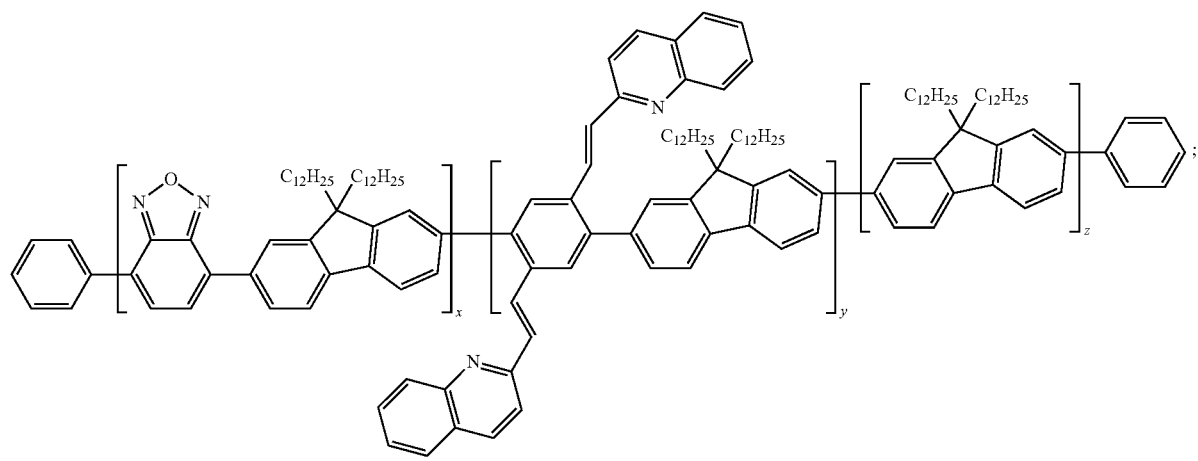
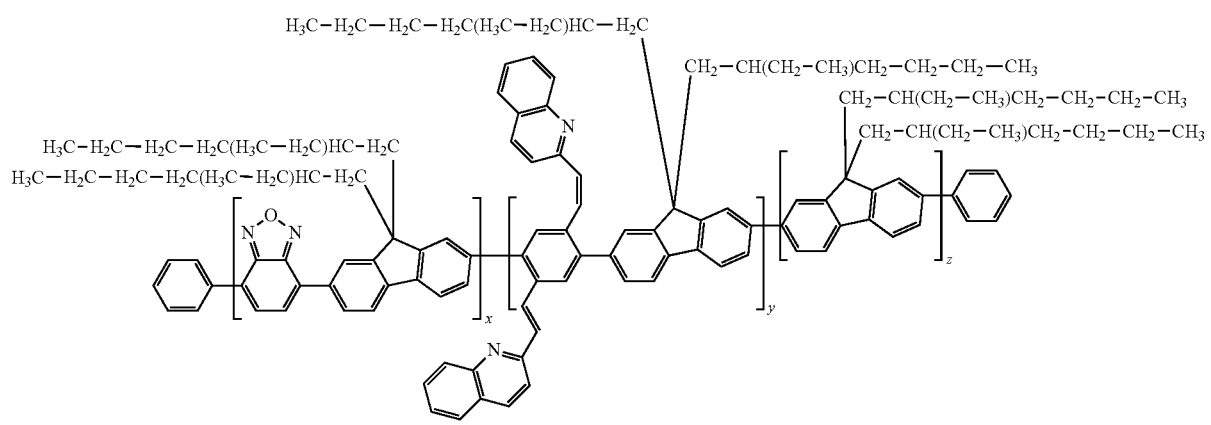
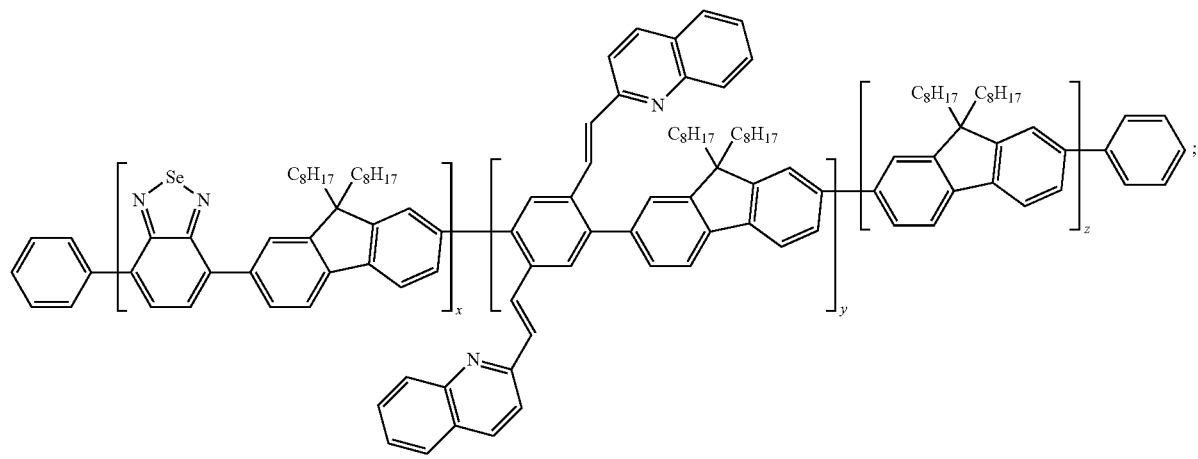

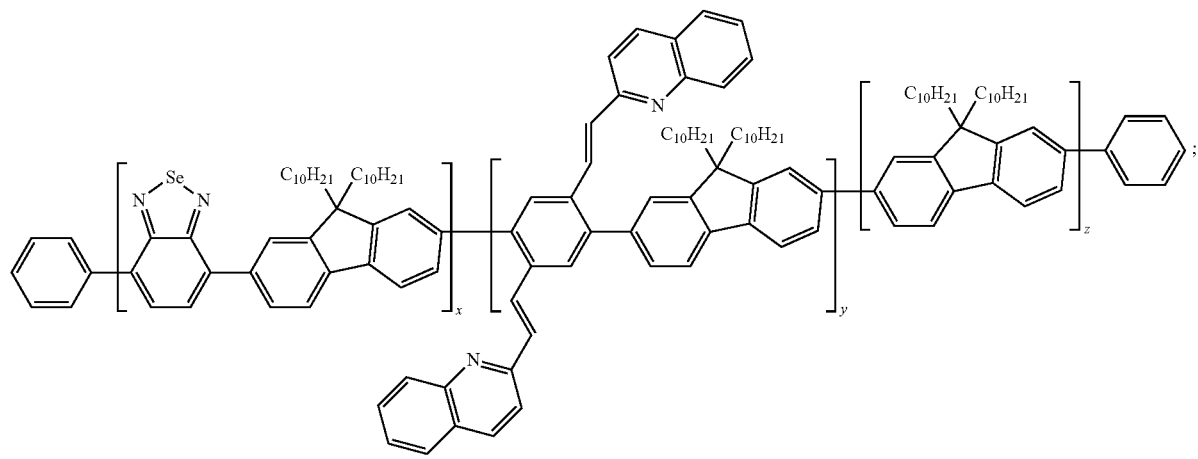
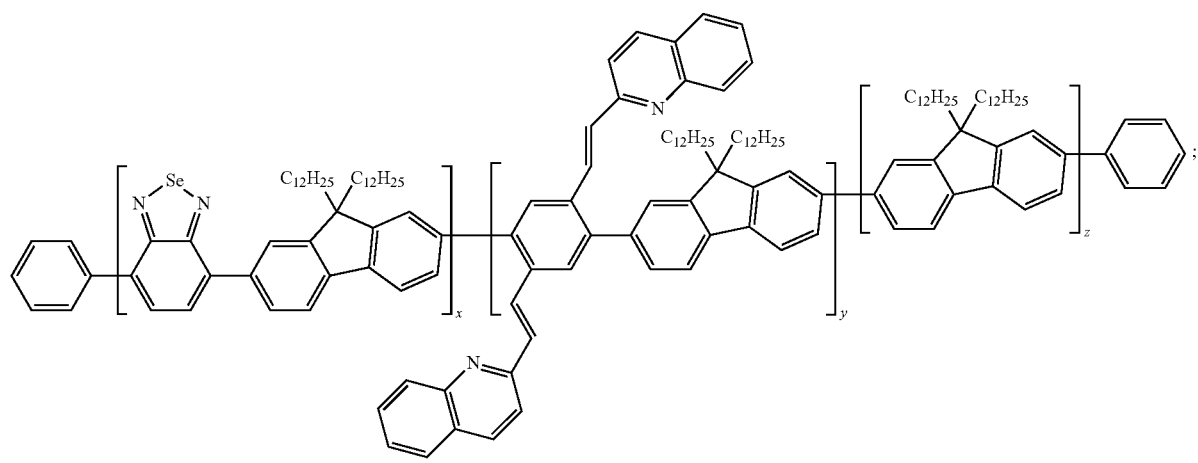
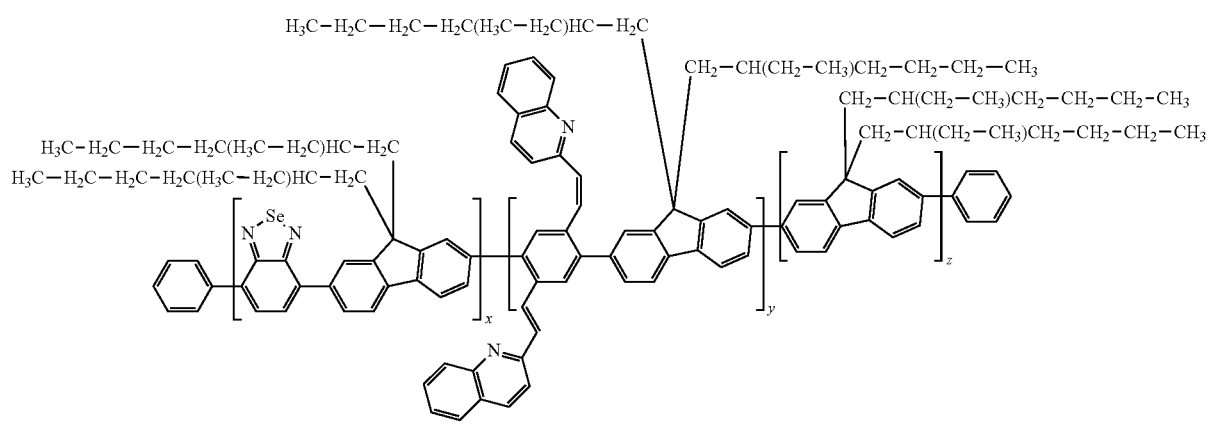

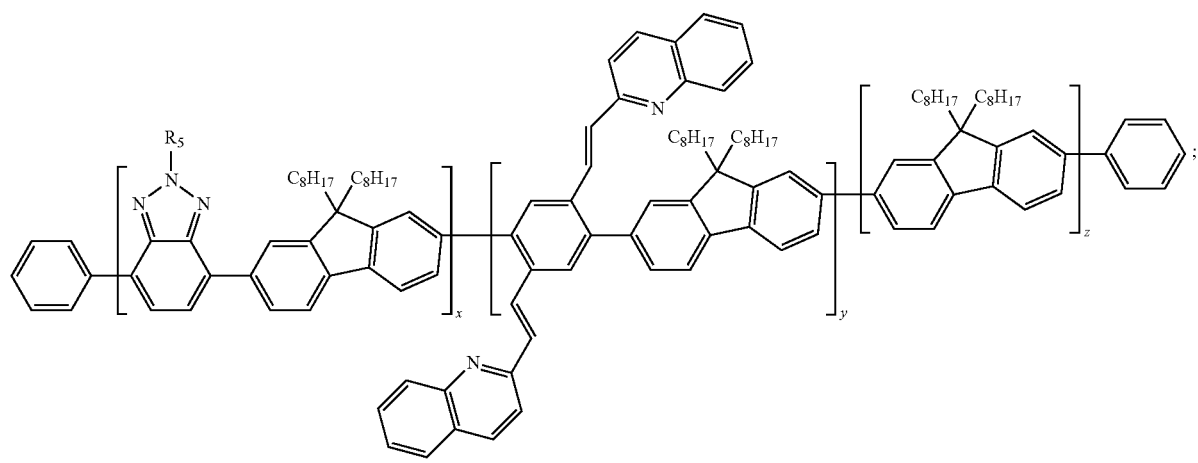
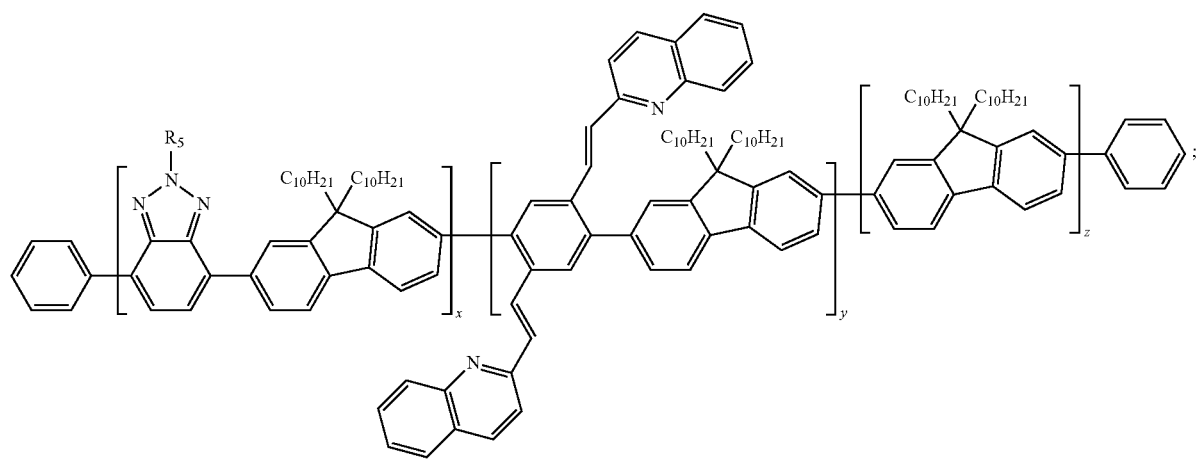
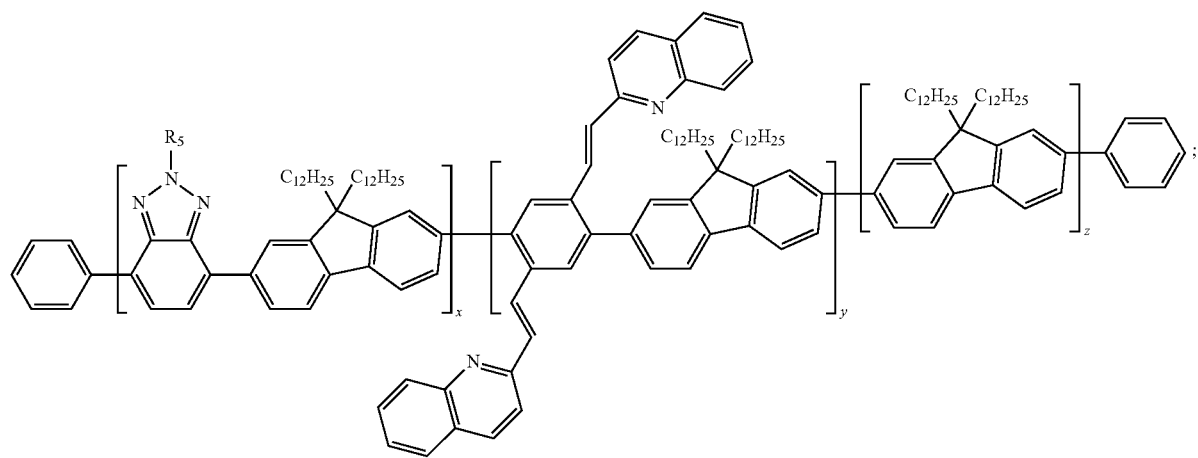

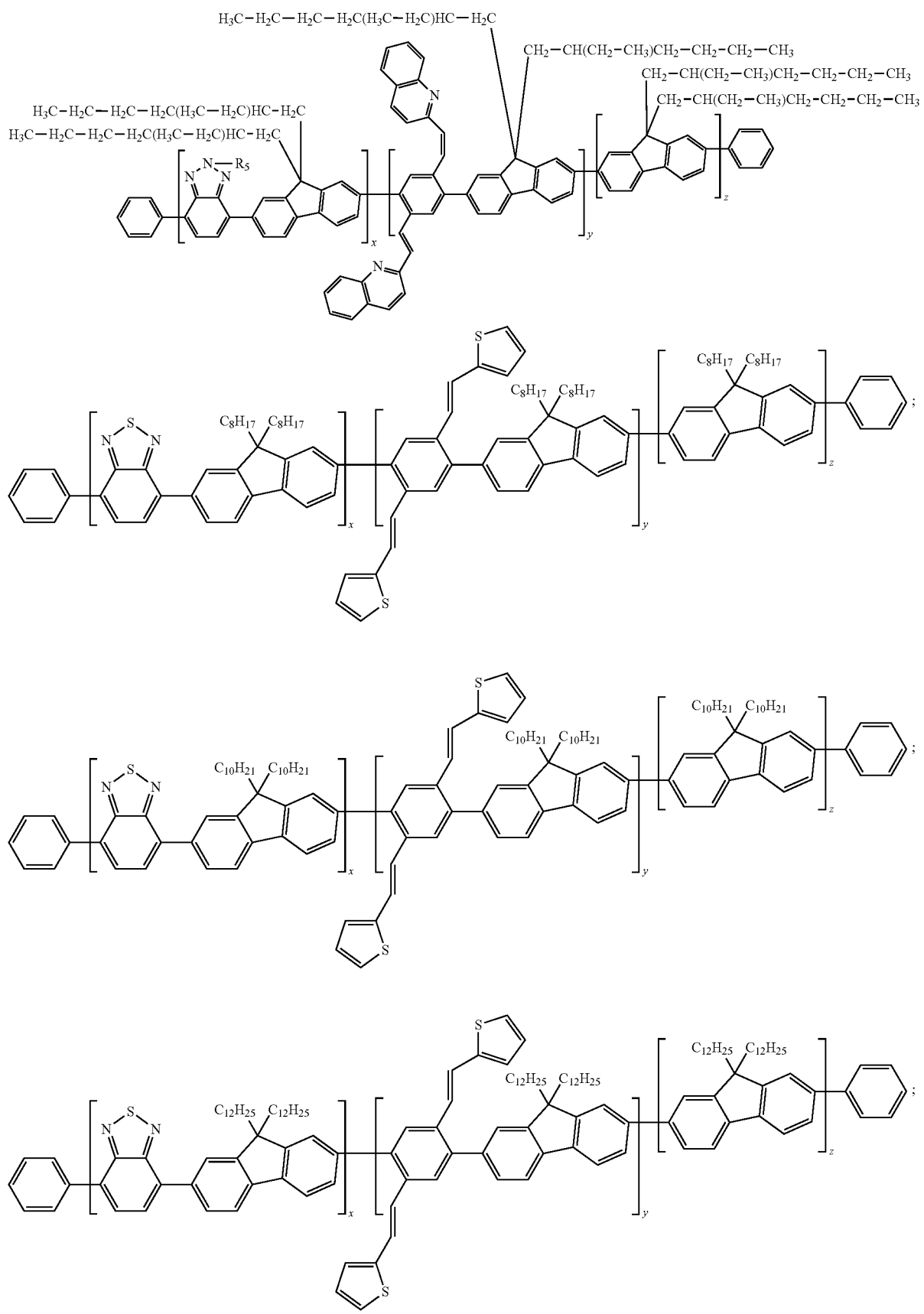

-continued
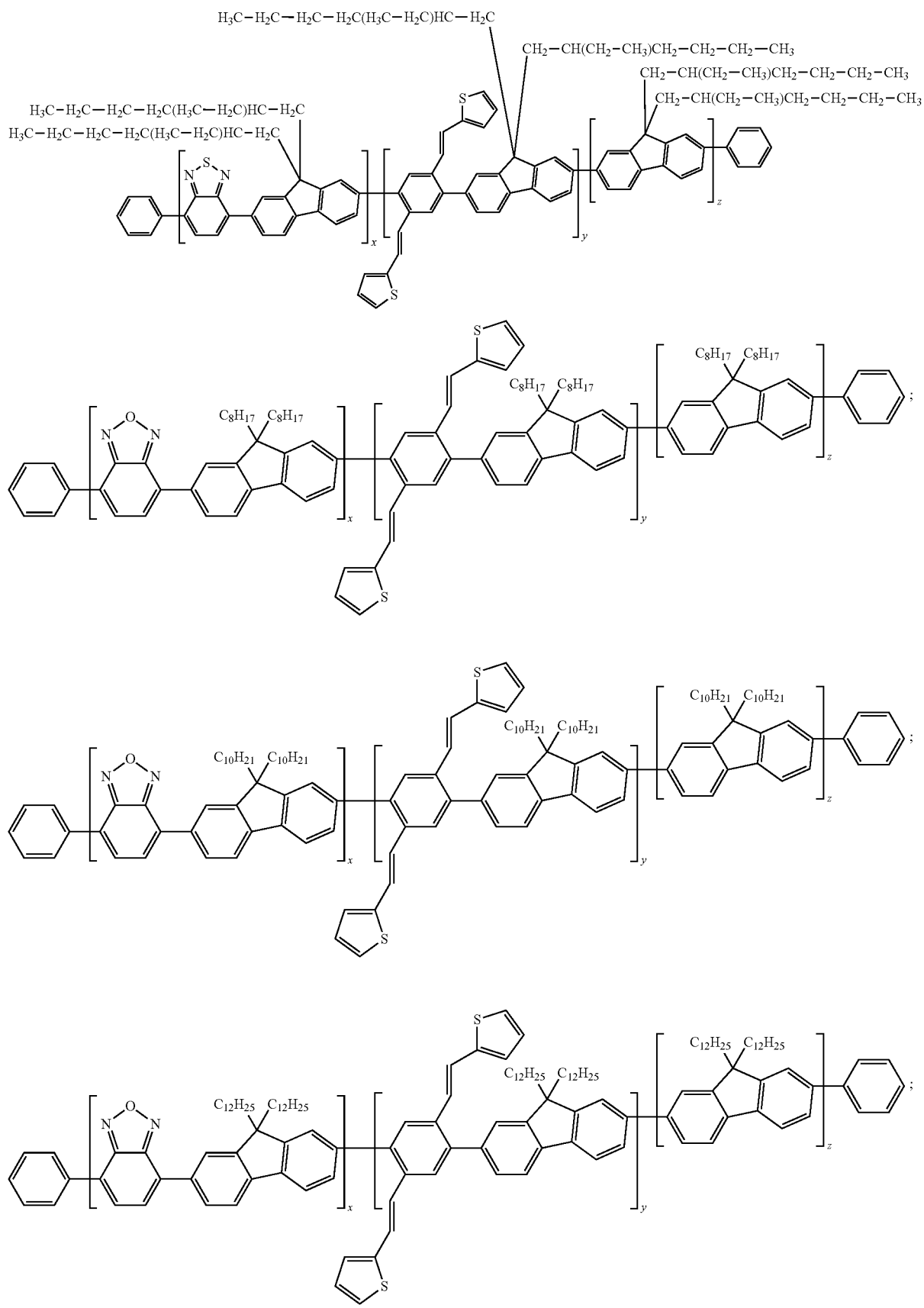

-continued
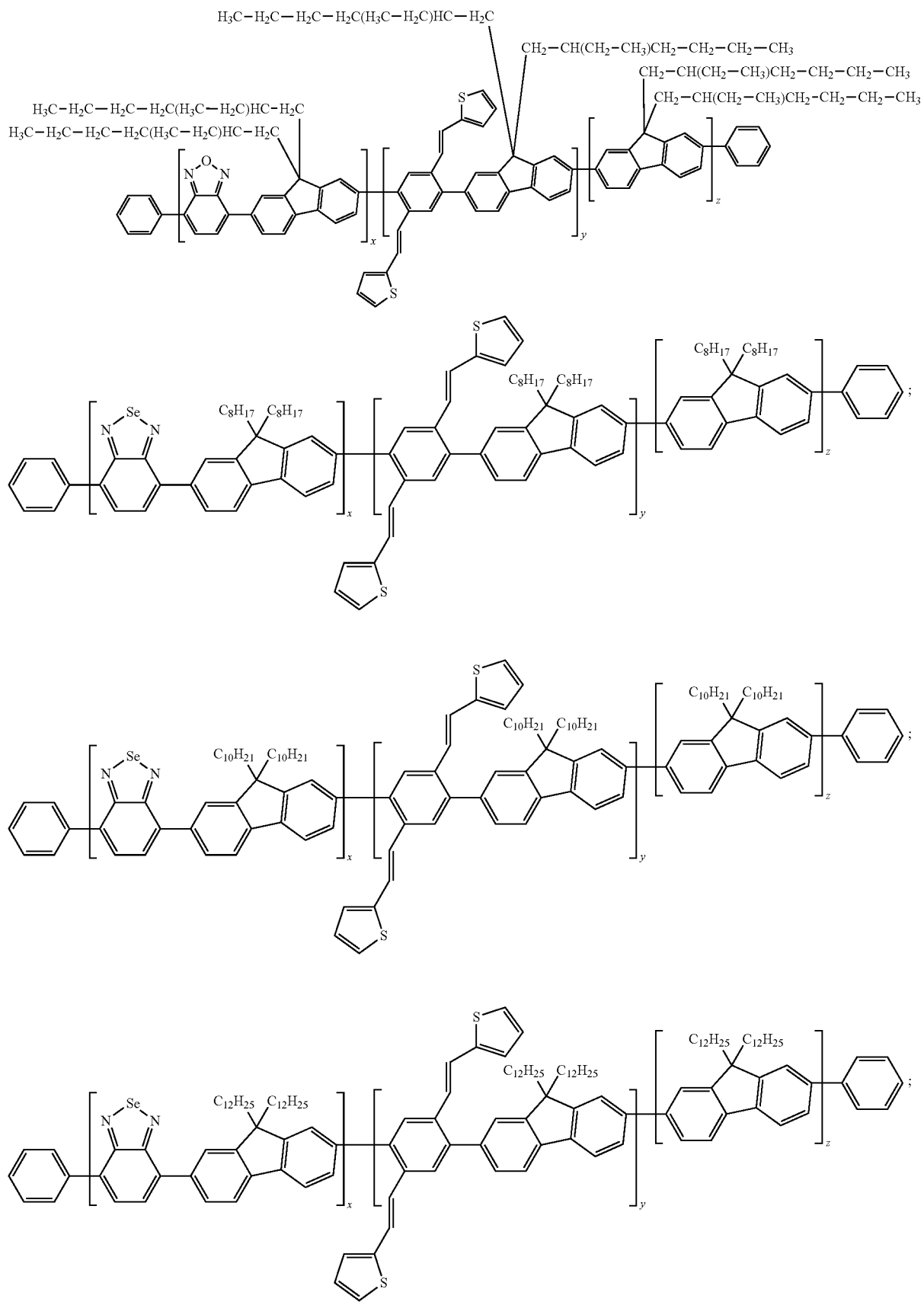

-continued
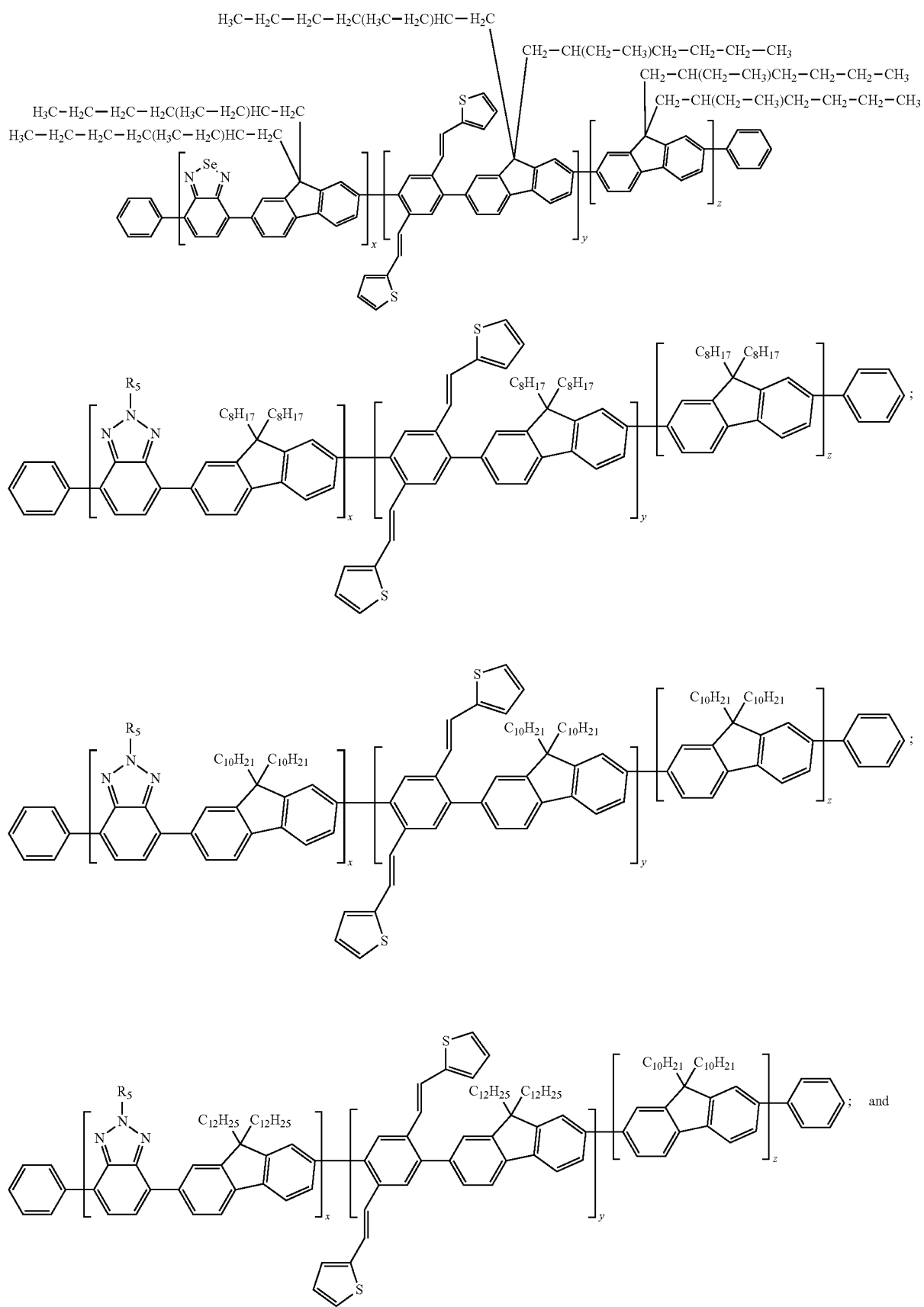

-continued

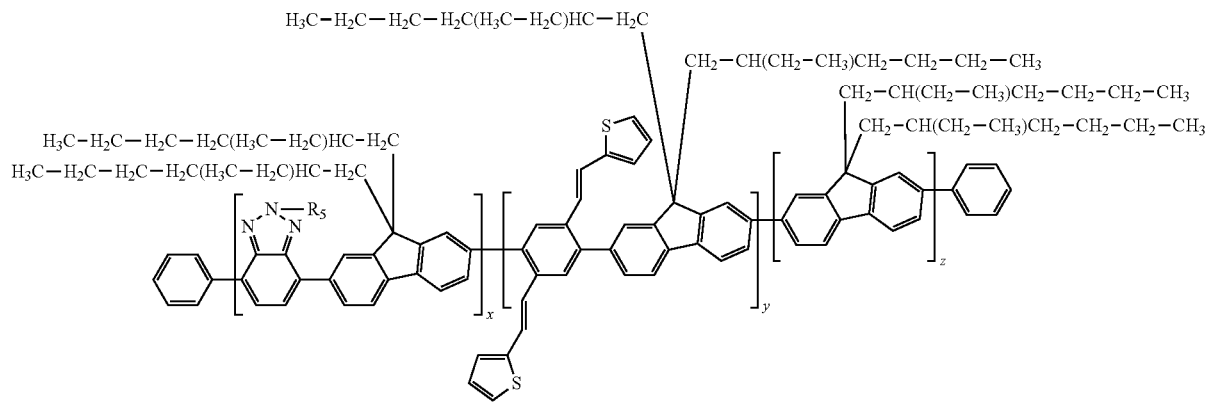

wherein $R_5$ is defined hereinabove and x, y and z are integers independently ranging from 1 to 10,000.

Conjugated polymer or oligomer of the light emitting polymeric or oligomeric phase comprising at least two repeating units selected from the group consisting of repeating units A, B, and C described herein can be synthesized using methods known in the art. For example, in some embodiments, a such conjugated polymer or oligomer can be provided using Suzuki coupling. Additional information regarding conjugated polymers and/or oligomers comprising at least two repeating units selected from the group consisting of repeating units A, B and C described herein is provided in Patent Cooperation Treaty Application Publication WO2012/009344 (PCT Application No. PCT/US2011/043690, filed on Jul. 12, 2011), which is hereby incorporated by reference in its entirety.

Moreover, conjugated polymer or oligomer of the light emitting polymeric or oligomeric phase can comprise one or more species of polyfluorenes, polyflouorene copolymers and/or derivatives thereof. In some embodiments, a conjugated polymer or oligomer of the polymeric or oligomeric phase is selected from the group consisting of poly(9,9-di-n-octylfluorenyl-2,7-diyl), poly[(9,9-di-n-octylfluorenyl-2,7-diyl)-alt-(benzo[2,1,3]thiadiazol-4,8-diyl)], poly(9,9-di-n-dodecylfluorenyl-2,7-diyl), poly(9,9-di-n-hexylfluorenyl-2,7-diyl), poly(9,9-di-n-octylfluorenyl-2,7-diyl), poly(9,9-n-dihexyl-2,7-fluorene-alt-9-phenyl-3,6-carbazole), poly[(9,9-dihexylfluoren-2,7-diyl)-alt-(2,5-dimethyl-1,4-phenylene)], poly[(9,9-dihexylfluoren-2,7-diyl)-co-(9-ethylcarbazol-2,7-diyl)], poly[(9,9-dihexylfluoren-2,7-diyl)-co-(anthracen-9,10-diyl)], poly[(9,9-dioctylfluorenyl-2,7-diyl)-co-bithiophene], poly[9,9-bis-(2-ethylhexyl)-9H-fluorene-2,7-diyl], poly((9,9-dihexyl-9H-fluorene-2,7-vinylene)-co-(1-methoxy-4-(2-ethylhexyloxy)-2,5-phenylenevinylene)) (e.g., 90:10 or 95:5 mole ratio), poly(9,9-di-(2-ethylhexyl)-9H-fluorene-2,7-vinylene), poly(9,9-di-n-hexylfluorenyl-2,7-vinylene), poly[(9,9-di-(2-ethylhexyl)-9H-fluorene-2,7-vinylene)-co-(1-methoxy-4-(2-ethylhexyloxy)-2,5-phenylenevinylene)] (e.g., 90:10 or 95:5 mole ratio) and mixtures thereof.

Additionally, a conjugated polymeric or oligomeric phase of an organic light emitting layer described herein can comprise a polymer or oligomer including a structural unit of Formula (V):

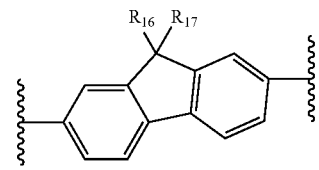

(V)

wherein $\xi$ represents points of attachment in the polymer or oligomer chain and $R_{16}$ and $R_{17}$ are independently selected from the group consisting of hydrogen, $C_{1-20}$ alkyl, $C_{2-20}$ alkenyl, $C_{8-12}$ alkyl and $C_{8-12}$ alkenyl and wherein the alkyl and alkenyl of $R_{16}$ and $R_{17}$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

Further, a conjugated polymeric or oligomeric phase of an electroluminescent device described herein can comprise one or more species of poly(phenyl vinylene)s, poly(phenyl vinylene) copolymers and/or derivatives thereof. In some embodiments, a conjugated polymeric or oligomeric phase comprises a species selected from the group consisting of poly[2-methoxy-5-(2-ethylhexyloxy)-1,4-phenylenevinylene], poly(1-methoxy-4-(3-propyloxy-heptaisobutyl-PSS)-2,5-phenylenevinylene)-co-(1-methoxy-4-(2-ethylhexyloxy)-2,5-phenylenevinylene) (60:40), poly(1-methoxy-4-(O-disperse Red 1))-2,5-phenylenevinylene, poly(2,5-bis(1,4,7,10-tetraoxaundecyl)-1,4-phenylenevinylene), poly(2,5-dioctyl-1,4-phenylenevinylene), poly[(m-phenylenevinylene)-alt-(2,5-dihexyloxy-p-phenylenevinylene)], poly[(m-phenylenevinylene)-alt-(2-methoxy-5-(2-ethylhexyloxy)-p-phenylenevinylene)], poly[(m-phenylenevinylene)-co-(2,5-dioctoxy-p-phenylenevinylene)], poly[(o-phenylenevinylene)-alt-(2-methoxy-5-(2-ethylhexyloxy)-p-phenylenevinylene)], poly[(p-phenylenevinylene)-alt-(2-methoxy-5-(2-ethylhexyloxy)-p-phenylenevinylene)], poly[1-methoxy-4-(3-propyloxy-heptaisobutyl-PSS)-2,5-phenylenevinylene], poly[1-methoxy-4-(3-propyloxy-heptaisobutyl-PSS)-2,5-phenylenevinylene]-co-[1-methoxy-4-(2-ethylhexyloxy)-2,5-phenylenevinylene] (30:70), poly[2,5-bisoctyloxy)-1,4-phenylenevinylene], poly[2,5-bis(3',7'-dimethyloctyloxy)-1,4-phenylenevinylene], poly[2-(2',5'-bis(2''-ethylhexyloxy)phenyl)-1,4-phenylenevinylene], poly[2-methoxy-5-(2-ethylhexyloxy)-1,4-phenylenevinylene], poly[2-methoxy-5-

(3',7'-dimethyloctyloxy)-1,4-phenylenevinylene], poly[5-methoxy-2-(3-sulfopropoxy)-1,4-phenylenevinylene], poly[tris(2,5-bis(hexyloxy)-1,4-phenylenevinylene)-alt-(1,3-phenylenevinylene)], poly{[2-[2',5'-bis(2''-ethylhexyloxy)phenyl]-1,4-phenylenevinylene]-co-[2-methoxy-5-(2'-ethylhexyloxy)-1,4-phenylenevinylene]}, and mixtures thereof.

Conjugated polymer or oligomer of the light emitting polymeric or oligomeric phase can comprise one or more species of poly(naphthalene vinylene)s, poly(naphthalene vinylene) copolymers and/or derivatives thereof. In some embodiments, conjugated polymer or oligomer of the light emitting polymer or oligomer phase comprises one or more species of cyano-poly(phenylene vinylene)s, cyano-poly(phenylene vinylene) copolymers and/or derivatives thereof. In some embodiments, a conjugated polymer or oligomer of the light emitting polymeric or oligomeric phase comprises one or more species of poly(fluorenylene ethynylene)s, poly(fluorenylene ethynylene) copolymers and/or derivatives thereof. In some embodiments, a conjugated polymer or oligomer of the light emitting polymeric or oligomeric phase comprises one or more species of poly(phenylene ethynylene)s, poly(phenylene ethynylene) copolymers and/or derivatives thereof. In some embodiments, a conjugated polymer or oligomer of the light emitting polymeric or oligomeric phase comprises one or more species of polythiophenes, polythiophene copolymers and/or derivatives thereof.

Conjugated polymer or oligomer of the light emitting polymeric or oligomeric phase can comprise a species selected from the group consisting of poly(2,5-di(3,7-dimethyloctyloxy)cyanoterephthalylidene), poly(2,5-di(hexyloxy)cyanoterephthalylidene), poly(5-(2-ethylhexyloxy)-2-methoxy-cyanoterephthalylidene), poly(5-(3,7-dimethyloctyloxy)-2-methoxy-cyanoterephthalylidene), poly(9,9-dioctylfluorenyl-2,7-yleneethynylene), poly(9,9-didodecylfluroenyl-2,7-yleneethylnylene), poly[9,9-di(2'-ethylhexyl)fluoren-2,7-yleneethynylene], poly[9,9-di(3',7'-dimethyloctyl)fluoren-2,7-yleneethynylene], poly(2,5-dicyclohexylphenylene-1,4-ethynylene), poly(2,5-didodecylphenylene-1,4-ethynylene), poly(2,5-dioctylphenylene-1,4-ethynylene), poly(2,5-di(2'-ethylhexyl)-1,4-ethynylene), poly(2,5-di(3',7'-dimethyloctyl)phenylene-1,4-ethynylene), poly(3-butylthiophene-2,5-diyl) (regiorandom or regioregular), poly(3-cyclohexyl-4-methylthiophene-2,5-diyl), poly(3-cyclohexylthiophene-2,5-diyl), poly(3-decyloxythiophene-2,5-diyl), poly(3-decylthiophene-2,5-diyl) (regiorandom or regioregular), poly(3-dodecylthiophene-2,5-diyl) (regiorandom or regioregular), poly(3-hexylthiophene-2,5-diyl) (regiorandom or regioregular), poly(3-octylthiophene-2,5-diyl) (regiorandom or regioregular), poly(3-octylthiophene-2,5-diyl-co-3-decyloxythiophene-2,5-diyl), poly(thiophene-2,5-diyl), poly[(2,5-didecyloxy-1,4-phenylene)-alt-(2,5-thienylene)], poly(2,6-naphthalenevinylene), poly(p-xylene tetrahydrothiophenium chloride), poly(2,5 pyridine), poly(3,5 pyridine), poly(2,5-bis(3-sulfonatopropoxy)-1,4-phenylene, disodium salt-alt-1,4-phenylene), poly[(2,5-bis(2-(N,N-diethylammonium bromide)ethoxy)-1,4-phenylene)-alt-1,4-phenylene], poly[5-methoxy-2-(3-sulfopropoxy)-1,4-phenylenevinylene] potassium salt, poly {[2,5-bis(2-(N,N-diethylamino)ethoxy)-1,4-phenylene]-alt-1,4-phenylene} and mixtures thereof.

(ii) An organic light emitting layer of an electroluminescent device described herein can comprise a non-conjugated light emitting polymer or oligomer, a fluorescent small molecule, or a mixture thereof. In some embodiments, a light emitting organic layer comprises a polyvinyl carbazole (PVK). Suitable fluorescent small molecules can comprise a metal chelate species, a fluorescent dye, a conjugated dendrimer or mixtures or combinations thereof. In some embodiments, a fluorescent small molecule is one or more of perylene, rubrene, quinacridone and mixtures, combinations and/or derivatives thereof. A fluorescent small molecule, in some embodiments, comprises anthracene or related compounds or a coumarin. In some embodiments, a fluorescent small molecule comprises tris(8-hydroxyquinoline) aluminum ($Alq_3$).

(iii) An organic light emitting layer of an electroluminescent device described herein can comprise a nanoparticle phase in addition to the light emitting phases described in Sections I(B)1(i)-(ii) above. In some embodiments, the nanoparticle phase is dispersed throughout the organic light emitting layer. For example, in some embodiments, nanoparticles are dispersed substantially uniformly throughout the organic light emitting layer. In other embodiments, the nanoparticle phase is heterogeneously distributed in the organic light emitting layer. Nanoparticles of the nanoparticle phase can be in direct contact with the light emitting species of the organic light emitting layer including polymer, oligomer, small molecule or combinations thereof. For example, in some embodiments, nanoparticles of the nanoparticle phase coated and/or not dispersed in the organic light emitting layer by any secondary polymer or oligomer or dispersing agent.

In some embodiments, nanoparticles are present in the organic light emitting layer in an amount selected from Table I.

TABLE I

Weight Percent of Nanoparticle Phase in Composite Organic Layer
Nanoparticle (wt. %)

| |
|---|
| 0.001-20 |
| 0.01-15 |
| 0.1-10 |
| 0.5-5 |
| 1-4 |
| 0.01-3 |
| 0.01-0.5 |
| 0.01-0.3 |
| 0.01-0.2 |
| 0.01-0.15 |

In some embodiments, nanoparticles are present in an organic light emitting layer in an amount below the percolation threshold.

A nanoparticle phase can comprise any nanoparticles not inconsistent with the objectives of the present invention. In some embodiments, nanoparticles of the nanoparticle phase comprise carbon nanoparticles including, but not limited to, fullerenes, carbon nanotubes, carbon quantum dots, graphene particles or mixtures thereof. Fullerenes suitable for use in the nanoparticle phase, in one embodiment, can comprise 1-(3-methoxycarbonyl)propyl-1-phenyl(6,6)$C_{61}$ (PCBM), higher order fullerenes ($C_{70}$ and higher) and endometallofullerenes (fullerenes having at least one metal atom disposed therein). Carbon nanotubes for use in the nanoparticle phase can comprise single-walled nanotubes (SWNT), multi-walled nanotubes (MWNT), cut nanotubes, nitrogen and/or boron doped carbon nanotubes or mixtures thereof.

Inorganic nanoparticles are also suitable for use in the nanoparticle phase. For example, the nanoparticle phase can include metal nanoparticles such as gold nanoparticles, silver nanoparticles, copper nanoparticles, nickel nanoparticles and/or other transition metal nanoparticles. Inorganic nanoparticles can comprise inorganic semiconductor nanoparticles such as IIB/VIA nanoparticles, IIIA/VA nanoparticles, IVA/VIA nanoparticles or mixtures thereof. Groups of the Periodic Table described herein are identified according to the CAS designation. Semiconductor nanoparticles, in some embodiments, are selected from the group consisting of PbS, PbSe, CdTe, CdS, InP, GaAs and mixtures thereof. Inorganic nanoparticles can demonstrate a variety of shapes, including wires, spheres and dots. Additionally, in some embodiments, nanoparticles of a nanoparticle phase are luminescent. The presence of luminescent nanoparticles can assist in tuning the emission profile of the light emitting organic layer. Any luminescent nanoparticles not inconsistent with the objectives of the present invention may be used. In some embodiments, luminescent nanoparticles comprise quantum dots described herein.

An organic light emitting layer can further comprise a triplet emitter phase in addition to the singlet emitting species of Sections I(B)1(i)-(ii). In some embodiments, an organic light emitting layer comprises one or more singlet emitting species of Sections I(B)1(i)-(ii), a nanoparticle phase and triplet emitter phase. A triplet emitter phase can comprise any phosphorescent compound not inconsistent with the objectives of the present invention. In some embodiments, phosphorescent compounds comprise transition metal-ligand complexes, including organometallic complexes. A transition metal complex can comprise an iridium or platinum metal center. A phosphorescent transition metal complex, in some embodiments, is tris(2-phenylpyridine) iridium [Ir(ppy)$_3$] or platinum octaethylporphine (PtOEP). In some embodiments, a triplet emitter phase comprises one or more phosphorescent transition metal complexes selected from Table II:

TABLE II

Transition Metal Complexes of Triplet Emitter Phase

[Os(bpy)$_3$]$^{2+}$
[Os(phen)$_3$]$^{2+}$
Ir(ppy)$_3$
Ir(4,6-dFppy)$_2$(pic)
Ir(MDQ)$_2$(acac)
Ir(piq)$_2$(acac)
[Os(phen)$_2$(dppee)]$^{2+}$
[Ru(bpy)$_3$]$^{2+}$
Re(phen)(CO)$_3$(Cl)
Pt(bhq)$_2$
Ir(piq)$_3$
Pt(ppy)$_2$
Pt(ph-salen)
Ir(btp)$_2$(acac)
Pt(ONN-t-Bu)Cl
Pt(dphpy)(CO)
Pt(Me$_4$-salen)
Pt(thpy)$_2$
Pt(4,6-dFppy)(acac)
Pt(ppy)(CO)(Cl)
Pt(thpy)(CO)(Cl)
Ir(ppy)$_2$(CO)(CL)
Pt(qtl)$_2$
Re(phbt)(CO)$_4$
Pt(qol)$_2$
Pd(thpy)$_2$
Pd(qol)$_2$
[Pt(bpy)$_2$]$^{2+}$
[Rh(bpy)$_3$]$^{3+}$ In some embodiments, a transition metal complex of a triplet emitter phase is operable to participate in energy/charge transfer with one or more species of the organic light emitting layer. For instance, a phosphorescent transition metal complex of the triplet emitter phase can be operable to receive energy from the light emitting polymeric or oligomeric species of the organic light emitting layer, such as through resonant energy transfer. Resonant energy transfer can include Förster energy transfer and/or Dexter energy transfer. In some embodiments, a phosphorescent transition metal complex of the triplet emitter phase is operable to receive triplet excited states from the singlet emitter polymeric or oligomeric species for subsequent radiative relaxation of the received triplet excited states to the ground state. Moreover, in some embodiments, a phosphorescent transition metal complex of the triplet emitter phase is also operable to receive singlet excited states from the singlet emitter polymeric or oligomeric phase for subsequent radiative relaxation of the received singlet excited states to the ground state. In some embodiments, relaxation of the received singlet excited state occurs through a phosphorescent pathway.

A triplet emitter phase can comprise one or more of Lanthanide and/or Actinide series elements (rare earth emitters) such as erbium, ytterbium, dysprosium, or holmium; metals such as transition metals; metal oxides; metal sulfides; or combinations thereof. In some embodiments, the triplet emitter phase comprises a doped yttrium oxide (Y$_2$O$_3$) such as Y$_2$O$_3$:Eu, Y$_2$O$_3$:Zn, and Y$_2$O$_3$:Ti. In some embodiments, the triplet emitter phase comprises a doped zinc sulfide such as ZnS:Cu, ZnS:Mn, ZnS:Ga or ZnS:Gd or mixtures thereof. In another embodiment, the triplet emitter phase comprises a doped calcium sulfide such as CaS:Er, CaS:Tb, CaS:Eu or mixtures thereof. In a further embodiment, the triplet emitter phase comprises a doped zinc oxide such as ZnO:Eu. In one embodiment, the triplet emitter phase comprises a doped strontium sulfide such as SrS:Ca, SrS:Mn, SrS:Cu or mixtures thereof. A triplet emitter phase can comprise any mixture of phosphorescent transition metal complexes and other triplet emitting species described herein.

Triplet emitter phase can be incorporated into the organic light emitting layer in any manner not inconsistent with the objectives of the present invention. In some embodiments, for example, the triplet emitter phase is dispersed throughout a light emitting polymeric or oligomeric phase. One or more phosphorescent transition metal complexes of the triplet emitter phase can be blended with one or more light emitting conjugated polymers or oligomers to disperse the transition metal complexes throughout the conjugated polymers or oligomers.

Triplet emitter phase can be present in a light emitting organic layer in any amount not inconsistent with the objectives of the present invention. In some embodiments, triplet emitter phase is present in the light emitting composite organic layer in an amount selected from Table III.

TABLE III

Weight Percent of Triplet Emitter Phase in Organic Light Emitting Layer
Triplet Emitter Phase (wt. %)

0.01-25
0.05-30
0.1-15
0.1-10
0.5-5
1-30
1.5-30
2-30
3-30
4-30
5-30

TABLE III-continued

Weight Percent of Triplet Emitter Phase in Organic Light Emitting Layer
Triplet Emitter Phase (wt. %)

| Triplet Emitter Phase (wt. %) |
|---|
| 7-30 |
| 8-30 |
| 9-30 |
| 10-30 |
| ≥6 |
| ≥7 |
| ≥8 |
| ≥9 |
| ≥10 |
| ≥11 |
| ≥12 |
| ≥15 |

In some embodiments, light emitting species of the organic layer, such as light emitting polymer or oligomer, are disposed in a dielectric host material. Nanoparticle phase and/or triplet emitter phase can also be disposed in the dielectric host. The dielectric host can be radiation transmissive or exhibit a non-overlapping absorption profile with the light emitting species of the organic layer.

A dielectric host material for the light emitting polymeric or oligomeric phase, the nanoparticle phase and optionally the triplet emitter phase, in some embodiments, comprises a dielectric polymeric material. Use of a dielectric polymeric host can permit organic light emitting layers to achieve increased thicknesses leading to device processing advantages without sacrificing efficiency or other performance characteristics. Surprisingly, in some embodiments, use of a dielectric polymeric host permits the formation of thicker organic light emitting layers having suitable light emission properties without the concomitant use of additional light emitting polymeric or oligomeric phase and/or nanoparticle phase.

Suitable dielectric host can comprise polystyrene (PS), polyacrylate (PAA), polymethacrylate (PMA), polymethylmethacryalte (PMMA), polycarbonate (PC) or mixtures thereof. In some embodiments, a dielectric host comprises polyethylene terephthalate (PET) or a polyolefin, such as polyethylene, polypropylene or mixtures thereof. Additionally, a dielectric host can comprise a fluoropolymer, including perfluorocyclobutyl (PFCB) polymers, polyvinyl fluoride (PVF) or polyvinylidene fluoride (PVDF) or mixtures thereof.

Dielectric polymeric host can be present in the organic light emitting layer in any desired amount not inconsistent with the objectives of the present invention. In some embodiments, dielectric polymeric host is present in an amount of at least about 50 weight percent or at least about 70 weight percent. Dielectric polymeric host, in some embodiments, is present in an amount ranging from about 30 weight percent to about 80 weight percent or from about 40 weight percent to about 75 weight percent.

In some embodiments, the ratio of dielectric polymeric host to light emitting polymeric or oligomeric phase in an organic light emitting layer ranges from about 1:5 to about 5:1. In some embodiments, the ratio of dielectric polymeric host to light emitting polymeric or oligomeric phase in an organic light emitting layer ranges from about 1:4 to about 4:1, from about 1:3 to about 3:1, or from about 1:2 to about 2:1. Further, the ratio of dielectric polymeric host to light emitting polymeric or oligomeric phase in an organic light emitting layer can range from about 1:1 to about 4:1.

An organic light emitting organic layer can have any desired thickness not inconsistent with the objectives of the present invention. For instance, a light emitting composite organic layer can have a thickness ranging from about 10 nm to about 100 μm. In some embodiments, an organic light emitting layer has a thickness selected from Table IV.

TABLE IV

| Organic Light Emitting Layer Thickness (μm) |
|---|
| 0.5-50 |
| 1-50 |
| 0.5-10 |
| 0.010-10 |
| 0.1-1 |
| 0.05-0.3 |
| 0.1-0.5 |

(iv) An organic light emitting layer of an electroluminescent device described herein, in some embodiments, comprises a singlet emitter phase and a triplet emitter phase. Singlet emitter phase can comprise a conjugated polymer or oligomer as set forth in Section I(B)1(i) herein. For example, a singlet emitter phase can comprise one or more conjugated polymers selected from the group consisting of poly(9,9-di-n-octylfluorenyl-2,7-diyl), poly[(9,9-di-n-octylfluorenyl-2,7-diyl)-alt-(benzo[2,1,3]thiadiazol-4,8-diyl)], poly(9,9-di-n-dodecylfluorenyl-2,7-diyl), poly(9,9-di-n-hexylfluorenyl-2,7-diyl), poly(9,9-n-dihexyl-2,7-fluorene-alt-9-phenyl-3,6-carbazole), poly[(9,9-dihexylfluoren-2,7-diyl)-alt-(2,5-dimethyl-1,4-phenylene)], poly[(9,9-dihexylfluoren-2,7-diyl)-co-(9-ethylcarbazol-2,7-diyl)], poly[(9,9-dihexylfluoren-2,7-diyl)-co-(anthracen-9,10-diyl)], poly[(9,9-dioctylfluorenyl-2,7-diyl)-co-bithiophene], poly[9,9-bis-(2-ethylhexyl)-9H-fluorene-2,7-diyl], poly((9,9-dihexyl-9H-fluorene-2,7-vinylene)-co-(1-methoxy-4-(2-ethylhexyloxy)-2,5-phenylenevinylene)) (e.g., 90:10 or 95:5 mole ratio), poly(9,9-di-(2-ethylhexyl)-9H-fluorene-2,7-vinylene), poly(9,9-di-n-hexylfluorenyl-2,7-vinylene), poly[(9,9-di-(2-ethylhexyl)-9H-fluorene-2,7-vinylene)-co-(1-methoxy-4-(2-ethylhexyloxy)-2,5-phenylenevinylene)] (e.g., 90:10 or 95:5 mole ratio) and mixtures thereof.

In some embodiments, a singlet emitter phase of an electroluminescent device described herein comprises a polymer or oligomer comprising a structural unit of Formula (V):

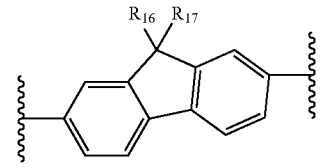

wherein ξ represents points of attachment in the polymer or oligomer chain and $R_{16}$ and $R_{17}$ are independently selected from the group consisting of hydrogen, $C_{1-20}$ alkyl, $C_{2-20}$ alkenyl, $C_{8-12}$ alkyl and $C_{8-12}$ alkenyl and wherein the alkyl and alkenyl of $R_{16}$ and $R_{17}$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

A singlet emitter phase can comprise one or more poly (phenyl vinylene)s, poly(phenyl vinylene) copolymers and/or derivatives thereof. In some embodiments, a singlet emitter phase comprises a conjugated polymer selected from the group consisting of poly[2-methoxy-5-(2-ethylhexyloxy)-1,4-phenylenevinylene], poly(1-methoxy-4-(3-propyloxy-heptaisobutyl-PSS)-2,5-phenylenevinylene)-co-(1-methoxy-4-(2-ethylhexyloxy)-2,5-phenylenevinylene) (60:40), poly(1-methoxy-4-(O-disperse Red 1))-2,5-phenylenevinylene, poly(2,5-bis(1,4,7,10-tetraoxaundecyl)-1,4-phenylenevinylene), poly(2,5-dioctyl-1,4-phenylenevinylene), poly[(m-phenylenevinylene)-alt-(2,5-dihexyloxy-p-phenylenevinylene)], poly[(m-phenylenevinylene)-alt-(2-methoxy-5-(2-ethylhexyloxy)-p-phenylenevinylene)], poly[(m-phenylenevinylene)-co-(2,5-dioctoxy-p-phenylenevinylene)], poly[(o-phenylenevinylene)-alt-(2-methoxy-5-(2-ethylhexyloxy)-p-phenylenevinylene)], poly[(p-phenylenevinylene)-alt-(2-methoxy-5-(2-ethylhexyloxy)-p-phenylenevinylene)], poly[1-methoxy-4-(3-propyloxy-heptaisobutyl-PSS)-2,5-phenylenevinylene], poly[1-methoxy-4-(3-propyloxy-heptaisobutyl-PSS)-2,5-phenylenevinylene]-co-[1-methoxy-4-(2-ethylhexyloxy)-2,5-phenylenevinylene] (30:70), poly[2,5-bisoctyloxy)-1,4-phenylenevinylene], poly[2,5-bis(3',7'-dimethyloctyloxy)-1,4-phenylenevinylene], poly[2-(2',5'-bis(2''-ethylhexyloxy)phenyl)-1,4-phenylenevinylene], poly[2-methoxy-5-(2-ethylhexyloxy)-1,4-phenylenevinylene], poly[2-methoxy-5-(3',7'-dimethyloctyloxy)-1,4-phenylenevinylene], poly[5-methoxy-2-(3-sulfopropoxy)-1,4-phenylenevinylene], poly[tris(2,5-bis(hexyloxy)-1,4-phenylenevinylene)-alt-(1,3-phenylenevinylene)], poly{[2-[2',5'-bis(2''-ethylhexyloxy)phenyl]-1,4-phenylenevinylene]-co-[2-methoxy-5-(2'-ethylhexyloxy)-1,4-phenylenevinylene]} and mixtures thereof.

Moreover, in some embodiments, singlet emitter phase comprises one or more poly(naphthalene vinylene)s, poly(naphthalene vinylene) copolymers and/or derivatives thereof. A singlet emitter phase cab comprise one or more cyano-poly(phenylene vinylene)s, cyano-poly(phenylene vinylene) copolymers and/or derivatives thereof. In some embodiments, a singlet emitter phase comprises one or more species of poly(fluorenylene ethynylene)s, poly(fluorenylene ethynylene) copolymers and/or derivatives thereof. A singlet emitter phase can comprise one or more poly(phenylene ethynylene)s, poly(phenylene ethynylene) copolymers and/or derivatives thereof. In some embodiments, a singlet emitter phase comprises one or more polythiophenes, polythiophene copolymers and/or derivatives thereof.

Singlet emitter phase of a light emitting composite organic layer, in some embodiments, comprises a conjugated polymer selected from the group consisting of poly(2,5-di(3,7-dimethyloctyloxy)cyanoterephthalylidene), poly(2,5-di(hexyloxy)cyanoterephthalylidene), poly(5-(2-ethylhexyloxy)-2-methoxy-cyanoterephthalylidene), poly(5-(3,7-dimethyloctyloxy)-2-methoxy-cyanoterephthalylidene), poly(9,9-dioctylfluorenyl-2,7-yleneethynylene), poly(9,9-didodecylfluroenyl-2,7-yleneethylnylene), poly[9,9-di(2'-ethylhexyl)fluoren-2,7-yleneethynylene], poly[9,9-di(3',7'-dimethyloctyl)fluoren-2,7-yleneethynylene], poly(2,5-dicyclohexylphenylene-1,4-ethynylene), poly(2,5-didodecylphenylene-1,4-ethynylene), poly(2,5-dioctylphenylene-1,4-ethynylene), poly(2,5-di(2'-ethylhexyl)-1,4-ethynylene), poly(2,5-di(3',7'-dimethyloctyl)phenylene-1,4-ethynylene), poly(3-butylthiophene-2,5-diyl) (regiorandom or regioregular), poly(3-cyclohexyl-4-methylthiophene-2,5-diyl), poly(3-cyclohexylthiophene-2,5-diyl), poly(3-decyloxythiophene-2,5-diyl), poly(3-decylthiophene-2,5-diyl) (regiorandom or regioregular), poly(3-dodecylthiophene-2,5-diyl) (regiorandom or regioregular), poly(3-hexylthiophene-2,5-diyl) (regiorandom or regioregular), poly(3-octylthiophene-2,5-diyl) (regiorandom or regioregular), poly(3-octylthiophene-2,5-diyl-co-3-decyloxythiophene-2,5-diyl), poly(thiophene-2,5-diyl), poly[(2,5-didecyloxy-1,4-phenylene)-alt-(2,5-thienylene)], poly(2,6-naphthalenevinylene), poly(p-xylene tetrahydrothiophenium chloride), poly(2,5 pyridine), poly(3,5 pyridine), poly(2,5-bis(3-sulfonatopropoxy)-1,4-phenylene, disodium salt-alt-1,4-phenylene), poly[(2,5-bis(2-(N,N-diethylammonium bromide)ethoxy)-1,4-phenylene)-alt-1,4-phenylene], poly[5-methoxy-2-(3-sulfopropoxy)-1,4-phenylenevinylene] potassium salt, poly{[2,5-bis(2-(N,N-diethylamino)ethoxy)-1,4-phenylene]-alt-1,4-phenylene} and mixtures thereof.

Further, in some embodiments, a singlet emitter phase comprises a conjugated polymer or oligomer described in Patent Cooperation Treaty Application No. PCT/US2011/043690 filed on Jul. 12, 2011, which is incorporated herein by reference in its entirety.

In some embodiments, a singlet emitter phase of a light emitting composite organic layer of a FIPEL described herein comprises a non-conjugated light emitting polymer or oligomer, a fluorescent small molecule, or a mixture thereof. Suitable non-conjugated polymers for a singlet emitter phase can comprise any of the non-conjugated polymers recited in Section I(C)(ii) herein. In some embodiments, a singlet emitter phase comprises a polyvinyl carbazole (PVK).

Singlet emitter phase of an organic light emitting layer described herein can comprise one or more fluorescent small molecules. Suitable fluorescent small molecules can comprise metal chelate species, fluorescent dyes, conjugated dendrimer or mixtures thereof. A fluorescent small molecule, in some embodiments, comprises anthracene or related compounds or a coumarin. In some embodiments, a fluorescent small molecule comprises tris(8-hydroxyquinoline) aluminum ($Alq_3$).

Moreover, in some embodiments, a singlet emitter phase can comprise one or more conjugated polymers or oligomers and one or more fluorescent small molecules. A conjugated polymer or oligomer can be combined with a fluorescent small molecule in a light emitting composite organic layer in any manner not inconsistent with the objectives of the present invention. In some embodiments, for example, one or more fluorescent small molecules are blended with one or more conjugated polymers or oligomers to provide a singlet emitter phase. Combining a plurality of polymeric, oligomeric, and/or small molecule singlet emitters can, in some embodiments, permit tuning of the emissive properties of a luminescent organic phase of a composite organic layer described herein.

As described herein, the organic light emitting layer also comprises a triplet emitter phase. A triplet emitter phase can comprise any phosphorescent compound not inconsistent with the objectives of the present invention. In some embodiments, the triplet emitter phase can comprise any of the triplet chemical species described in Section I(B)1(iii) hereinabove.

A triplet emitter phase can be combined with a singlet emitter phase of an organic light emitting layer described herein in any manner not inconsistent with the objectives of the present invention. In some embodiments, triplet emitter phase is dispersed throughout the singlet emitter phase. For example, one or more phosphorescent transition metal complexes of the triplet emitter phase can be blended with one or more conjugated polymers or oligomers of the singlet emitter phase to disperse the transition metal complexes throughout the conjugated polymers or oligomers.

Triplet emitter phase can be present in the organic light emitting layer in any desired amount not inconsistent with the objectives of the present invention. In some embodiments, triplet emitter phase is present in the organic light emitting layer in an amount in accordance with Table III hereinabove.

In some embodiments, the organic light emitting layer further comprises a nanoparticle phase disposed therein. In some embodiments, a nanoparticle phase is disposed in the singlet emitter phase. In other embodiments, a nanoparticle phase is disposed in the triplet emitter phase. Further, one or more nanoparticle phases can be disposed in both the singlet emitter phase and the triplet emitter phase. Moreover, a nanoparticle phase can comprise any nanoparticle phase described in Section I herein. In some embodiments, the nanoparticle phase is present in the organic light emitting layer in an amount consistent with Table I herein.

In addition, in some embodiments, nanoparticles of the nanoparticle phase are associated with phosphorescent transition metal complexes of the triplet emitter phase. In some embodiments, a nanoparticle of the nanoparticle phase is bonded to a transition metal complex of the triplet emitter phase. In some embodiments, a nanoparticle is bonded to a phosphorescent transition metal complex of the triplet emitter phase one or more of a van der Waals interaction, electrostatic interaction, hydrogen bond, ionic bond and covalent bond. In one embodiment, for example, the phosphorescent transition metal complex comprises an iridium or platinum complex and the nanoparticle comprises a carbon nanotube. In some embodiments, one or more covalent bonds can be formed between a phosphorescent transition metal complex and nanoparticle by sidewall halogenation, hydrogenation, cycloaddition (such as the Prato reaction), and/or radical addition reactions. An association between a phosphorescent metal complex and a nanoparticle, in some embodiments, can reduce or avoid electromigration and/or maximize the efficiency of energy transfer between two components of the composite organic layer, such as between the singlet emitter phase and the triplet emitter phase.

In some embodiments, singlet emitter phase, triplet emitter phase, and/or a nanoparticle phase of the organic light emitting layer are disposed in a dielectric host material as set forth in Section I(B)1(iii) herein. Further, the organic light emitting layer formed of singlet emitter phase, triplet emitter phase and optionally nanoparticle phase can have a thickness set forth in Table IV above.

2. Inorganic Light Emitting Layers

A light emitting layer of an electroluminescent device described herein can be formed of various light emitting inorganic material. An inorganic light emitting layer described herein is formed of one or more sublayer groups, a sublayer group comprising a p-type sublayer forming a heterojunction with an n-type sublayer. In some embodiments, an inorganic light emitting layer is formed of a single sublayer group. Alternatively, an inorganic light emitting layer is formed of a plurality of sublayer groups. In some embodiments, sublayer groups can be arranged in a vertically stacked configuration to provide the inorganic light emitting layer.

A p-type sublayer can comprise p-doped II/VI semiconductor materials, p-doped III/V semiconductor materials, p-doped group IV semiconductor materials or p-doped II/VV seminconductor materials or combinations thereof. In some embodiments, p-type sublayers comprise semiconductor alloys. In some embodiments, p-type sublayer comprise p-type ternary or quaternary semiconductor materials. For example, p-type sublayers can comprise p-doped III/V ternary systems such as AlGaAs or InGaN. In some embodiments, p-type sublayers comprise p-doped III/V quaternary systems such as AlGaInP, AlGaAsP or AlInGaAs. P-type sublayers can also comprise p-type I/III/VI systems, such as CuInGaSe.

A p-doped group IV semiconductor material can comprise acceptor atoms (p-dopant) selected from one or more elements of groups IIIA of the Periodic Table including, but not limited to, boron, aluminum or gallium. In some embodiments, a p-doped III/V semiconductor material comprises acceptor atoms selected from one or more elements of groups IIA, IIB and IVA of the Periodic Table. For example, a p-dopant for III/V semiconductor material can comprise beryllium, magnesium, zinc, cadmium, silicon or germanium. Moreover, a p-doped group II/VI semiconductor material can comprise acceptor atoms selected from one or more transition metal elements or rare earth metal elements.

A p-type sublayer can comprise any desired level of p-dopant not inconsistent with the objectives of the present invention. In some embodiments, a p-type sublayer has a doping level of at least about $10^{16}$ atoms/cm$^3$. A p-type sublayer, in some embodiments, has a doping level ranging from about $10^{16}$ atoms/cm$^3$ to about $10^{18}$ atoms/cm$^3$. In some embodiments, a p-type sublayer has a doping level greater than about $10^{18}$ atoms/cm$^3$. Further, a p-type sublayer can have any thickness not inconsistent with the objectives of the present invention. In some embodiments, a p-type sublayer has a thickness of 50 nm to 2 µm. In some embodiments, a p-type sublayer has a thickness of 100 nm to 1 µm or 100 nm to 750 nm.

An n-type sublayer can comprise n-doped IIB/VIA (II/VI) semiconductor materials, n-doped IIIA/VA (III/V) semiconductor materials, n-doped Group IVA (Group IV) semiconductor materials or n-doped II/VV semiconductor materials or combinations thereof. In some embodiments, n-type sublayer(s) comprise semiconductor alloys. For example, an n-type sublayer can comprise n-type ternary or quaternary semiconductor materials. N-type sublayers can comprise n-doped III/V ternary systems such as AlGaAs or InGaN. Additionally, n-type sublayers can comprise n-doped III/V quaternary systems such as AlGaInP, AlGaAsP or AlInGaAs. N-type sublayers, in some embodiments, comprise n-type I/III/VI systems, such as CuInGaSe.

An n-doped Group IV semiconductor material can comprise donor atoms (n-dopant) selected from one or more elements of Group VA of the Periodic Table including, but not limited to, antimony, arsenic, or phosphorus. An n-doped III/V semiconductor material can comprise donor atoms selected from one or more elements of Groups IVA and VIA of the Periodic Table. In some embodiments, for example, an n-dopant for III/V semiconductor material comprises sulfur, selenium, tellurium, silicon or germanium.

A layer of an n-type assembly can comprise any desired level of n-dopant not inconsistent with the objectives of the present invention. In some embodiments, an n-type layer has a doping level of at least about $10^{16}$ atoms/cm$^3$. An n-type layer, in some embodiments, has a doping level ranging from about $10^{16}$ atoms/cm$^3$ to about $10^{18}$ atoms/cm$^3$. In some embodiments, an n-type layer has a doping level greater than about $10^{18}$ atoms/cm$^3$. In embodiments where an n-type assembly comprises multiple n-type layers, the n-type layers can demonstrate the same or substantially the same dopant level.

An n-type sublayer can have any thickness not inconsistent with the objectives of the present invention. In some embodiments, an n-type sublayer has a thickness of 50 nm to 2 µm. In some embodiments, an n-type sublayer has a thickness of 100 nm to 500 nm or 100 nm to 250 nm.

Radiative recombination events can take place proximate p-n junctions formed by adjacent n-type and p-type sublayers of a sublayer group. In some embodiments, a sublayer group further comprises one or more active layer positioned between a p-type sublayer and n-type sublayer, thereby forming junctions with the p-type and n-type sublayers. Light emitting active layers, in some embodiments, comprise a single quantum well structure in conjunction with the bounding p-type and n-type sublayers. In some embodiments, light emitting layers comprise multiple quantum well structures. Radiative recombination of holes and electrons can occur substantially uniformly along the length of a light active emitting layer. In some embodiments, radiative recombination of holes and electrons occurs non-uniformly along the length of a light emitting active layer.

Light emitting active layers can comprise any semiconductor material not inconsistent with the objectives of the present invention. A light emitting active layer, in some embodiments, comprises a group IV semiconductor material, III/V semiconductor material or II/VI semiconductor material. The compositional identity of a light emitting active layer can be selected with reference to the compositional identities of the adjacent p-type sublayer and n-type sublayer. In some embodiments, light emitting active layers are undoped or intrinsic semiconductors resulting in p-i-n architectures when disposed between the p-type and n-type sublayers. Light emitting active layers, in some embodiments, are lightly n-doped or p-doped. In some embodiments, for example, a light emitting active layer demonstrates a p-dopant level less than a bordering p-type sublayer. Additionally, a light emitting active layer can demonstrate an n-dopent level less than a bordering n-type sublayer.

C. Current Injection Gate

As described herein, the electroluminescent device comprises a current injection gate positioned between the first electrode and the light emitting layer or between the second electrode and the light emitting layer. In some embodiments, the current injection gate comprises a semiconductor layer of electronic structure restricting injected current flow from the first or second electrode through the semiconductor layer as a function of alternating current voltage frequency applied to the first and second electrodes. For example, injected current flow from the first or second electrode through the semiconductor layer can decrease with increasing frequency of the applied alternating current voltage. Alternatively, current from the first or second electrode, in some embodiment, increase with increasing frequency of the applied alternating current voltage.

Semiconducting materials demonstrating this frequency dependent restriction of injected current from the first or second electrode can serve as the current injection gate in the electroluminescent device architecture. Suitable gate semiconductor materials can comprise inorganic semiconductors and organic semiconductors. For example, in some embodiments, inorganic gate semiconductors comprise transition metal oxides, including titanium oxide. In some embodiments, inorganic gate semiconductors are selected from Tables V and VI.

TABLE V

| Inorganic Gate Semiconductors | |
| --- | --- |
| Silicon | Si |
| Germanium | Ge |

TABLE V-continued

| Inorganic Gate Semiconductors | |
| --- | --- |
| Gray tin, α-Sn | Sn |
| Silicon carbide, 3C—SiC | SiC |
| Silicon carbide, 4H—SiC | SiC |
| Silicon carbide, 6H—SiC | SiC |
| Sulfur, α-S | $S_8$ |
| Gray selenium | Se |
| Tellurium | Te |
| Boron nitride, cubic | BN |
| Boron nitride, hexagonal | BN |
| Boron nitride, nanotube | BN |
| Boron phosphide | BP |
| Boron arsenide | BAs |
| Boron arsenide | $B_{12}As_2$ |
| Aluminium nitride | AlN |
| Aluminium phosphide | AlP |
| Aluminium arsenide | AlAs |
| Aluminium antimonide | AlSb |
| Gallium nitride | GaN |
| Gallium phosphide | GaP |
| Gallium arsenide | GaAs |
| Gallium antimonide | GaSb |
| Indium nitride | InN |
| Indium phosphide | InP |
| Indium arsenide | InAs |
| Indium antimonide | InSb |
| Cadmium selenide | CdSe |
| Cadmium sulfide | CdS |
| Cadmium telluride | CdTe |
| Zinc oxide | ZnO |
| Zinc selenide | ZnSe |
| Zinc sulfide | ZnS |
| Zinc telluride | ZnTe |
| Cuprous chloride | CuCl |
| Copper sulfide | $Cu_2S$ |
| Lead selenide | PbSe |
| Lead(II) sulfide | PbS |
| Lead telluride | PbTe |
| Tin sulfide | SnS |
| Tin sulfide | $SnS_2$ |
| Tin telluride | SnTe |
| Lead tin telluride | PbSnTe |
| Thallium tin telluride | $Tl_2SnTe_5$ |
| Thallium germanium telluride | $Tl_2GeTe_5$ |
| Bismuth telluride | $Bi_2Te_3$ |
| Cadmium phosphide | $Cd_3P_2$ |
| Cadmium arsenide | $Cd_3As_2$ |
| Cadmium antimonide | $Cd_3Sb_2$ |
| Zinc phosphide | $Zn_3P_2$ |
| Zinc arsenide | $Zn_3As_2$ |
| Zinc antimonide | $Zn_3Sb_2$ |
| Titanium dioxide, anatase | $TiO_2$ |
| Titanium dioxide, rutile | $TiO_2$ |
| Titanium dioxide, brookite | $TiO_2$ |
| Copper(I) oxide | $Cu_2O$ |
| Copper(II) oxide | CuO |
| Uranium dioxide | $UO_2$ |
| Uranium trioxide | $UO_3$ |
| Bismuth trioxide | $Bi_2O_3$ |
| Tin dioxide | $SnO_2$ |
| Barium titanate | $BaTiO_3$ |
| Strontium titanate | $SrTiO_3$ |
| Lithium niobate | $LiNbO_3$ |
| Lanthanum copper oxide | $La_2CuO_4$ |
| Lead(II) iodide | $PbI_2$ |
| Molybdenum disulfide | $MoS_2$ |
| Gallium selenide | GaSe |
| Tin sulfide | SnS |
| Bismuth sulfide | $Bi_2S_3$ |
| Gallium manganese arsenide | GaMnAs |
| Indium manganese arsenide | InMnAs |
| Cadmium manganese telluride | CdMnTe |
| Lead manganese telluride | PbMnTe |
| Lanthanum calcium manganate | $La_{0.7}Ca_{0.3}MnO_3$ |
| Iron(II) oxide | FeO |
| Nickel(II) oxide | NiO |
| Europium(II) oxide | EuO |
| Europium(II) sulfide | EuS |
| Chromium(III) bromide | $CrBr_3$ |

TABLE V-continued

Inorganic Gate Semiconductors

| | |
|---|---|
| Copper indium selenide, CIS | $CuInSe_2$ |
| Silver gallium sulfide | $AgGaS_2$ |
| Zinc silicon phosphide | $ZnSiP_2$ |
| Arsenic sulfide | $As_2S_3$ |
| Platinum silicide | PtSi |
| Bismuth(III) iodide | $BiI_3$ |
| Mercury(II) iodide | $HgI_2$ |
| Thallium(I) bromide | TlBr |
| Silver sulfide | $Ag_2S$ |
| Iron disulfide | $FeS_2$ |
| Copper zinc tin sulfide, CZTS | $Cu_2ZnSnS_4$ |

TABLE VI

Inorganic Gate Semiconductors

| | |
|---|---|
| Silicon-germanium | $Si_{1-x}Ge_x$ |
| Aluminium gallium arsenide | $Al_xGa_{1-x}As$ |
| Indium gallium arsenide | $In_xGa_{1-x}As$ |
| Indium gallium phosphide | $In_xGa_{1-x}P$ |
| Aluminium indium arsenide | $Al_xIn_{1-x}As$ |
| Aluminium indium antimonide | $Al_xIn_{1-x}Sb$ |
| Gallium arsenide nitride | GaAsN |
| Gallium arsenide phosphide | GaAsP |
| Gallium arsenide antimonide | GaAsSb |
| Aluminium gallium nitride | AlGaN |
| Aluminium gallium phosphide | AlGaP |
| Indium gallium nitride | InGaN |
| Indium arsenide antimonide | InAsSb |
| Indium gallium antimonide | InGaSb |
| Aluminium gallium indium phosphide | AlGaInP |
| Aluminium gallium arsenide phosphide | AlGaAsP |
| Indium gallium arsenide phosphide | InGaAsP |
| Indium gallium arsenide antimonide | InGaAsSb |
| Indium arsenide antimonide phosphide | InAsSbP |
| Aluminium indium arsenide phosphide | AlInAsP |
| Aluminium gallium arsenide nitride | AlGaAsN |
| Indium gallium arsenide nitride | InGaAsN |
| Indium aluminium arsenide nitride | InAlAsN |
| Gallium arsenide antimonide nitride | GaAsSbN |
| Gallium indium nitride arsenide antimonide | GaInNAsSb |
| Gallium indium arsenide antimonide phosphide | GaInAsSbP |
| Cadmium zinc telluride, CZT | CdZnTe |
| Mercury cadmium telluride | HgCdTe |
| Mercury zinc telluride | HgZnTe |
| Mercury zinc selenide | HgZnSe |
| Copper indium gallium selenide, CIGS | $Cu(In,Ga)Se_2$ |

Moreover, organic gate semiconductors can comprise small molecule semiconductors including acene and/or acene derivatives such as anthracene, tetracene, pentacene, hexacene, heptacene or rubrene. In some embodiments, small molecule gate semiconductor is selected from Table VII.

TABLE VII

Small Molecule Gate Semiconductors 2,7-alkyl[1]benzothieno[3,2-b][1]benzothiophene (C8-BTBT)
2,9-alkyl-dinaphtho[2,3-b: 2',3'-f]thieno[3,2-b]thiophene (C 10 -DNTT)
N,N-1 H,1H-perfluorobutyldicyanoperylene-carboxydiimide (PDIF-$CN_2$)
Sexithiophene (6T)
poly[9,9'dioctyl-fluorene-co-bithiophene] (F8T2)
polytriarylamine (PTAA)
poly-2,5-thienylene vinylene (PVT)
α,ω-dihexylquinquethiophene (DH-5T)
α,ω-dihexylsexithiophene (DH-6T)
perfluorocopperphthalocyanine (FPcCu)
3',4'-dibutyl-5,5''-bis(dicyanomethylene)-5,5''-dihydro-2,2': 5',-2''-terthiophene (QM3T)

TABLE VII-continued

Small Molecule Gate Semiconductors

α,ω-diperfluorohexyloligothiophene (DFH-nT)
2,7-[bis(5-perfluorohexylcarbonylthien-2-yl)]-4H-cyclopenta-[2,1-b: 3,4-b']-dithiophen-4-one (DFHCO-4TCO)
Poly[bisbenzimidazobenzophenanthroline] (BBB)
α,ω-diperfluorophenylquaterthiophene (FTTTTF)
dicyanoperylene-bis[dicarboximide] (DPI-CN)
naphthalene tetracarboxylic diimide (NTCDI)
Tetracene
Anthracene
Tetrathiafulvalene (TTF)
Poly(3-alkythiophene)
Dithiotetrathiafulvalene (DT-TTF)
Cyclohexylquaterthiophene (CH4T)

Additionally, organic gate semiconductor can comprise one or more conjugated polymeric materials including polyacetylene, polyacetylene derivatives, poly(9,9-di-octylfluorene-alt-benzothiadiazole) (F8BT), poly[2-methoxy-5-(2-ethylhexyloxy)-1,4-phenylenevinylene] [MEH-PPV], P3HT, poly(3,4-ethylenedioxythiophene) (PEDOT), PEDOT:PSS or mixtures thereof. In some embodiments, gate semiconductor is formed of carbon nanoparticles, such as those listed in Table VIII.

TABLE VIII

Carbon Nanoparticle Gate Semiconductors
Fullerene - $C_{60}$ (6,6)-phenyl-$C_{61}$butyric acid methyl ester ($PC_{61}BM$)
(6,6)-phenyl-$C_{71}$butyric acid methyl ester ($PC_{71}BM$)
(6,6)-phenyl-$C_{61}$methyl-hexanoate ($PC_{61}HM$)
(5,6)-fullerene-$C_{70}$
(6,6)-phenyl-$C_{71}$hexanoic acid methyl ester ($PC_{71}HM$)

Gate semiconductors can be intrinsic or doped. Further, suitable inorganic and/or organic gate semiconductors can demonstrate a bandgap of at least 2 eV or at least 3 eV. In some embodiments, gate semiconductor material has a bandgap of 2 to 4 eV or 2.5 to 3.5 eV.

A semiconductor layer of a current injection gate can have any thickness not inconsistent with the objectives of the present invention. In some embodiment, a gate semiconductor layer has a thickness selected from Table IX.

TABLE IX

Current Injection Gate Semiconductor Layer Thickness (nm)

1-500
5-100
10-75
15-50
20-40

In further embodiments, a current injection gate having frequency dependent behavior can be a composite formed of organic and inorganic components. For example, a current injection gate composite can comprise inorganic particles dispersed in a polymeric matrix. In some embodiments, one or more ceramic particles (e.g. metal carbides, metal oxides, metal carbonitrides, metal nitrides, metal oxynitrides and/or metal oxycarbonitrides) can be dispersed in a conjugated or semiconducting polymeric matrix to provide a current injection gate exhibiting a frequency dependent restriction of injected current from the first or second electrode. A current injection gate composite can employ up to about 90 wt % inorganic particles with the balance polymeric matrix. In some embodiments, a current injection gate comprises 15-75 wt. % inorganic particles with the balance polymeric matrix. Suitable inorganic particles and conjugated polymer for the current injection gate composite are described in this Section C. Inorganic particles for the composite current injection gate can have any average particle size not inconsistent with the objectives of the present invention. For example, in some embodiments, the inorganic particles are nanoparticles having an average size less than 1 μm. In some embodiments, the inorganic particles have an average size from 10 μm to 500 μm. Alternatively, the inorganic particles can have an average size greater than 1 μm. A current injection gate composite, in some embodiments, has a thickness selected from Table IX.

D. Electron and Hole Dopant Layers

As described herein, an electroluminescent device can further comprise an electron dopant layer on a first side of the light emitting organic layer and hole dopant layer on the opposing side of the light emitting organic layer. Alternatively, material(s) forming an electron dopant layer and/or hole dopant layer can be blended into the light emitting layer. In some embodiments, for example, semiconductor polymer or small molecules of an electron dopant layer and/or hole dopant layer are blended into an organic light emitting layer.

Electron and hole dopant layers can be formed of any semiconducting polymer and/or conjugated small molecule. In some embodiments, for example, electron and hole dopant layers are selected from Table X.

TABLE X

Electron and Hole Dopant Materials

| Electron Dopant Material | Hole Dopant Material |
|---|---|
| 3,3'-[5'-[3-(3-Pyridinyl)phenyl][1,1':3',1''-terphenyl]-3,3''-diyl]bispyridine | Poly(3-hexylthiophene-2,5-diyl) |
| 1,3,5-Tris(1-phenyl-1H-benzimidazol-2-yl)benzene | Poly(4-butylphenyl-diphenyl-amine) or poly[N,N'-bis(4-butylphenyl)-N,N'-bis(phenyl)benzidine] |
| Bathophenanthroline | poly(9,9-dioctyl-fluorene-co-N-(4-butylphenyl)-diphenylamine) |
| Bathocuproine | 2,3,5,6-Tetrafluoro-7,7,8,8-tetracyanoquinodimethane poly(9,9-di-ndodecylfluorenyl-2,7-diyl) |

When not blended in the light emitting layer, an electron and/or hole dopant layer can have any thickness not inconsistent with the objectives of the present invention. In some embodiments, an electron dopant layer or hole dopant has a thickness of 10 nm to 100 nm. Moreover, an electron and/or hole dopant layer can have a thickness less than 10 nm or greater than 100 nm.

Further, nanoparticles of an organic light emitting layer, in some embodiments, bridge the interface formed between an electron dopant layer and the organic light emitting layer. Similarly, nanoparticles of an organic light emitting layer can bridge the interface formed between a hole dopant layer and the organic light emitting layer.

Electron and/or hole dopant layers, in some embodiments, can provide charge carriers for radiative recombination in the light emitting layer. For example, when the current injection gate is functioning to restrict or preclude current injection into the light emitting layer from the first or second electrode, hole and/or electron dopant layers can provide requisite carriers for radiative recombination in the light emitting layer. Without being bound by any theory, it is believed polarization currents can provide carrier generation in hole and/or electron dopant layers under applied alternating current voltages having frequencies inducing restriction or preclusion of injected current flow through the semiconductor gate layer. Therefore, depending on the frequency of applied alternating current voltage, the light emitting device can operate by direct current injection from the electrodes or by carrier formation in the hole and/or electron dopant layers. Such dual function operation enables electroluminescent devices described herein to provide efficient, bright emission across a wide range of alternating current voltage frequencies, thereby obviating any restrictions on AC voltage operating frequency.

Electroluminescent devices having an architecture described herein, in some embodiments, demonstrate power efficiencies, current efficiencies and luminance values of Table XI. Further, power and current efficiencies and luminance values listed in Table XI, in some embodiments, can be achieved without the use of light out-coupling structures traditionally applied to light emitting devices to enhance light extraction.

TABLE XI

Power and Current Efficiencies and Luminance

| Power Efficiency (lm/W) | Current Efficiency (cd/A) | Luminance (cd/m²) |
|---|---|---|
| ≥50 | ≥20 | 1500-8000 |
| ≥80 | ≥30 | 2000-7000 |
| ≥100 | ≥40 | 4000-6000 |
| ≥110 | 15-50 | |
| ≥120 | 15-40 | |
| 50-150 | | |
| 80-130 | | |
| 80-120 | | |
| 100-150 | | |

Additionally, an electroluminescent device having an architecture described herein can be tuned to display electroluminescent emission having any desired color temperature (2000-8000K), such as 2000-5000K. Moreover, electroluminescent devices described herein can demonstrate a color rendering index (CRI) of at least 80 or 85.

In another aspect, an electroluminescent device described herein comprises a first electrode and second electrode and an organic light emitting layer positioned between the first and second electrodes. An electron dopant layer is positioned on a first side of the organic light emitting layer and a hole dopant layer is positioned on the opposing side of the organic light emitting layer, wherein a nanoparticle phase bridges an interface formed by the electron dopant layer and organic light emitting layer. Alternatively, the nanoparticle phase can bridge an interface formed by the hole dopant layer and organic light emitting layer. Further, a nanoparticle phase can bridge an interface formed by the electron dopant layer and organic light emitting layer and an interface formed by the hole dopant layer and organic light emitting layer.

Figure 2:
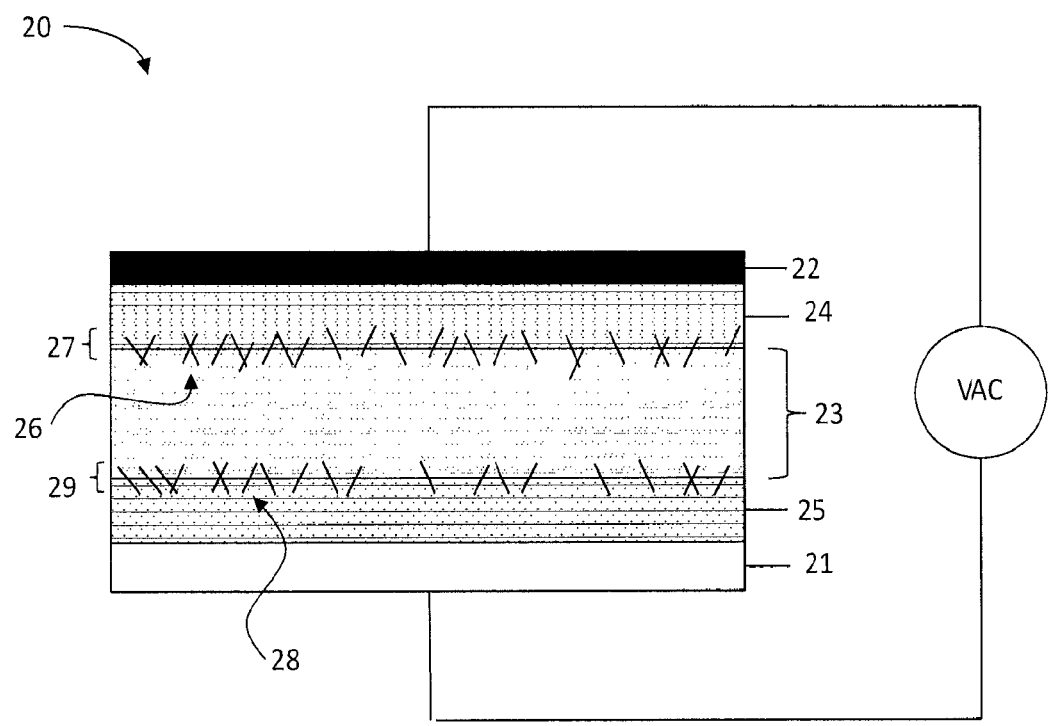
FIG. 2 illustrates a cross-sectional view of an electroluminescent device according to one embodiment described herein.

FIG. 2 illustrates a cross-sectional view an electroluminescent device wherein nanoparticles bridge interfaces formed by the electron and hole dopant layers with the organic light emitting layer. As illustrated in FIG. 2, the electroluminescent device (20) comprises first (21) and second (22) electrodes and an organic light emitting layer (23) positioned between the first (21) and second (22) electrodes. An electron dopant layer (24) is positioned on a first side of the organic light emitting layer (23), and a hole dopant layer (25) is positioned on the opposing side of organic light emitting layer (23). A first nanoparticle phase (26) bridges the interface (27) formed between the electron dopant layer (24) and organic light emitting layer (23). A second nanoparticle phase (28) bridges the interface (29) formed between the hole dopant layer (25) and organic light emitting layer (23). First (26) and second (28) nanoparticle phases can comprise the same nanoparticles. Alternatively, first (26) and second (28) nanoparticle phases can be formed of different nanoparticles. For example, nanoparticles of the first nanoparticle phase (26) can be selected with reference to the chemical identity of the electron dopant layer (24) and nanoparticles of the second nanoparticles phase (28) selected with reference to the chemical identity of the hole dopant layer (25).

Moreover, in some embodiments, the electron dopant layer and/or hole dopant layer are blended into the organic light emitting layer.

Components of the electroluminescent device, including the first and second electrodes, organic light emitting layer, nanoparticle phase(s), electron dopant layer and hole dopant layer, can have any compositional parameters and/or properties described above in this Section I. For example, components of the electroluminescent device can be selected according to Table XII.

TABLE XII

Electroluminescent Device Components

| Component | Composition/Properties |
| --- | --- |
| First Electrode | Selected from Section IA herein |
| Second Electrode | Selected from Section IA herein |
| Organic Light Emitting Layer | Selected from Section IB(1)(i)-(iv) |
| Inorganic Light Emitting Layer | Selected from Section IB(2) |
| Electron Dopant Layer | Selected from Section ID |
| Hole Dopant Layer | Selected from Section ID |

Further, electroluminescent devices having a construction wherein nanoparticle phase(s) bridge interface(s) formed between an organic light emitting layer and electron and/or hole dopant layers can have power and current efficiencies and luminance values listed in Table XI herein when coupled to an alternating current voltage source.

II. Methods of Generating Light

In another aspect, methods of generating light are described herein. A method of generating light comprises providing an electroluminescent device comprising first and second electrodes, a light emitting layer positioned between the first and second electrodes and a current injection gate positioned between the first electrode and the light emitting layer or between the second electrode and the light emitting layer. An alternating current voltage is applied to the first and second electrodes and current injected from the first or the second electrode is restricted from flowing into the light emitting layer by the gate as a function of alternating current voltage frequency, wherein holes and electrons are radiatively combined in the light emitting layer. In some embodiments, alternating current voltage frequencies employed for methods and electroluminescent devices described herein are selected from Table XIII.

TABLE XIII

Alternating Current Voltage Frequencies

10 Hz-100 kHz
10 kHz-100 kHz
10 Hz-100 Hz

TABLE XIII-continued

Alternating Current Voltage Frequencies 20 kHz-80 kHz
30 kHz-50 kHz

Electroluminescent devices suitable for use in methods of generating light can have any construction and/or properties described in Section I herein, including the electroluminescent device illustrated in FIG. 1. Further, methods of generating light described herein, in some embodiments, produce power and current efficiencies and luminance values listed in Table XI of Section I.

As described in Section I herein, charge carriers radiatively recombining in the light emitting layer can originate from the first and/or second electrodes or in the hole and/or electron dopant layers depending on the frequency of the applied alternating current voltage governing the restriction of current flow through the gate semiconductor layer. In some embodiments, for example, injected current flow through the gate semiconductor layer decreases with increasing frequency of the applied alternating current voltage.

These and other embodiments are further illustrated in the following non-limiting example.

Example 1—Electroluminescent Devices

A first electroluminescent device (EL1) was fabricated as follows. An ITO-glass substrate was prepared for each device. The ITO-glass substrate consisted of a square substrate (25.4 mm×25.4 mm) of 0.7 mm thick soda lime glass partially coated with a 150 nm thick layer of ITO (indium tin oxide). The ITO layer covered a 25.4 mm×15.9 mm portion of the glass substrate. The uncoated, "glass" portion of the substrate was polished to a surface roughness of <5 nm $R_a$. The coated, "ITO" portion of the substrate was polished to a surface roughness of <3 nm $R_a$. The ITO portion had a resistivity of less than 10 ohm/sq. The ITO-glass substrate had a transparency greater than 95% at 555 nm.

Second, the ITO-glass substrate was cleaned as follows. A stream of high purity (>99.99%) $N_2$ gas was blown onto the substrate from a tank equipped with a CGA 580 regulator. The substrate was then placed in a polypropylene substrate carrier. The substrate and substrate carrier were placed in a glass dish. The glass dish was placed in an ultrasonicator (Branson 3510). Acetone was then added to the glass dish, covering the substrate. Ultrasonic cleaning was then carried out for 15 minutes or longer. The acetone solvent in the dish was then replaced with methanol, and ultrasonic cleaning was carried out for an additional period of 15 minutes or longer. The methanol solvent in the dish was then replaced with IPA (isopropylalcohol, High Performance Liquid Chromatography (HPLC) grade), and ultrasonic cleaning was carried out for an additional period of 15 minutes or longer. The substrate was then removed from the dish, and a stream of high purity (>99.99%) $N_2$ gas at a pressure of 30 psi or more was used to dry the substrate. The dried substrate was then placed flat in a UV-ozone cleaner (UVOCS Inc., Model T16X16/OES), with the functional side of the substrate facing upwards, and cleaned for 60 minutes or longer.

A gate semiconductor layer of $TiO_2$ was spin coated at 1000 rpm onto the ITO surface from a mixture with isopropyl alcohol. The $TiO_2$ gate had a thickness of about 20 nm. A hole dopant layer of poly-TPD:F4TCNQ mixture was spin coated onto the dried $TiO_2$ gate layer at a thickness of about 40 nm. Next, an organic light emitting layer was spin-coated onto the PEDOT:PSS hole dopant layer from a solution of PVK in chlorobenzene (10 mg/ml). The PVK solution also contained Ir(ppy)$_3$ in an amount to provide 8 wt. % Ir(ppy)$_3$ in the deposited organic light emitting layer. The organic light emitting layer of PVK:Ir(ppy)$_3$ had a thickness of about 150 nm. An electron dopant layer of TPBi was spin coated onto the organic light emitting laye to a thickness of about 40 nm. A metal second electrode was deposited on the TPBi layer. The electroluminescent device was placed in a vacuum evaporator for sequential deposition of LiF (up to 0.5 nm thick) and Al (110-130 nm thick). LiF (>99.999%) was deposited at 0.02 nm/s at a pressure of $5E^{-5}$ to $5E^{-6}$ torr. Aluminum (>99.999%) was deposited at 0.4 to 0.7 nm/s at a pressure of $5E^{-5}$ to $5E^{-6}$ torr.

A second electroluminescent device (EL2) was fabricated according to the protocol for EL1, the sole difference being that the TiO$_2$ gate layer was spin coated at 4000 rpm. Further, a third electroluminescent device (EL3) was fabricated according to the protocol for EL1, the sole difference being the TiO$_2$ gate layer was not spin coated. Instead, the TiO$_2$ gate layer was deposited by drop casting.

Figure 3:
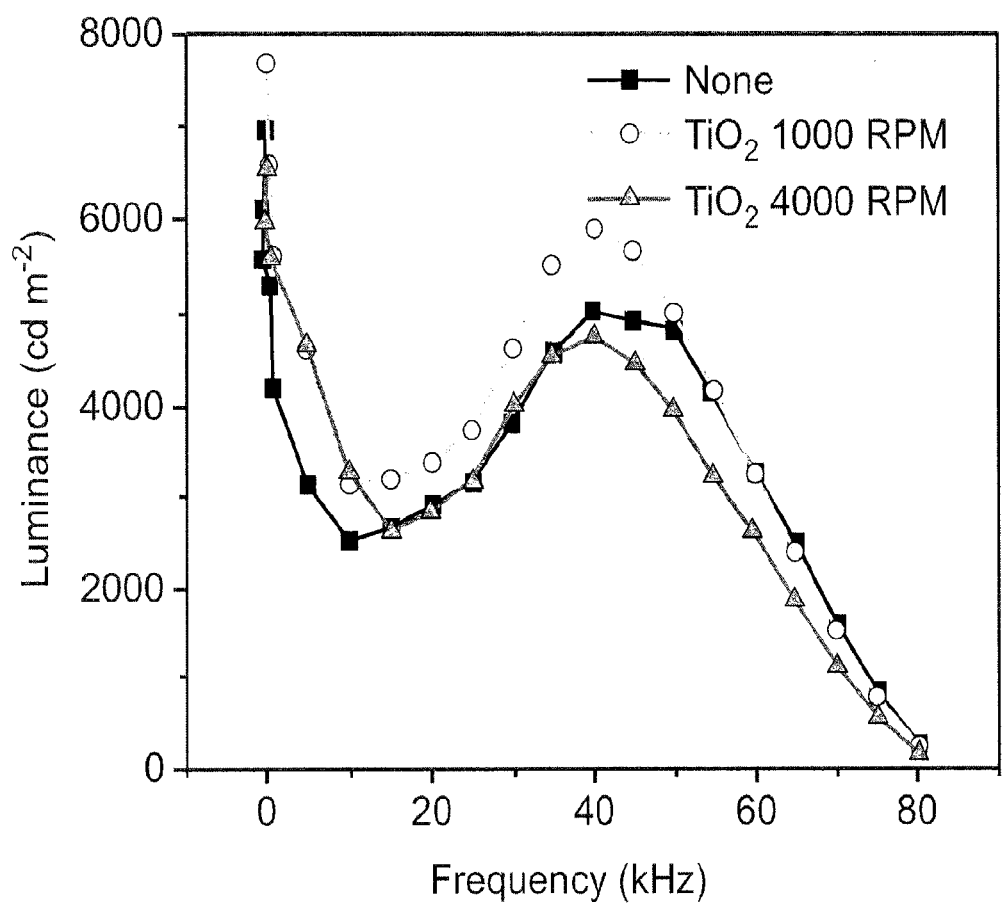
FIG. 3 illustrates luminance versus AC voltage frequency for electroluminescent devices according to some embodiments described herein.
Figure 4:
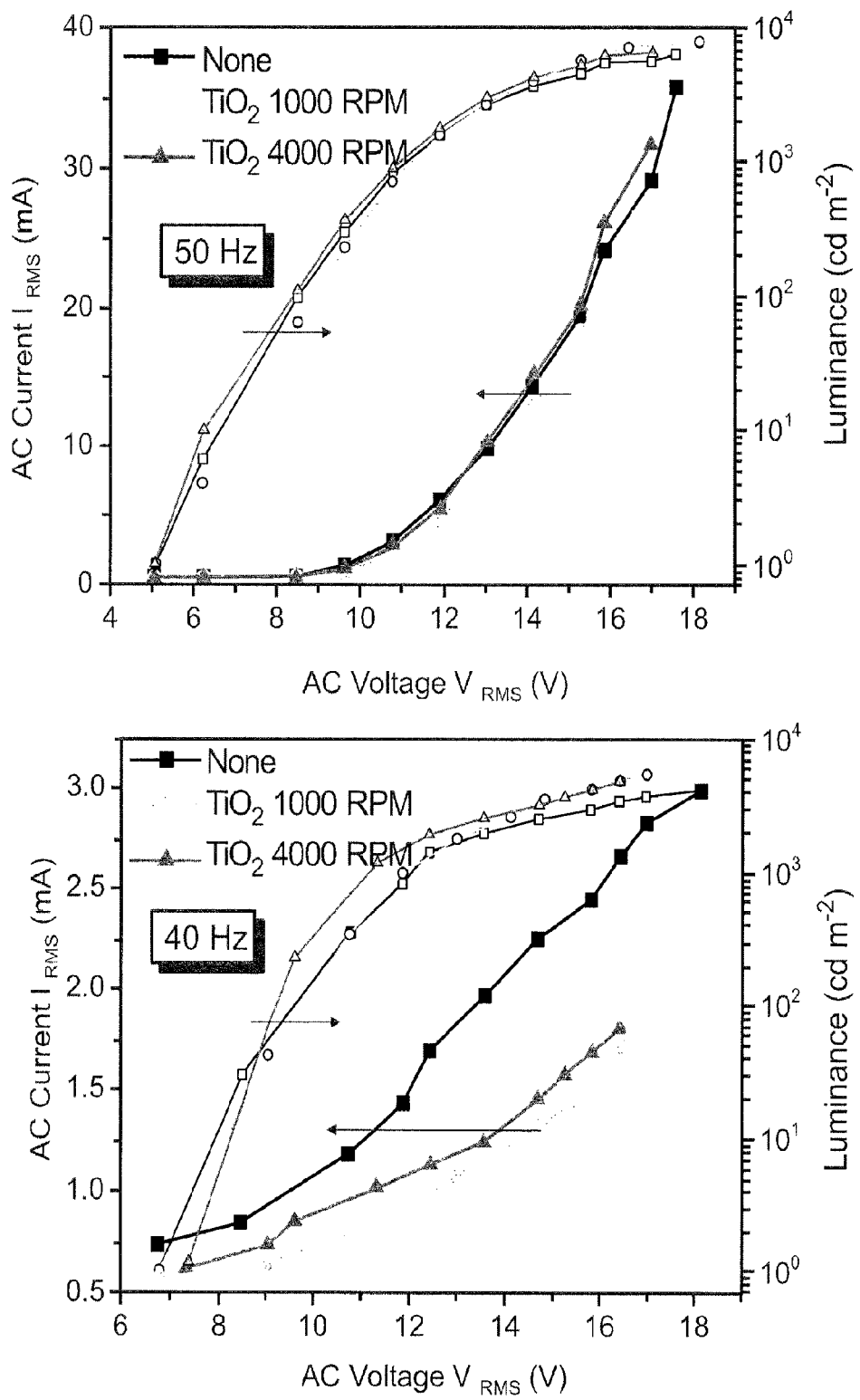
FIG. 4 illustrates AC current and luminance versus AC voltage at set voltage frequencies for electroluminescent devices according to some embodiments described herein.

An alternating current voltage (VAC) was applied to each of the electroluminescent devices (EL1-EL3) wherein the frequency of the VAC was varied. FIG. 3 illustrates luminance versus VAC frequency for EL1-EL3. As illustrated in FIG. 3, each of EL1-EL3 demonstrated high luminance at low frequency (<50 Hz) and high frequencies (30-50 kHz). Further, to demonstrate the gate functionality of the TiO$_2$ semiconductor layer, EL1-EL3 were run at applied VAC of 50 Hz and 40 kHz and the AC current flow measured. As illustrated in FIG. 4, AC current is high at low frequency (50 Hz), and EL1-EL3 are emitting light from current injected from the electrodes. At high frequency (40 kHz), however, AC current is an order of magnitude lower wherein injected current flow through the TiO$_2$ gate is restricted. In this mode, carriers can be generated in the hole (p-TPD:F4TCNQ) and/or electron (TPBi) dopant layers for radiative recombination in the organic light emitting layer.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. An electroluminescent device comprising:
a first electrode and second electrode;
an organic light emitting layer positioned between the first electrode and the second electrode, wherein the organic light emitting layer comprises a triplet emitter phase; and
a current injection gate positioned between the first electrode and the light emitting layer or between the second electrode and the light emitting layer, wherein the current injection gate comprises a semiconductor layer of electronic structure restricting injected current flow from the first or second electrode through the semiconductor layer as a function of alternating current voltage frequency applied to the first and second electrodes.

2. The electroluminescent device of claim 1, wherein the first electrode, second electrode or both are radiation transmissive.

3. The electroluminescent device of claim 1, wherein the organic light emitting layer further comprises a singlet emitter phase.

4. The electroluminescent device of claim 3, wherein the singlet emitter phase comprises one or more conjugated polymers or oligomers, small molecules or mixtures thereof.

5. The electroluminescent device of claim 1, wherein the triplet emitter phase comprises a phosphorescent transition metal complex.

6. The electroluminescent device of claim 1, wherein the triplet emitter phase is dispersed in the singlet emitter phase.

7. The electroluminescent device of claim 6, wherein the organic light emitting layer comprises a dielectric host for the singlet emitter phase and the triplet emitter phase.

8. The electroluminescent device of claim 1, wherein the organic light emitting layer further comprises a nanoparticle phase.

9. The electroluminescent device of claim 8, wherein the nanoparticle phase carbon nanoparticles, inorganic nanoparticles or mixtures thereof.

10. The electroluminescent device of claim 1, wherein injected current flow through the semiconductor layer of the gate decreases with increasing frequency of the applied alternating current voltage.

11. The electroluminescent device of claim 1, wherein the semiconductor layer is a composite layer comprising inorganic particles dispersed in a conjugated polymeric matrix.

12. The electroluminescent device of claim 1, wherein the semiconductor layer is formed of an intrinsic semiconductor.

13. The electroluminescent device of claim 12, wherein the intrinsic semiconductor is an inorganic semiconductor.

14. The electroluminescent device of claim 12, wherein the intrinsic semiconductor is an organic semiconductor.

15. The electroluminescent device of claim 1, wherein the semiconductor layer is formed of a material having a bandgap of at least 2 eV.

16. The electroluminescent device of claim 1 further comprising an electron dopant layer on a first side of the light emitting organic layer and hole dopant layer on an opposing second side of the light emitting organic layer.

17. The electroluminescent device of claim 1 having an efficiency of at least 100 lm W$^{-1}$.

18. A method of generating light comprising:
providing an electroluminescent device comprising first and second electrodes, an organic light emitting layer comprising a triplet emitter phase and positioned between the first and second electrodes, and a current injection gate positioned between the first electrode and the light emitting layer or the second electrode and the light emitting layer, the current injection gate comprising a semiconductor layer;
applying an alternating current voltage to the first and second electrodes;
restricting injected current flow from the first or the second electrode through the semiconductor layer of the gate as a function of alternating current voltage frequency; and
radiatively recombining holes and electrons in the light emitting layer.

19. The method of claim 18, wherein injected current flow through the semiconductor layer decreases with increasing frequency of the applied alternating current voltage.

20. The method of claim 18, wherein the electroluminescent device further comprises an electron dopant layer on a first side of the light emitting layer and hole dopant layer on an opposing second side of the light emitting layer.

21. The method of claim 20, wherein holes and electrons radiatively recombined in the light emitting layer are generated by the hole and electron dopant layers.

22. An electroluminescent device comprising:
a first electrode and second electrode;
an organic light emitting layer positioned between the first electrode and the second electrode, wherein the organic light emitting layer comprises a triplet emitter phase;
an electron dopant layer on a first side of the organic light emitting layer and hole dopant layer on an opposing second side of the organic light emitting layer; and
a nanoparticle phase bridging an interface formed by the electron dopant layer and organic light emitting layer.

23. The electroluminescent device of claim 22, wherein the nanoparticle phase bridges an interface formed by the hole dopant layer and the organic light emitting layer.

* * * * *